(12) United States Patent
Havens et al.

(10) Patent No.: US 7,090,132 B2
(45) Date of Patent: Aug. 15, 2006

(54) LONG RANGE OPTICAL READER

(75) Inventors: William H. Havens, Marcellus, NY (US); Robert J. Hennick, Auburn, NY (US); John Izzo, Auburn, NY (US); Michael Robinson, Weedsport, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 187 days.

(21) Appl. No.: 10/440,729

(22) Filed: May 19, 2003

(65) Prior Publication Data
US 2004/0035933 A1 Feb. 26, 2004

Related U.S. Application Data

(63) Continuation-in-part of application No. 10/252,484, filed on Sep. 23, 2002.

(60) Provisional application No. 60/387,842, filed on Jun. 11, 2002.

(51) Int. Cl.
G06K 7/10 (2006.01)

(52) U.S. Cl. ............. 235/454; 235/462.24; 235/462.43

(58) Field of Classification Search ........... 235/462.01, 235/462.1, 462.2–462.24, 462.35, 462.41, 235/462.43, 454
See application file for complete search history.

(56) References Cited

U.S. PATENT DOCUMENTS

| | | | |
|---|---|---|---|
| 3,978,317 A | 8/1976 | Yamaguchi et al. |
| RE29,194 E | 4/1977 | Ambrose et al. |
| 4,057,784 A | 11/1977 | Tafoya |
| 4,085,423 A | 4/1978 | Tsunoda et al. |
| 4,542,528 A | 9/1985 | Sanner et al. |
| 4,721,849 A | 1/1988 | Davis et al. |
| 4,758,717 A | 7/1988 | Shepard et al. |
| 4,760,248 A | 7/1988 | Swartz et al. |
| 4,774,715 A | 9/1988 | Messenger |
| 4,818,847 A | 4/1989 | Hara et al. |
| 4,841,132 A | 6/1989 | Kajitani et al. |
| 4,847,490 A | 7/1989 | Nishikama |
| 4,866,257 A | 9/1989 | Elliott et al. |
| 4,877,949 A | 10/1989 | Danielson et al. |
| 4,900,907 A | 2/1990 | Matusima et al. |

(Continued)

FOREIGN PATENT DOCUMENTS

DE 12 33 038 B 1/1967

(Continued)

OTHER PUBLICATIONS

International Search Report for International Application No. PCT/US02/07161 dated Dec. 20, 2002.

(Continued)

*Primary Examiner*—Ahshik Kim
(74) *Attorney, Agent, or Firm*—Wall Marjama & Bilinski LLP

(57) ABSTRACT

An optical reader in one embodiment can include a substrate defining an opening and solder pads coupled to the substrate proximate the opening. A laser diode including first, second, and third electrical leads can also be coupled to the substrate. First, second and third solder pads can be provided on the substrate and the first, second, and third electrical leads of the laser diode can be coupled to the first, second, and third solder pads. An optical reader in another embodiment can include a substrate having a first surface and a second surface. A laser diode assembly configured to emit a laser beam can be coupled to the first surface and an illumination assembly that can include light emitting diodes can be coupled to the second surface.

40 Claims, 30 Drawing Sheets

U.S. PATENT DOCUMENTS

| | | |
|---|---|---|
| 4,918,297 A | 4/1990 | Kurimoto |
| 4,920,255 A | 4/1990 | Gabeler |
| 4,945,216 A | 7/1990 | Tanabe et al. |
| 4,964,167 A | 10/1990 | Kunizawa et al. |
| 5,010,241 A | 4/1991 | Butterworth |
| 5,019,699 A | 5/1991 | Koenck |
| 5,034,619 A | 7/1991 | Hammond, Jr. |
| 5,046,066 A | 9/1991 | Messenger |
| 5,059,778 A | 10/1991 | Zouzoulas et al. |
| 5,059,779 A | 10/1991 | Krichever |
| 5,101,406 A | 3/1992 | Messenger |
| 5,132,525 A | 7/1992 | Swartz |
| 5,149,948 A | 9/1992 | Chisholm |
| 5,157,248 A | 10/1992 | Barkan |
| 5,177,346 A | 1/1993 | Chisholm |
| 5,206,881 A | 4/1993 | Messenger et al. |
| 5,208,449 A | 5/1993 | Eastman et al. |
| 5,233,171 A | 8/1993 | Baldwin |
| 5,235,167 A | 8/1993 | Dvorkis et al. |
| 5,280,161 A | 1/1994 | Niwa |
| 5,280,164 A | 1/1994 | Barkan |
| 5,286,960 A | 2/1994 | Longacre, Jr. et al. |
| 5,291,008 A | 3/1994 | Havens et al. |
| 5,294,783 A | 3/1994 | Hammond, Jr. et al. |
| 5,296,689 A | 3/1994 | Redderson et al. |
| 5,308,962 A | 5/1994 | Havens et al. |
| 5,317,136 A | 5/1994 | Hasegawa et al. |
| 5,319,182 A | 6/1994 | Havens et al. |
| 5,331,176 A | 7/1994 | Sant' Anselmo et al. |
| 5,340,971 A | 8/1994 | Rockstein et al. |
| 5,340,972 A | 8/1994 | Sandor |
| 5,347,113 A | 9/1994 | Redderson et al. |
| 5,347,114 A | 9/1994 | Tanaka |
| 5,354,977 A | 10/1994 | Roustaei |
| 5,378,883 A | 1/1995 | Betterman |
| 5,389,917 A | 2/1995 | LaManna et al. |
| 5,396,054 A | 3/1995 | Krichever et al. |
| 5,404,002 A | 4/1995 | Tang |
| 5,406,063 A | 4/1995 | Jelen |
| 5,410,141 A | 4/1995 | Koenck et al. |
| 5,420,411 A * | 5/1995 | Salatto et al. ........... 235/462.22 |
| 5,430,286 A | 7/1995 | Hammond, Jr. et al. |
| 5,440,111 A | 8/1995 | Eastman et al. |
| 5,449,892 A | 9/1995 | Yamada |
| 5,473,149 A * | 12/1995 | Miwa et al. ............ 235/462.41 |
| 5,504,316 A | 4/1996 | Bridgelall |
| 5,504,317 A | 4/1996 | Takahashi |
| 5,504,367 A | 4/1996 | Arackellian et al. |
| 5,510,606 A | 4/1996 | Worthington et al. |
| 5,532,692 A | 7/1996 | Tatsuya |
| 5,534,684 A | 7/1996 | Danielson |
| 5,541,419 A | 7/1996 | Arackellian |
| 5,550,364 A | 8/1996 | Rudeen |
| 5,550,367 A * | 8/1996 | Plesko ................... 235/462.22 |
| 5,557,095 A | 9/1996 | Clark et al. |
| 5,576,529 A | 11/1996 | Koenck et al. |
| 5,579,487 A | 11/1996 | Meyerson et al. |
| 5,585,616 A | 12/1996 | Roxby |
| 5,591,955 A | 1/1997 | Laser |
| 5,597,997 A | 1/1997 | Obata et al. |
| 5,598,007 A | 1/1997 | Bunce et al. |
| 5,602,376 A | 2/1997 | Coleman et al. |
| 5,610,595 A | 3/1997 | Garrabrant et al. |
| 5,612,530 A * | 3/1997 | Sanders et al. ........ 235/462.48 |
| 5,623,137 A | 4/1997 | Powers et al. |
| 5,637,854 A | 6/1997 | Thomas |
| 5,638,115 A | 6/1997 | Imai |
| 5,640,001 A | 6/1997 | Danielson et al. |
| 5,640,684 A | 6/1997 | Konosu et al. |
| 5,644,601 A | 7/1997 | Kawaguchi |
| 5,646,389 A | 7/1997 | Bravman et al. |
| 5,648,650 A | 7/1997 | Sugifune et al. |
| 5,668,803 A | 9/1997 | Tymes et al. |
| 5,672,858 A | 9/1997 | Li et al. |
| 5,684,104 A | 11/1997 | Funk et al. |
| 5,684,290 A | 11/1997 | Arackellian et al. |
| 5,696,607 A | 12/1997 | Yamana et al. |
| 5,697,699 A | 12/1997 | Seo et al. |
| 5,703,349 A | 12/1997 | Meyerson et al. |
| 5,714,745 A | 2/1998 | Ju et al. |
| 5,714,746 A | 2/1998 | Dvorkis et al. |
| 5,717,195 A | 2/1998 | Feng et al. |
| 5,717,221 A | 2/1998 | Li et al. |
| 5,723,868 A | 3/1998 | Hammond, Jr. et al. |
| 5,734,153 A | 3/1998 | Swartz et al. |
| 5,736,726 A | 4/1998 | VanHorn et al. |
| 5,743,633 A | 4/1998 | Chau et al. |
| 5,744,788 A | 4/1998 | Metlitsky et al. |
| 5,744,815 A | 4/1998 | Gurevich et al. |
| 5,745,176 A | 4/1998 | Lebens |
| 5,754,587 A | 5/1998 | Kawaguchi |
| 5,756,981 A | 5/1998 | Roustaei et al. |
| 5,763,864 A | 6/1998 | O'Hagan et al. |
| 5,773,810 A | 6/1998 | Hussey et al. |
| 5,777,743 A | 7/1998 | Bacchi et al. |
| 5,780,834 A | 7/1998 | Havens et al. |
| 5,783,811 A | 7/1998 | Feng et al. |
| 5,784,102 A | 7/1998 | Hussey et al. |
| 5,786,586 A | 7/1998 | Pidhirny et al. |
| 5,793,903 A | 8/1998 | Lopresti et al. |
| 5,794,145 A | 8/1998 | Milam |
| 5,801,371 A | 9/1998 | Kahn et al. |
| 5,802,179 A | 9/1998 | Yamamoto |
| 5,804,802 A | 9/1998 | Card et al. |
| 5,804,809 A | 9/1998 | Eastman et al. |
| 5,811,784 A | 9/1998 | Tausch et al. |
| 5,814,827 A | 9/1998 | Katz |
| 5,815,811 A | 9/1998 | Pinard et al. |
| 5,818,528 A | 10/1998 | Roth et al. |
| 5,821,518 A | 10/1998 | Sussmeier et al. |
| 5,825,006 A | 10/1998 | Longacre, Jr. et al. |
| 5,834,749 A | 11/1998 | Durbin |
| 5,834,754 A | 11/1998 | Feng et al. |
| 5,837,986 A | 11/1998 | Barile et al. |
| 5,838,720 A | 11/1998 | Morelli |
| 5,841,121 A | 11/1998 | Koenck |
| 5,848,064 A | 12/1998 | Cowan |
| 5,850,078 A | 12/1998 | Giordano et al. |
| 5,859,417 A * | 1/1999 | Dvorkis et al. ........ 235/462.39 |
| 5,859,970 A | 1/1999 | Pleso |
| 5,872,354 A | 2/1999 | Hanson |
| 5,877,487 A | 3/1999 | Tani et al. |
| 5,880,452 A | 3/1999 | Plesko |
| 5,886,338 A | 3/1999 | Arackellian et al. |
| 5,894,348 A | 4/1999 | Bacchi et al. |
| 5,905,251 A | 5/1999 | Knowles |
| 5,912,921 A | 6/1999 | Warren et al. |
| 5,914,478 A | 6/1999 | Bridgelall |
| 5,920,061 A | 7/1999 | Feng |
| 5,924,040 A | 7/1999 | Trompower |
| 5,929,418 A | 7/1999 | Ehrhart et al. |
| 5,932,139 A | 8/1999 | Oshima et al. |
| 5,932,862 A | 8/1999 | Hussey et al. |
| 5,942,762 A | 8/1999 | Hecht |
| 5,945,660 A | 8/1999 | Nakasuji et al. |
| 5,946,344 A | 8/1999 | Warren et al. |
| 5,949,054 A | 9/1999 | Karpen et al. |
| 5,949,056 A | 9/1999 | White |
| 5,949,057 A | 9/1999 | Feng |
| 5,955,720 A | 9/1999 | He et al. |
| 5,962,836 A | 10/1999 | Tani et al. |
| 5,965,863 A | 10/1999 | Parker et al. |
| 5,973,681 A | 10/1999 | Tanigawa et al. |
| 5,975,419 A | 11/1999 | Dickson et al. |

| | | | |
|---|---|---|---|
| 5,984,188 A | 11/1999 | Dvorkis et al. | |
| 5,988,506 A | 11/1999 | Schaham et al. | |
| 5,992,744 A | 11/1999 | Smith et al. | |
| 5,992,746 A | 11/1999 | Suzuki | |
| 6,019,286 A | 2/2000 | Li et al. | |
| 6,027,024 A | 2/2000 | Knowles et al. | |
| 6,029,893 A | 2/2000 | Tan et al. | |
| 6,034,379 A | 3/2000 | Bunte et al. | |
| 6,039,255 A | 3/2000 | Seo | |
| 6,045,047 A | 4/2000 | Pidhirny et al. | |
| 6,045,048 A | 4/2000 | Wilz, Sr. et al. | |
| 6,052,236 A | 4/2000 | Nakasuji et al. | |
| 6,053,408 A | 4/2000 | Stoner | |
| 6,060,722 A | 5/2000 | Havens et al. | |
| 6,062,475 A | 5/2000 | Feng | |
| 6,066,857 A | 5/2000 | Fantone et al. | |
| 6,068,188 A | 5/2000 | Knowles | |
| 6,072,401 A | 6/2000 | Kumar | |
| 6,092,728 A | 7/2000 | Li et al. | |
| 6,098,887 A | 8/2000 | Figarella et al. | |
| 6,119,939 A | 9/2000 | Schwartz et al. | |
| 6,119,944 A | 9/2000 | Mulla et al. | |
| 6,123,261 A | 9/2000 | Roustaei | |
| 6,123,263 A | 9/2000 | Feng | |
| 6,123,264 A | 9/2000 | Li et al. | |
| 6,129,283 A | 10/2000 | Imade et al. | |
| 6,141,046 A | 10/2000 | Roth et al. | |
| 6,147,358 A | 11/2000 | Hecht | |
| 6,152,371 A | 11/2000 | Schwartz et al. | |
| 6,164,544 A | 12/2000 | Schwartz et al. | |
| 6,178,426 B1 | 1/2001 | Klein et al. | |
| 6,179,208 B1 | 1/2001 | Feng | |
| 6,182,897 B1 | 2/2001 | Knowles et al. | |
| 6,199,044 B1 | 3/2001 | Ackley et al. | |
| 6,213,397 B1 | 4/2001 | Rando | |
| 6,223,988 B1 | 5/2001 | Batterman et al. | |
| 6,283,374 B1 | 9/2001 | Fantone et al. | |
| 6,303,929 B1 | 10/2001 | Oshima et al. | |
| 6,318,635 B1 | 11/2001 | Stoner | |
| 6,318,637 B1 | 11/2001 | Stoner | |
| 6,321,989 B1 | 11/2001 | Wilz, Sr. et al. | |
| 6,321,991 B1 | 11/2001 | Knowles | |
| 6,321,992 B1 | 11/2001 | Knowles et al. | |
| 6,323,503 B1 | 11/2001 | Hecht | |
| 6,325,289 B1 | 12/2001 | Mazzone | |
| 6,330,973 B1 | 12/2001 | Bridgelall et al. | |
| 6,340,114 B1 | 1/2002 | Correa et al. | |
| 6,345,764 B1 | 2/2002 | Knowles | |
| 6,347,163 B1 | 2/2002 | Roustaei | |
| 6,347,743 B1 | 2/2002 | Wilz, Sr. et al. | |
| 6,352,204 B1 | 3/2002 | Hattersley et al. | |
| 6,352,517 B1 | 3/2002 | Flock et al. | |
| 6,360,949 B1 | 3/2002 | Shepard et al. | |
| 6,371,374 B1 | 4/2002 | Schwartz et al. | |
| 6,375,074 B1 | 4/2002 | Dickson et al. | |
| 6,389,010 B1 | 5/2002 | Kubler et al. | |
| 6,398,112 B1 | 6/2002 | Li et al. | |
| 6,412,699 B1 | 7/2002 | Russell et al. | |
| 6,431,452 B1 | 8/2002 | Feng | |
| 6,439,462 B1 | 8/2002 | Dickson et al. | |
| 6,507,864 B1 | 1/2003 | Klein et al. | |
| 6,535,493 B1 | 3/2003 | Lee et al. | |
| 6,539,360 B1 | 3/2003 | Kadaba | |
| 6,539,422 B1 | 3/2003 | Hunt et al. | |
| 6,540,140 B1 | 4/2003 | Knowles et al. | |
| 6,547,139 B1 | 4/2003 | Havens et al. | |
| 6,578,767 B1 | 6/2003 | Barkan et al. | |
| 6,595,422 B1 | 7/2003 | Doljack | |
| 6,601,768 B1 | 8/2003 | McCall et al. | |
| 6,607,128 B1 | 8/2003 | Jovanvoski et al. | |
| 6,629,641 B1 | 10/2003 | Tsikos et al. | |
| 6,661,521 B1 | 12/2003 | Stern | |
| 6,681,994 B1 | 1/2004 | Koenck | |
| 6,688,523 B1 | 2/2004 | Koenck | |
| 6,732,929 B1 | 5/2004 | Good et al. | |
| 6,786,414 B1 | 9/2004 | Tsikos et al. | |
| 6,808,114 B1 | 10/2004 | Palestini et al. | |
| 6,817,525 B1 | 11/2004 | Piva et al. | |
| 6,830,184 B1 | 12/2004 | Tsikos et al. | |
| 6,837,437 B1 | 1/2005 | Tsikos et al. | |
| 6,843,417 B1 | 1/2005 | Philyaw et al. | |
| 2001/0043273 A1 | 11/2001 | Herrod et al. | |
| 2001/0055422 A1 | 12/2001 | Roustaei | |
| 2002/0039099 A1 | 4/2002 | Harper | |
| 2002/0066788 A1 | 6/2002 | Knowles | |
| 2003/0222147 A1 | 12/2003 | Havens et al. | |
| 2003/0226895 A1 | 12/2003 | Havens et al. | |
| 2004/0020990 A1 | 2/2004 | Havens et al. | |
| 2004/0031851 A1 | 2/2004 | Blanculli et al. | |
| 2004/0035933 A1 | 2/2004 | Havens et al. | |

FOREIGN PATENT DOCUMENTS

| | | |
|---|---|---|
| DE | 12 40 149 B | 5/1967 |
| EP | 0 516 927 A | 12/1992 |
| EP | 0 910 032 A2 | 4/1998 |
| EP | 0 974 924 A | 1/2000 |
| EP | 0 999 514 A1 | 5/2000 |
| EP | 0999514 A1 | 5/2000 |
| EP | 1 079 466 A | 2/2001 |
| EP | 1 128 315 A1 | 8/2001 |
| EP | 1128315 | 8/2001 |
| EP | 0 690 404 B1 | 9/2001 |
| EP | 0690404 | 9/2001 |
| EP | 0 818 750 B1 | 11/2001 |
| EP | 0818750 | 11/2001 |
| GB | 2 128 549 A | 5/1984 |
| JP | 3228193 A | 10/1991 |
| JP | 4 330583 A2 | 11/1992 |
| JP | 4330583 | 11/1992 |
| JP | 4333167 A | 11/1992 |
| WO | WO 97/08647 | 3/1997 |
| WO | WO 01/26036 A2 | 4/2001 |
| WO | 02/073953 A2 | 9/2002 |

OTHER PUBLICATIONS

International Search Report for International Application No. PCT/US03/17564 dated Sep. 18, 2003.

International Search Report for International Patent Application No. PCT/US03/18557 dated Feb. 25, 2004.

John H. Day; Optical ICs look to enterprise-metro link; Electronic Engineering Times; Apr., 2002; 6 pgs.; http://www.eet.com/story/OEG20020418S0065.

* cited by examiner

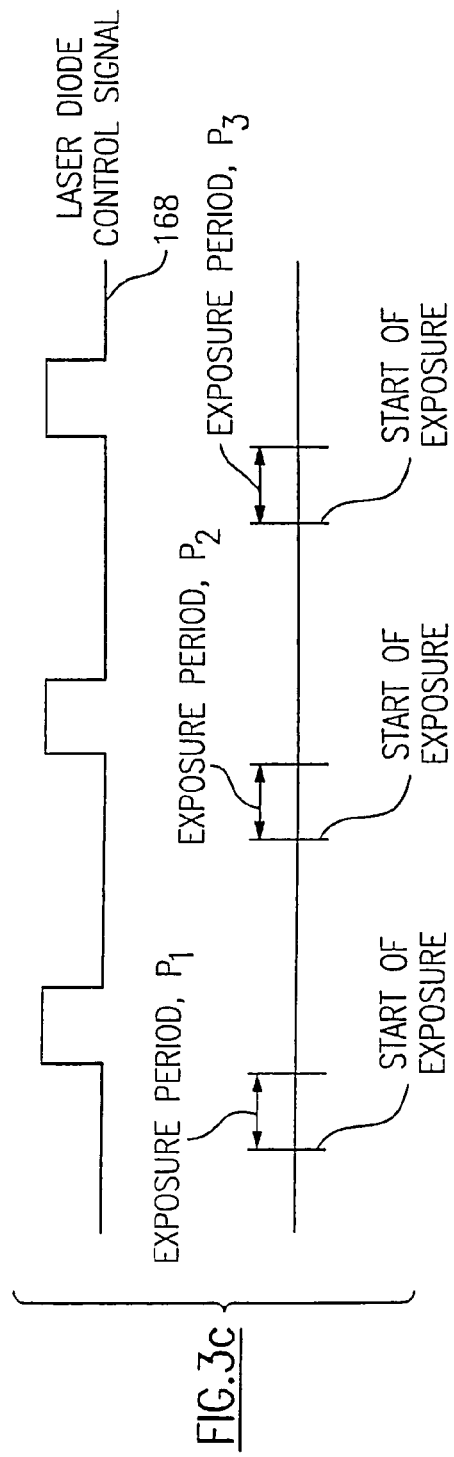
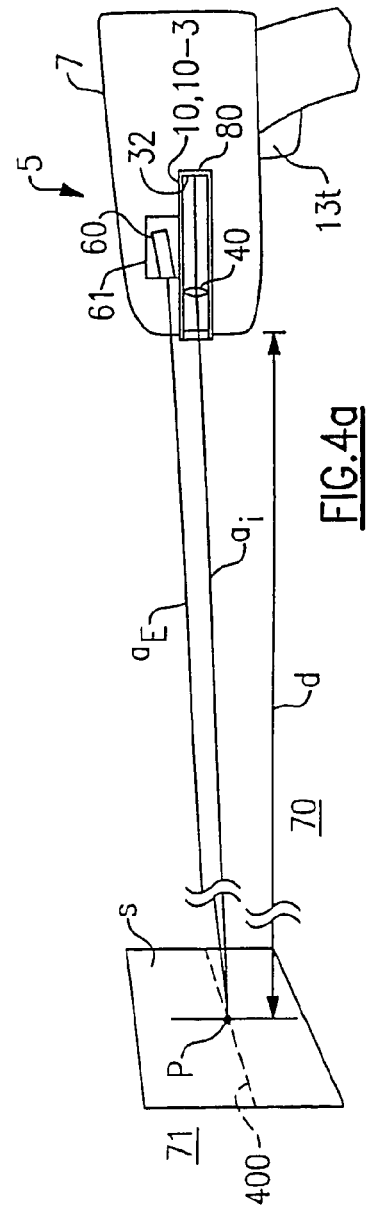
FIG.4a
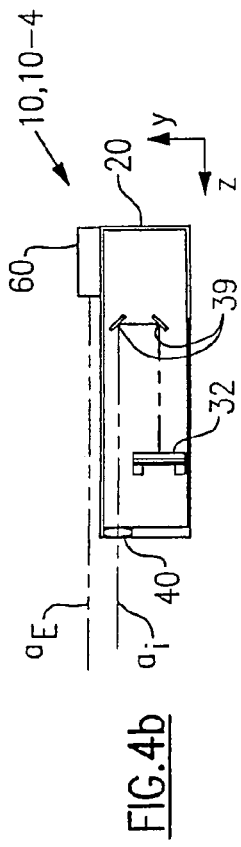
FIG.4b
FIG.3c

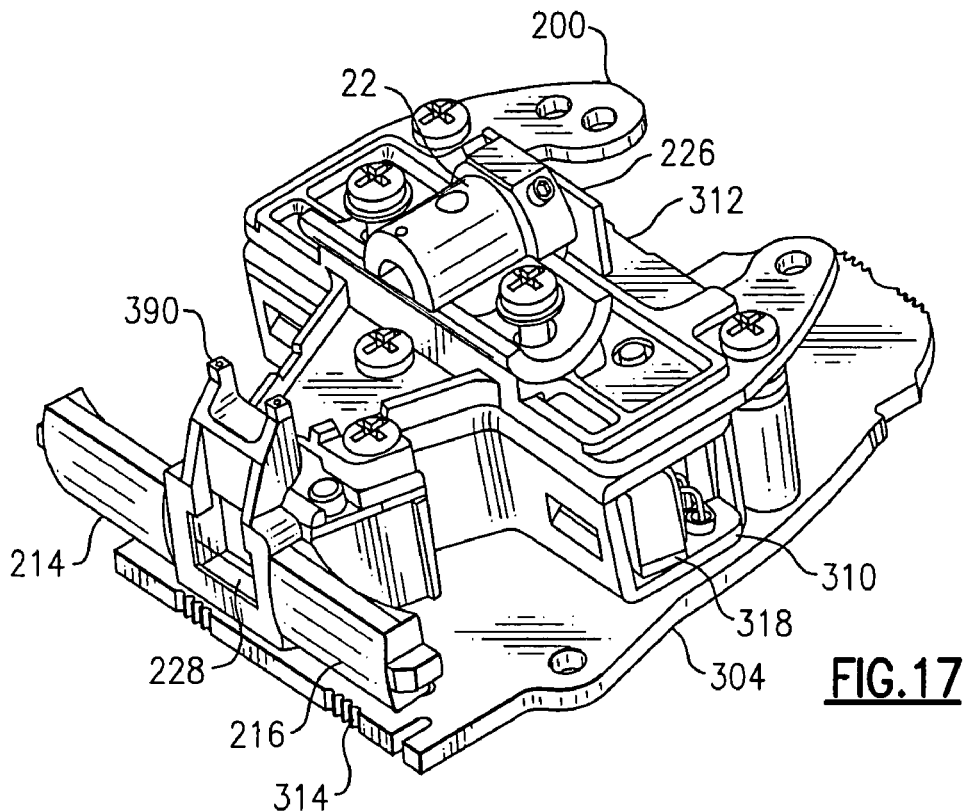
FIG.17
FIG.24
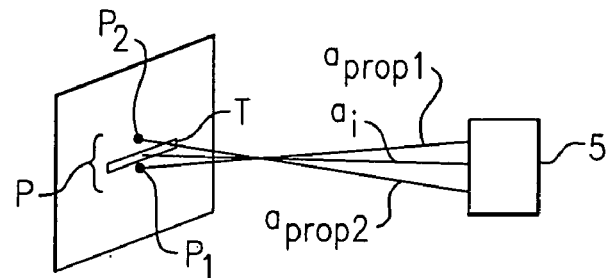
FIG.25
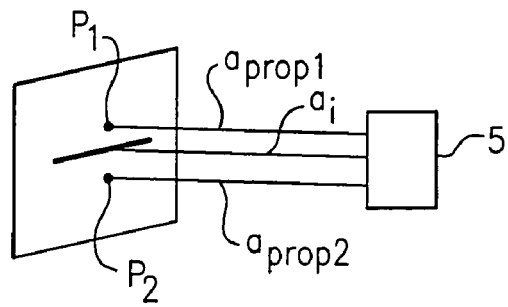
FIG.26

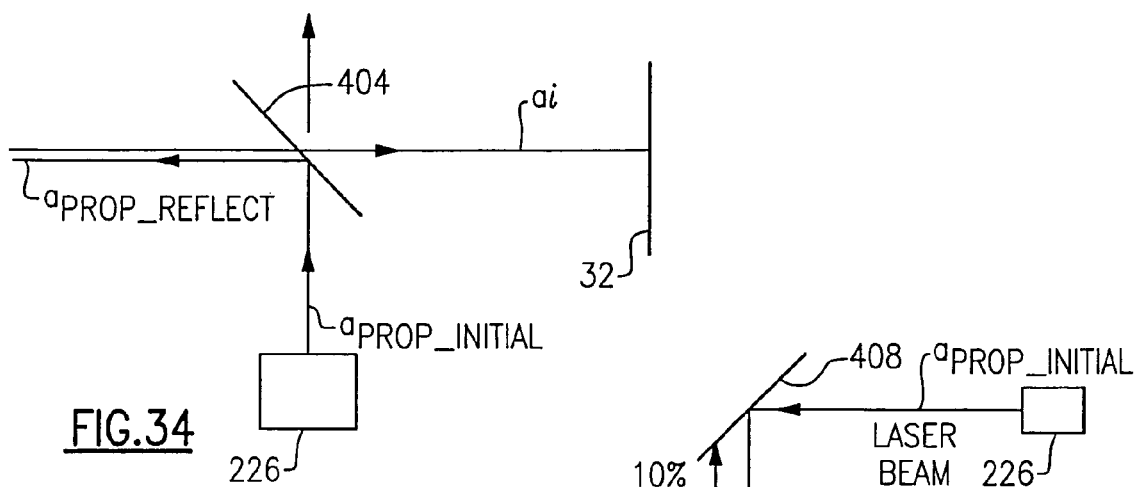
FIG. 34
FIG. 34b
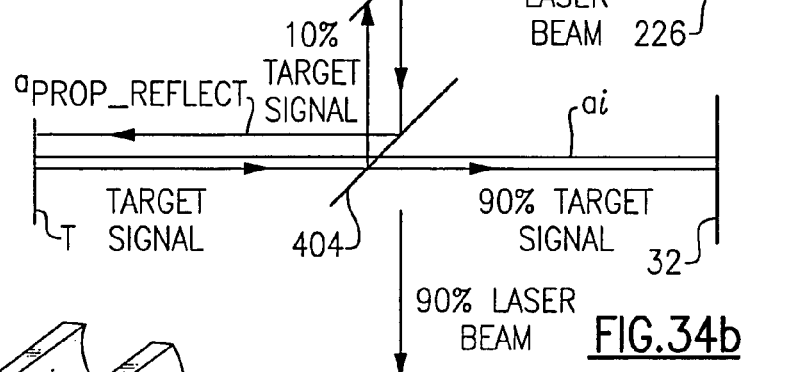
FIG. 38
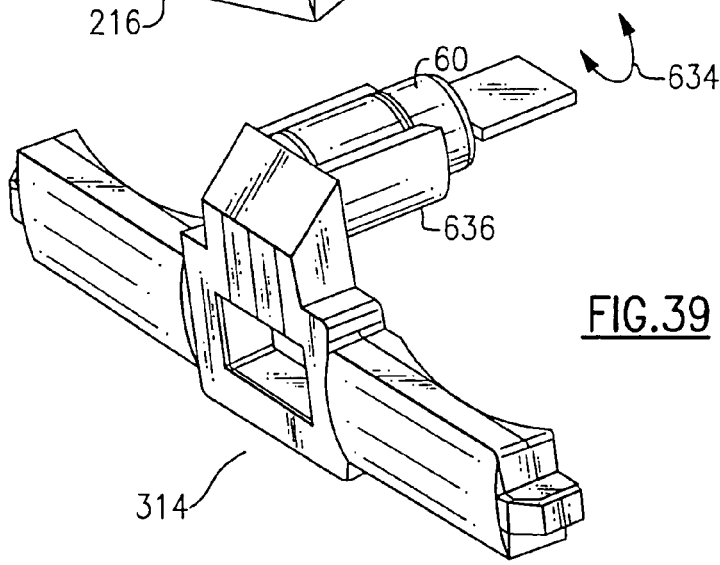
FIG. 39

LONG RANGE OPTICAL READER

CROSS REFERENCE TO RELATED APPLICATIONS

This application is a continuation-in-part of, and claims priority to under 35 U.S.C. §120 of, U.S. patent application Ser. No. 10/252,484, filed Sep. 23, 2002, which claims the priority, under 35 U.S.C. § 119(e), of U.S. Provisional Application Ser. No. 60/387,842 filed Jun. 11, 2002, entitled "Long Range Optical Reader", both of which are incorporated herein by reference in their entirety.

FIELD OF THE INVENTION

The invention relates to optical readers in general and particularly to optical readers adapted for long range reading of decodable indicia.

BACKGROUND OF THE INVENTION

Bar codes and other decodable indicia are finding increased use including in industrial applications wherein bar codes are to be read at long range reading distances such as beyond five feet. Presently available optical readers configured for such long range reading are laser scan engine based. In a laser scan engine based optical reader, a laser beam is swept across a target substrate by a delicately mounted moving mirror.

Unfortunately, problems have been noted with presently available laser scan engine based long range optical readers. At long range reading distances, scanning lines projected by a laser scan engine are difficult to read, making it difficult to locate a decodable indicia within a field of view of the reader. Furthermore, laser scan engine based readers are susceptible to breakdown. If a laser scan engine reader is dropped, the delicately mounted scanning mirror can easily become misaligned. The need for ruggedized bar code readers, which can withstand drops and other incidents of high impact is especially great in industrial applications wherein long range reading is often required.

There is a need for an optical reader including a targeting system which enables a reader to be readily aligned with a target indicia even at long range reading distances.

SUMMARY OF THE INVENTION

According to its major aspects and broadly stated, the invention is a long range image sensor based optical reader. An optical reader in one embodiment can include a substrate defining an opening and solder pads coupled to the substrate proximate the opening. A laser diode including first, second, and third electrical leads can also be coupled to the substrate. First, second, and third solder pads can be provided on the substrate and the first, second, and third electrical leads of the laser diode can be coupled to the first, second, and third solder pads. An optical reader in another embodiment can include a substrate having a first surface and a second surface. A laser diode assembly configured to emit a laser beam can be coupled to the first surface and an illumination assembly that can include light emitting diodes can be coupled to the second surface.

In one aspect of the invention an optical reader can include an imaging module having a support assembly carrying an image sensor and imaging optics, wherein the imaging optics are selected so that a best receive optic focus position of the reader is at a long range such as more than about five feet.

In another aspect of the invention, in one embodiment, the reader includes a targeting system so that the target indicia can readily be spotted at long range reading distances. The targeting system can comprise a laser diode assembly of the type comprising a laser diode and collimating optics. The targeting system can further include folding optics such as mirrors or prisms which redirect the light emanating from the laser diode assembly so that the targeting beam is directed along a path substantially parallel to and proximate an imaging axis. The targeting system can be incorporated in an imaging module mounted in a reader housing. In one specific embodiment precision mounting assembly for precision mounting of a laser diode assembly is disposed on a support assembly of a reader imaging module.

In a further aspect of the invention, the reader's illumination system can be adapted so that a signal strength of image signals generated at long range reading distances is enhanced. A signal strength (signal to noise ratio) of a long range reader can be enhanced by configuring the reader to have a best emit focus distance longer than a best receive optic focus distance.

In another aspect of the invention, an imaging assembly of a reader of the invention can include moving optics which allow adjustment of the best receive focus position of the reader, or a second complete imaging system adapted for reading at shorter reading distances.

These and other details and advantages will become apparent from the detailed description of the preferred embodiment herein below.

BRIEF DESCRIPTION OF THE DRAWINGS

For a further understanding of these and objects of the invention, reference will be made to the following detailed description of the invention which is to be read in connection with the accompanying drawing, wherein:

FIG. 3c is a timing diagram illustrating an exemplary method of controlling a laser diode assembly according to the invention;

FIG. 4a is a side view schematic diagram of one type of optical reader according to the invention;

FIG. 4b is a side view schematic diagram of a type of imaging module according to the invention;

FIG. 17 is perspective view of an optical reader embodiment of the present invention used in the data collection device of FIG. 15;

FIG. 24 is a schematic view illustrating a long range aiming pattern;

FIG. 25 is a schematic view illustrating a long range aiming pattern;

FIG. 26 is a schematic view illustrating a long range aiming pattern;

FIG. 34 is a ray diagram illustrating the operation of a long range aiming pattern optical system;

FIG. 34b is a ray diagram illustrating the operation of an alternate embodiment of the long range aiming pattern optical system;

FIG. 38 is perspective view of an alternative embodiment of the illuminating lens assembly of FIG. 27; and FIG. 39 is a perspective view the illuminating lens assembly of FIG. 38 with a cylindrically packaged laser diode engaged therewith.

DETAILED DESCRIPTION OF THE INVENTION

Figure 1:
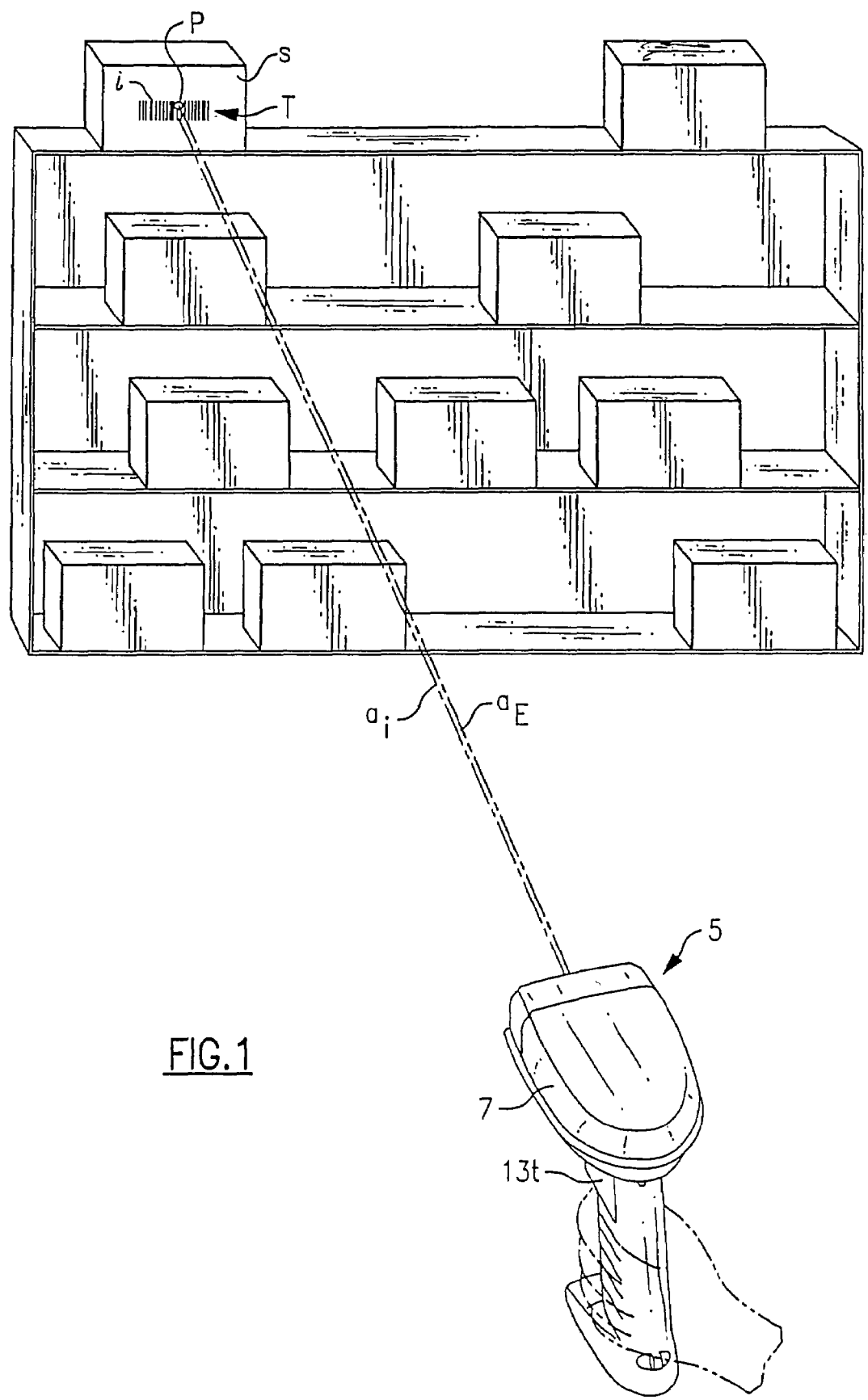
FIG. 1 is a schematic diagram of a long range optical reader in use in an industrial application.

An optical reader of the invention in use in an industrial application is shown in FIG. 1. Reader 5 is adapted for reading at very long range reading distances, e.g., such as five feet or more. Typically, reader 5 is employed to read standard or "retro-reflective" bar codes. Retro-reflective bar codes, common in warehouse and factory applications, are formed on highly reflective surfaces such that a majority of incident light is reflected back to reader 5. As will be explained in greater detail herein, reader 5 includes imaging optics 40 (as seen, e.g., in FIGS. 2b and 2e) which configure reader 5 so that reader 5 has a long range best-focus distance (e.g., more than 5 feet).Further, long range reader 5 typically includes a long range targeting assembly which is adapted so that a visible aiming pattern P (see FIGS. 7a–7h) is projected within or proximate a target, T, at a long reader-to-target distance. The term "target," T, herein refers to the space on an indicia-bearing substrate, s, which is presently in a field of view of reader 5. Indicia-bearing substrate, s, which bears a decodable character or symbol can be provided, for example by a piece of paper, an apparatus, an article of manufacture, a box, or a shipping container as is shown in the specific application view FIG. 1.

As explained in such copending applications as U.S. Ser. No. 09/658,811, filed Sep. 11, 2000, entitled "Optical Assembly for Barcode Scanner" and U.S. Ser. No. 10/092,789, filed Mar. 7, 2002, entitled "Optical Reader Imaging Module", an optical reader can include preassembled imaging modules carrying various optical emit and receive components, which can be modularly installed inside a reader housing. A "preassembled" imaging module is typically assembled as a self-contained multicomponent part unit as shown in, e.g., FIGS. 2a–2e prior to being mounted in a reader housing. Long range reading imaging modules according to the invention are shown and described with reference to FIGS. 2a–2e.

Figure 2A:
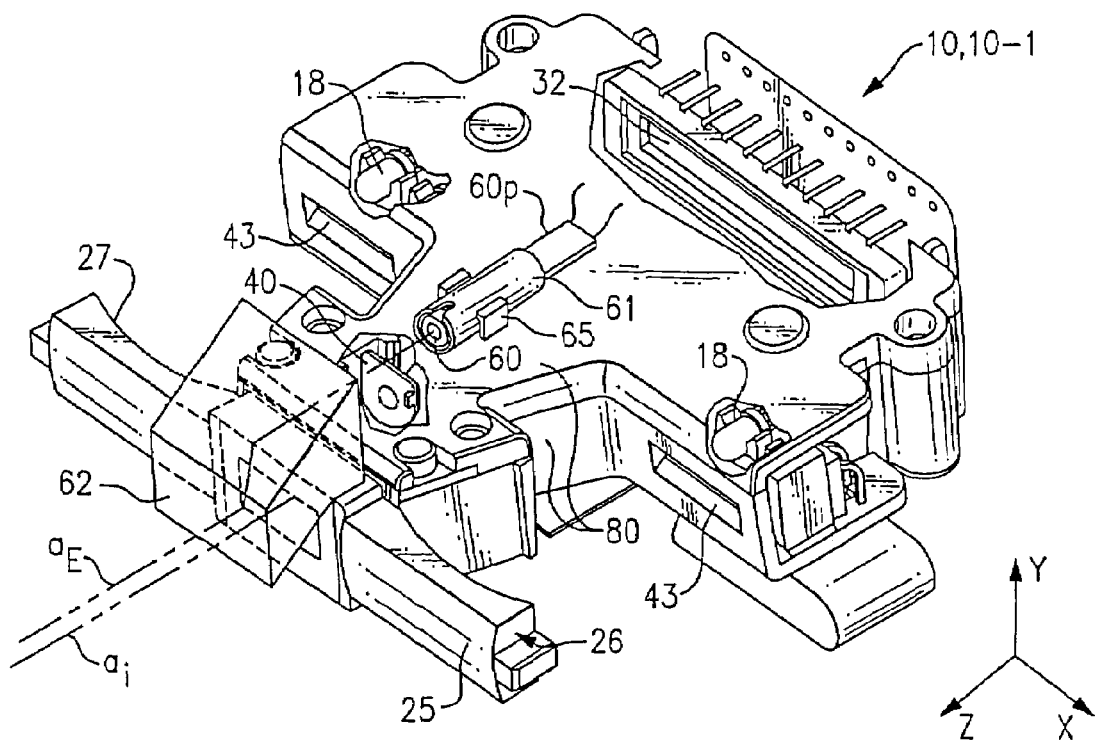
FIG. 2a is a perspective view of a first optical reader imaging module according to the invention.
Figure 2B:
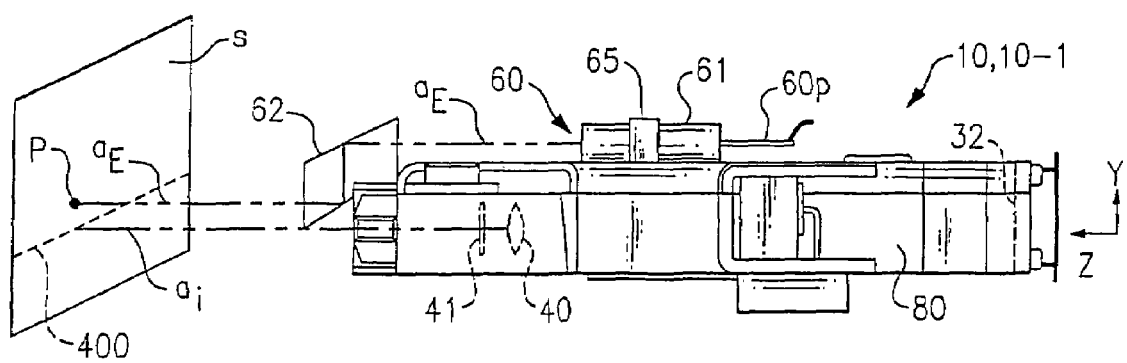
FIG. 2b is side view of a first optical reader imaging module according to the invention.

A first type of imaging module which may be incorporated in a housing 7 of reader 5 is shown in FIG. 2a. Imaging module 10, 10-1 includes a support assembly 80 which receives and supports various reader components. Supported on support assembly 80 are an imaging assembly including a plural photodetector image sensor 32 and imaging optics 40 for focusing target indicia onto image sensor 32. In the embodiment of FIGS. 2a and 2b, image sensor 32, is provided by a 1D photodetector array incorporated on an integrated circuit chip. However, as will be described in greater detail herein an imaging module according to the invention can also comprise a 2D image sensor.

Figure 2C:
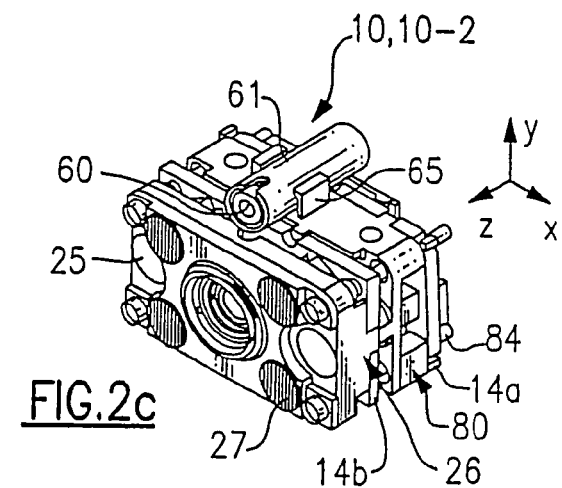
FIGS. 2c and 2d are perspective views of a second imaging module according to the invention.
Figure 2D:
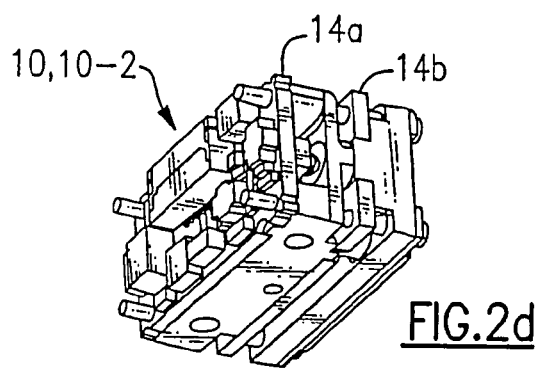
Figure 2E:
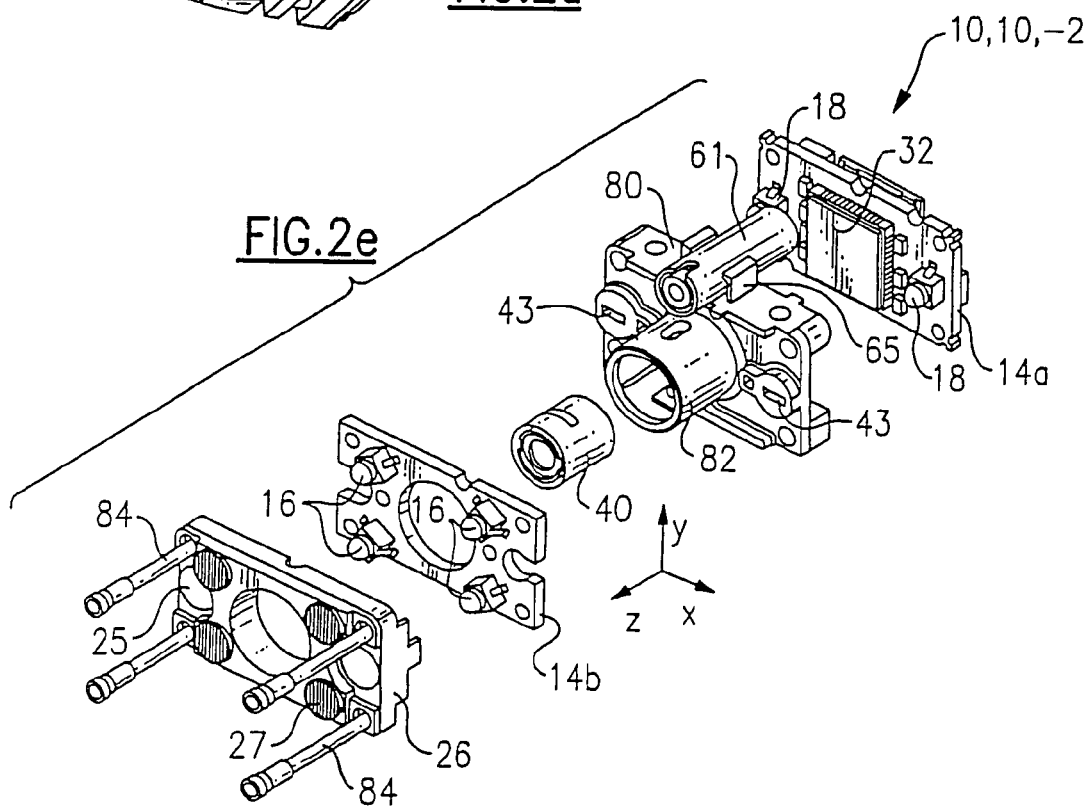
FIG. 2e is an assembly view of a second imaging module according to the invention.

Referring to further aspects of imaging optics 40, imaging optics 40 are adapted so that reader 5 has a best focus receive optic distance of greater than 5 feet. In one specific example of the invention, imaging optics 40 are adapted so that reader 5 has a best focus receive optic distance of 6.56 feet (2.0 M). Imaging optics 40 can include e.g. a single element lens, a two element lens (lens doublet) or three element lens (lens triplet).In other specific embodiments, imaging optics 40 are adapted so that reader 5 has a best focus receive distances of 10 feet, 20 feet, and 30 feet. Optics 40 can comprise any suitable material e.g. glass or plastic. In the embodiment of FIGS. 2a and 2b imaging optics 40 are shown as being provided in an optical package known as a lens card. Optics 40 may also be packaged in an optical package known as a lens barrel as is shown in the embodiment of FIG. 2e to be described herein. Referring to further aspects of the imaging assembly including optics 40, the imaging assembly can include a vertical oriented slit aperture card 41 as explained in U.S. application Ser. No. 09/658,811, filed Sep. 11, 2000, entitled "Optical Assembly for Barcode Scanner," incorporated herein by reference.

Referring to further aspects of imaging module 10-1, module 10-1 further includes an illumination assembly comprising at least one LED and at least one laser diode assembly for projecting a long range aiming pattern. The illumination system of module 10-1 includes LEDs 18, apertures 43, and a lens member 26. Lens member 26 includes surfaces 27 formed on light entry surfaces of lens member 26 for horizontally spreading light from LEDs 18 and imaging lens surfaces 25 for imaging apertures 43 into target space, T. Alternative embodiments of illumination systems which may be incorporated in module 10-1 are described in U.S. Ser. No. 10/093,140, filed Mar. 7, 2002, entitled "Optical Reader Aiming Assembly Comprising Aperture," incorporated herein by reference. It is understood that apertures 43 can be deleted from the illumination system so that imaging lens surface 25 images LEDs 18 directly into target space without imaging apertures 43 in target space. It is also understood that LEDs 18 can be deleted altogether or disabled if ambient light is sufficient.

Figure 9A:
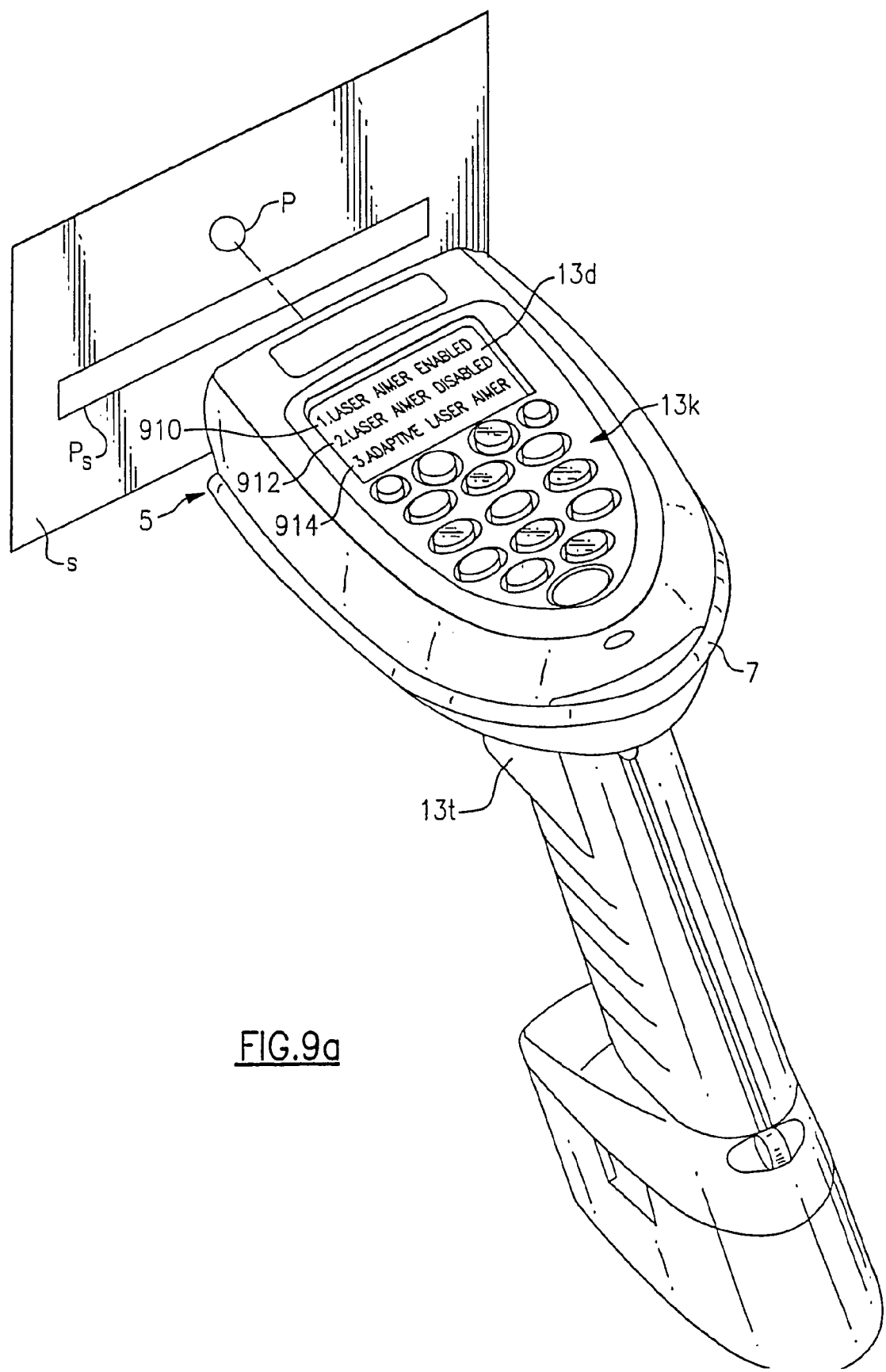
FIG. 9a is a perspective view of an optical reader according to the invention.

At long range reading distances, such as beyond five feet, light from LEDs 18, projecting a "short range" aiming pattern $P_s$ (as seen in FIG. 9a), may not be highly visible and may not be highly useful in aiding the alignment of reader 5 relative to a target, T. Also, substantial ambient light may diminish a visibility of an aiming pattern projected by aiming LEDs 18. Accordingly, an illumination assembly of module 10-1 may include a targeting system which is adapted to project a long range aiming pattern P onto a target T such that the long range aiming pattern P is visible at long range distances (e.g., beyond 5 feet). According to the invention, long range aiming pattern P is normally more visible than a short range aiming pattern $P_s$, particularly at longer range reading distances.

Configuring reader 5 so that a long range aiming pattern P is projected on or about an indicia to be read increases the likelihood that a field of view of reader 5 coincides with a symbol or character to be read. In a further aspect of the invention, it is useful to configure emit optics, e.g., 25 so that a best focus emit distance of reader 5, at which an image of aperture 43 is optimally focused on a target substrate is at least as long as the best focus receive distance. For example, if a best focus receive distance of reader 5 is 20 feet, reader 5 is advantageously adapted so that a best focus emit distance of reader 5 is at least 20 feet. Configuring reader 5 so that reader 5 has a best focus emit distance of at least as long as a best focus receive distance increases a strength of image information electronic signals output by image sensor 32.

Figure 6A:
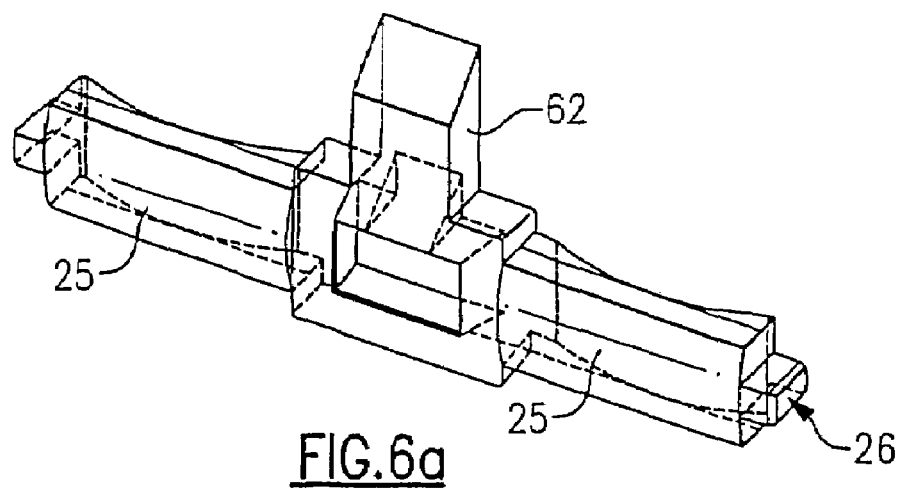
FIGS. 6a–6b are perspective view of an embodiment of an optical member according to the invention having aiming optics, including a prism.
Figure 6B:
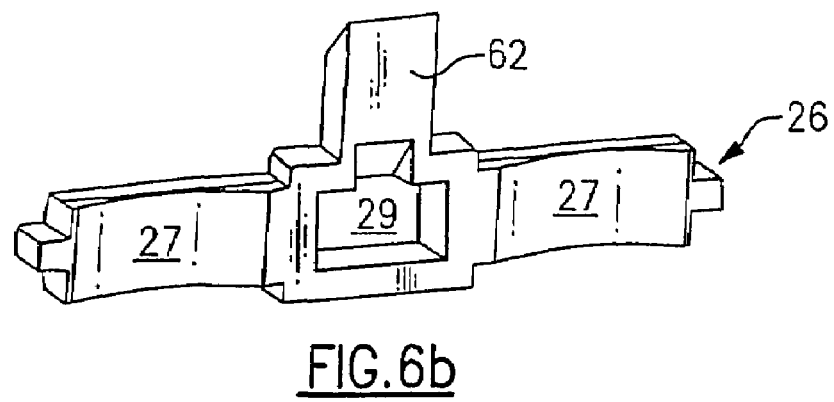
Figure 6C:
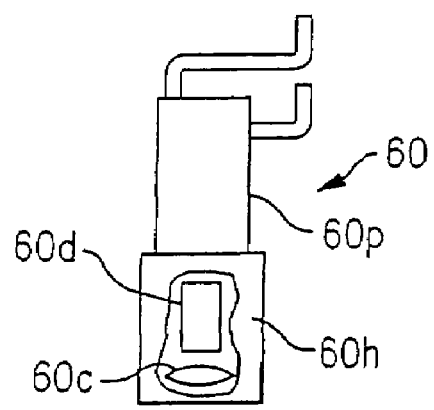
FIG. 6c is a schematic view of a laser diode assembly.

Referring to features of the targeting system of module 10-1 in further detail, the targeting system of module 10-1 includes a laser diode assembly 60 of the type including a laser diode and collimating optics. Laser diode assembly 60 may be e.g. a Model LM-761-A1 laser diode assembly of the type available from Excel Scientech Co. of Taiwan as is shown in FIG. 6c. As seen in FIG. 6c, exemplary laser diode assembly 60 includes a PCB 60p supporting laser diode 60d, and collimating optics 60c housed within a diode assembly housing 60h. In module 10-1 shown in FIGS. 2a and 2b laser diode assembly 60 is disposed within protective holder 61 which houses assembly 60. Protective holder 61 housing and supporting laser diode assembly 60 is disposed in clips 65 of module 10-1, the clips integrally formed on support assembly 80. Clips 65 support holder 61 and assembly 60 in a certain position relative to support assembly 80.

An exemplary 2D imaging module according to the invention including a long range targeting optic system 60, 61, and 65 is described with reference to FIGS. 2e, 2d, and 2e. Imaging module 10, 10-2 as shown in FIGS. 2c, 2d, and 2e includes a support assembly 80 having an image sensor containment section and an imaging optic retainer section 82, a first circuit board 14a carrying a plural photodetector image sensor 32 and aiming LEDs 18, a second circuit board 14b carrying illumination LEDs 16, an optical member 26 carrying aiming and illumination optics 25, 27, and support posts 84 holding the various components of the module together. Further details of imaging module 10-2 are described in application Ser. No. 10/092,789, filed Mar. 7, 2002, entitled "Optical Reader Imaging Module," incorporated herein by reference. In accordance with the invention, imaging module 10-2 further includes laser diode assembly 60, as described previously. Laser diode assembly 60 as in module 10-1, may be installed in holder 61, which in turn is disposed in clips 65 formed on assembly 80. Disposing holder 61 in clips 65 securely positions assembly 60 in a certain position relative to support assembly 80.

Laser diode assembly 60 in any of the embodiments shown can be replaced with another light assembly suitable for producing a visible light pattern at long range reading distances. For example, laser diode assembly 60 can be replaced with a light assembly comprising an LED in combination with collimating optics for collimating light from the LED.

Electrical block diagrams illustrating operations of electrical circuits for control of a long range reader according to the invention are now described with reference to FIGS. 3a and 3b. An electrical circuit 100 for controlling operation of a 2D long range imaging module, e.g., module 10-2 is described generally with reference to FIG. 3a. An electrical circuit 101 for controlling operation of a 1D long range imaging module e.g. module 10-1 is described generally with reference to FIG. 3b.

Figure 3A:
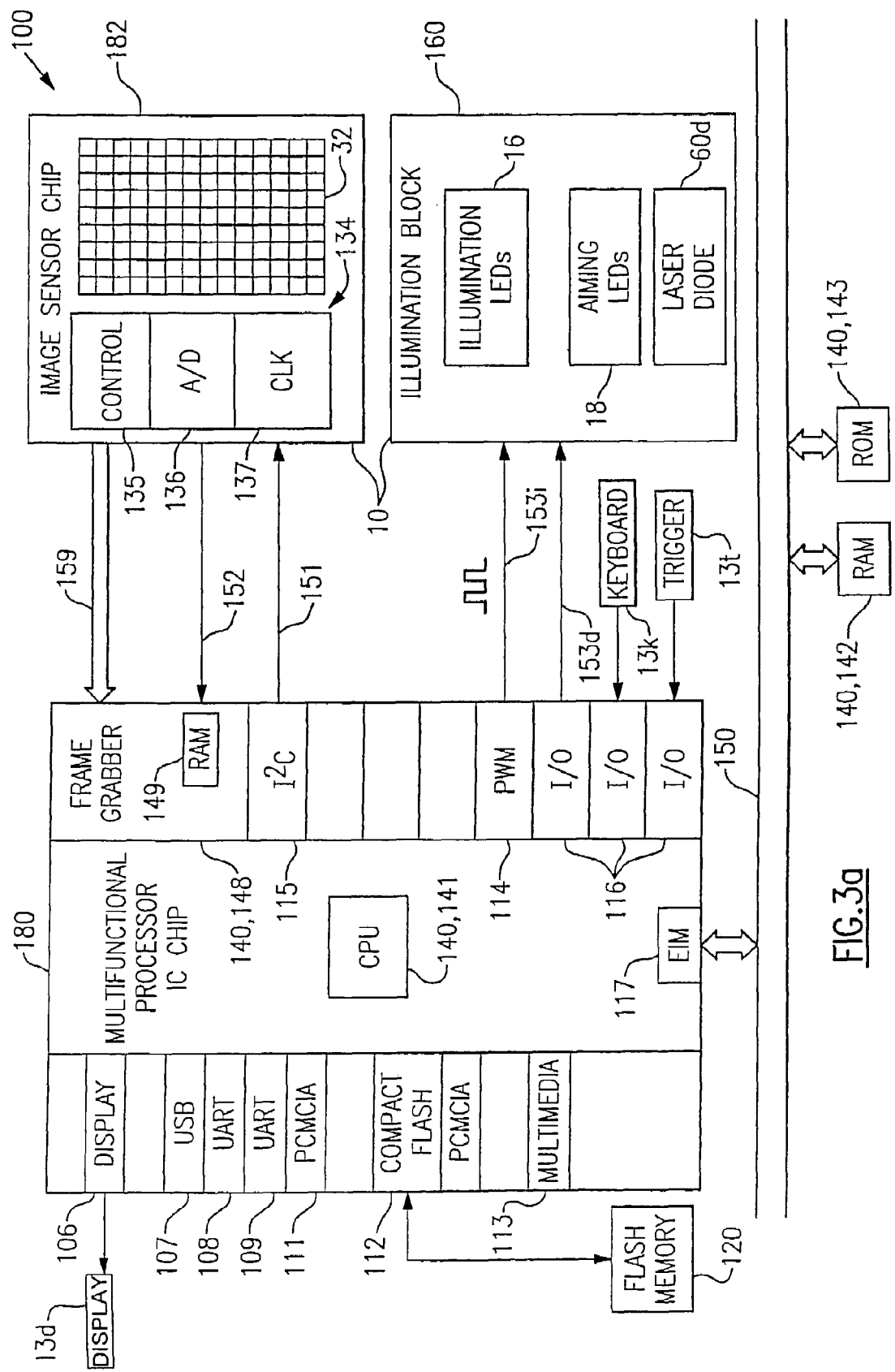
FIGS. 3a and 3b are block electrical diagrams of optical readers according to the invention.

In the specific embodiment of FIG. 3a, electrical circuit 100 includes a control circuit 140 comprising CPU 141, system RAM 142 and system ROM 143 and frame grabber block 148. Electrical circuit 100 further includes an image sensor 32 typically provided by a photosensitive array and an illumination block 160 having illumination LEDs 16 aiming LEDs 18 and laser diode 60d of a laser diode assembly 60 as shown in the physical form view of FIGS. 2c–2e. Image sensor 32 of FIG. 3a is shown as being provided by a 2D photo diode array. If image sensor 32 is replaced by a 1D image sensor, then aiming LEDs 18 and illumination LEDs 16 may be constituted by one set of LEDs. In the embodiment shown, image sensor 32 incorporated in an image sensor IC chip 182 typically further includes an image sensor electrical circuit block 134. Image sensor electrical block 134 includes control circuit 135 for controlling image sensor 32, and A/D conversion circuit 136, for converting analog signals received from image sensor into digital form and integrated clock 137 sometimes referred to as an oscillator.

In the embodiment shown in FIG. 3*a*, CPU 141 and frame grabber block 148 are incorporated in a multifunctional IC chip 180 which in addition to including CPU 141 includes numerous other integrated hardware components. Namely, multifunctional IC chip 180 may include a display control block 106, several general purpose I/O ports 116, several interface blocks such as a USB circuit block 107 and UART block 108 for facilitating RS 232 communications, a UART block 109 for facilitating Irda communications, and a pulse width modulation (PWM) output block 114. Multifunctional processor IC chip 180 can also have other interfaces such as a PCMCIA interface 111, a compact flash interface 112, and a multimedia interface 113. If reader 5 includes a display 13*d*, display 13*d* may be in communication with chip 180 via display interface 106. Trigger 13*t* and keypad 13*k* (if included on reader 5) may be in communication with chip 180 via general purpose I/O interface 116. Multifunctional processor IC chip 180 may be one of an available type of multifunctional IC processor chips which are presently available such as a Dragonball IC processor chip available from Motorola, an Anaconda IC processor chip available from Motorola, a DSC IC chip of the type available from Texas Instruments or a multifunction IC Processor chip of a variety available from Clarity, Inc.

Frame grabber block 148 of IC chip 180 replaces the function of a frame grabbing field programmable gate array (FPGA) as discussed in commonly assigned application Ser. No. 09/954,081, filed Sep. 17, 2001, entitled "Imaging Device Having Indicia-Controlled Image Parsing Mode," incorporated herein by reference and Ser. No. 09/904,697, filed Jul. 13, 2001, entitled "An Optical Reader Having a Color Imager" incorporated herein by reference. More particularly, frame grabber block 148 is a specifically adapted collection of hardware elements programmed to carry out, at video rates or higher, the process of receiving digitized image data from image sensor chip 182 and writing digitized image data to system RAM 142 which in the embodiment shown is provided on a discreet IC chip. Frame grabber block 148 includes hardware elements preconfigured to facilitate image frame capture. Frame grabber block 148 can be programmed by a user to capture images according to a user's system design requirements. Programming options for programming frame grabber block 148 include options enabling block 148 to be customized to facilitate frame capture that varies in accordance with image sensor characteristics such as image sensor resolution, clockout rating, and fabrication technology (e.g., CCD, CMOS, CID), dimension (1D or 2D) and color (monochrome or color).

Aspects of the operation of circuit 100 when circuit 100 captures image data into RAM 140 are now described. When trigger 13*t* is pulled, CPU 141, under the operation of a program stored in system ROM 143, writes an image capture enable signal to image sensor chip 182 via communication line 151. Line 151, like the remainder of communication lines described herein represents one or more physical communication lines. In the embodiment shown, wherein image sensor chip 182 is of a type available from IC Media Corp., I²C interface 115 of chip 180 is utilized to facilitate communication with chip 182 (if another image sensor chip is selected another type of interface, e.g., interface 116 may be utilized). Other types of signals may be sent over line 151 during the course of image capture. Line 151 may carry, for example, timing initialization, gain setting and exposure setting signals.

When control block 135 of image sensor chip 182 receives an image capture enable instruction, control block 135 sends various signals to frame grabber block 148. Image sensor control block 135 typically sends various types of synchronization signals to frame grabber block 148 during the course of capturing frames of image data. In particular, control block 135 may send to frame grabber block 148 "start of frame signals" which inform frame grabber block 148 that chip 182 is ready to transmit a new frame of image data, "data valid window" signals which indicate periods in which a row of image data is valid and "data acquisition clock" signals as established by clock 137 controlling the timing of image data capture operations. In the embodiment described, line 152 represents three physical communication lines, each carrying one of the above types of signals. In an alternative embodiment, vertical and horizontal synchronization signals are processed by frame grabber 148 to internally generate a data valid window signal. Frame grabber block 148 appropriately responds to the respective synchronization signals, by establishing buffer memory locations within integrated RAM 149 of block 148 for temporary storage of the image data received from image sensor chip 182 over data line 159. At any time during the capture of a frame of image data into system RAM 142, buffer RAM 149 of frame grabber block 148 may store a partial (e.g., about 0.1 to 0.8) or a full line of image data.

Referring to further aspects of electrical circuit 100, circuit 100 includes a system bus 150. Bus 150 may be in communication with CPU 141 via a memory interface such as EIM interface 117 of IC chip 180. System RAM 142 and system ROM 143 are also connected to bus 150 and in communication with CPU 141 via bus 150. In the embodiment shown, RAM 142 and ROM 143 are provided by discreet IC chips. System RAM 142 and system ROM 143 could also be incorporated into processor chip 180.

In addition to having system RAM 142, sometimes referred to as "working" RAM, electrical circuit 100 may include one or more long term storage devices. Electrical circuit 100 can include for example a "flash" memory device 120. Several standardized formats are available for such flash memory devices including: "Multimedia" (MMC), "Smart Media," "Compact Flash," and "Memory Stick." Flash memory devices are conveniently available in card structures which can be interfaced to CPU 141 via an appropriate "slot" electromechanical interface in communication with IC chip 180. Flash memory devices are particularly useful when reader 5 must archive numerous frames of image data. Electrical circuit 100 can also include other types of long term storage such as a hard drive which may be interfaced to bus 150 or to an appropriate I/O interface of processor IC chip 180.

In a further aspect of electrical circuit 100, control circuit 140 is configured to control the turning off and turning on of LEDs 16, 18 and laser diode 60*d* of illumination block 160. Control circuit 140 preferably controls illumination block 160 in a manner that is coordinated with the capturing of the frames of image data. Illumination LEDs 16 are typically on during at least a portion of frame capture periods. Configuring circuit 140 so that LEDs 16, 18, and diode 60*d* have off periods significantly reduces the power consumption of circuit 100.

In a further aspect of the electrical circuit 100, electrical circuit 100 can be configured so that PWM output interface 114 of IC chip 180 controls illumination LEDs of an imaging module such as illumination LEDs 16 of module 10-2.

In one embodiment, illumination block 160 is in communication with PWM output interface 114 and configured in such manner that LEDs 16 are turned on at a leading edge of PWM pulses output at PWM interface 114, and are turned off at falling edges of PWM pulses output at PWM interface 114. PWM interface 114 should be configured so that several pulses are generated and sent over communication line 153$i$ during the time that a single row of pixels of image data are exposed to light prior to clocking out of pixel values corresponding to that row. Thus, illumination LEDs 16 would be turned on and off several times during the exposure period for exposing a row of pixels to light. Further, the number of pulses output by PWM output 114 during the time that a single row of pixels are exposed should not vary substantially from row to row. The pixel clock signal received at frame grabber block 148 of IC chip 180 can be utilized to generate the PWM output. It can be seen, therefore, that multifunctional IC chip 180 including frame grabber block 148 and PWM output 114 greatly simplifies the task of developing PWM signals for use in controlling illumination LEDs 16 of module 10.

In another embodiment, PWM output 114 and illumination block 160 are configured so that PWM output 114 controls the intensity of illumination, not the on time/off time of illumination. LEDs block 160 in such an embodiment can include a power supply circuit which is interfaced to PWM output 114 such that the PWM signal output at PWM output 114 varies the voltage or current supplied to LEDs 16.

In a further aspect of electrical circuit 100, aiming LEDs 18 of circuit 100 can be controlled by a signal transmitted by a general purpose I/O port 116 of IC chip 180 over communication line 153$d$. Multifunctional processor IC chip 180 can be programmed so that an aiming LED control signal controlling LEDs 18 is driven to an ON state when pixels of image sensor 32 are not being exposed to light. Such control of image sensor 32 alleviates any affect which aiming LEDs 18 would otherwise have on an image signal generated by image sensor 32. If it is desired to selectively turn LEDs 18 ON during intermediate exposure periods, image sensor 32 should be selected to be of a type wherein all rows of image sensor 32 are exposed simultaneously, or else should otherwise be controlled so that periods exist wherein no row of image sensor 32 is exposed to light.

In accordance with the invention, it will be seen that it may be advantageous to eliminate the affect of light from laser diode assembly 60 on an image signal generated by image sensor 32. Accordingly, referring to the time line of FIG. 3$c$, it may be advantageous to selectively drive laser diode signal 168 ON intermediate of frame exposure periods $P_1, P_2, P_3 \ldots$, as in the aiming LED control signal described hereinabove.

In general, a short range aiming pattern, $P_s$ (see FIG. 9$a$), as projected by aiming LEDs 18 is highly visible to a user only where reader 5 is in a short range processor IC 179 performs a variety of operations. Via communication line 152, processor IC chip 179 may send synchronization signals, such as "start of scan," "data valid window," and "data acquisition clock" signals to frame grabber block 148. Processor IC chip 179 may also send timing signals and digital clocking signals (e.g., master clock, integration clear gate, and shift gate pulse) to 1D image sensor chip 182 including 1D image sensor 32. Processor IC chip 179 typically also transmits a master clock signal to A/D block 136. Referring to further aspects of IC chip 180 of circuit 101, CPU 141 of chip 180, may also send, e.g., gain setting, exposure setting, and timing initialization signals via line 151 to IC chip 179. Communication between IC chip 180 and IC chip 179 may be made via an SPI interface or I/O interface 116 of chip 180 and chip 179.

Processor IC chip 179 may be replaced by a programmable logic circuit, e.g., a PLD, CPLD, or an FPGA. IC chip 179 could also be replaced by an ASIC. Referring to further aspects of electrical circuit 101, analog voltage levels transmitted by image sensor 32 on line 155 are converted into gray scale pixel values by A/D converter 136 and then transmitted via line 159 to frame grabber block 148. Circuit 101 could also include a what may be referred to as an analog digitizer which processes an analog signal generated by image sensor 32 to generate a two-state output signal that changes state in accordance with light-to-dark and dark-to-light transitions of the image sensor analog output signal.

Processor IC chip 179 also controls illumination block 160. Illumination block 160 of a 1D long range image sensor reader 5 as explained with reference to FIGS. 2$a$ and 2$b$ typically includes a single bank of LEDs 18 which simultaneously illuminates a target area and projects a short range aiming pattern ($P_s$) facilitating aligning of the reader with a target indicia, and laser diode 60$d$ of laser diode assembly 60. LEDs 18 of 1D imaging module 10-1 like LEDs 16, 18 of module 10-2 can be pulsed so as to reduce energy consumption by LEDs 18. Laser diode 60$d$ can be controlled so as to be selectively turned on intermediate of frame exposure periods in the manner described with reference to the timing diagram FIG. 3$c$. That is, a laser diode control signal 168, as described with reference to FIG. 3$c$, can be selectively turned ON intermediate of frame (which comprise 1 or a limited number reading distance (e.g., less than 36" from a target). Long range aiming pattern P as projected by laser diode assembly 60 is normally highly visible to user over all reading distances. In accordance with another aspect of the invention, which will be described herein, one or both of aiming LEDs 18 and targeting diode 60$d$ can be selectively disabled in a manner depending on reading conditions, e.g., decoding delay time, reader-to-target distance.

Referring now to FIG. 3$b$, electrical circuit 101 is described. Electrical circuit 101 controls operation of a single imaging module optical reader comprising a low cost 1D CCD image sensor 32 disposed on an IC chip 182. Image sensor 32 of FIG. 3$b$ may be provided for example in a Toshiba Model TCD 1304 AP linear image sensor. Further aspects of an exemplary 1D imaging module are described, for example, in application Ser. No. 09/658,811, filed Sep. 11, 2000, entitled "Optical Assembly for Barcode Scanner," incorporated herein by reference.

Referring to aspects of electrical circuit 101 in detail, electrical circuit 101 includes a control circuit 140 which, like control circuit 140 of circuit 100 is partially incorporated in a multifunctional processor IC chip 180 including CPU 141 and a frame grabber block 148. Control circuit 140 of circuit 101 further includes system RAM 142, system ROM 143 and supplementary central processor unit (CPU) 141, integrated on processor IC chip 179. System RAM 142 and system RAM 143 are in communication with EIM interface 117 of IC chip 180 via bus 150.

Processor IC chip 179 provides control and timing operations similar to that provided by electrical block 134 of image sensor chip 182 described in FIG. 3$a$. Processor IC chip 179, in general, sends synchronization signals and digital clocking signals to IC chip 180, and sends digital clocking signals to A/D 136 and 1D image sensor chip 182 including image sensor 32. Processor IC chip 179 of circuit 101 may be a relatively low power processor IC chip such as an 8 BIT Cyprus PSOC CY8C26233-24PVI Microcontroller processor IC chip.

Aspects of the operation of IC chip 179 during the course of capturing slice image data will now be described in detail. When trigger 13*t* is pulled, CPU 141 transmits an image capture enable instruction over communication line 151. In response to receipt of an image capture enable instruction received from chip 180, of rows of pixels in the case of a 1D image sensor), exposure periods $P_1$, $P_2$, $P_3$ to the end that light from laser diode assembly does not affect an image signal generated by image sensor 32.

Various alternative embodiments of the invention are now described with reference again to FIGS. 2*a*–2*e* and to FIGS. 4*a*–7*h*. Referring to the example of FIG. 4*a* laser diode assembly 60 is canted such that an axis $a_E$ of an emitted laser beam emitted by laser diode assembly 60 is at an angle with respect to imaging axis $a_i$ to the end that a spot of light P, is projected at a horizontal centerline 400 of a field of view of reader 5 at one specific reader distance, d. In such an embodiment the position of aiming pattern P with respect to a horizontal centerline 400 of a field of view of reader 5 will change depending on the reader-to-target distance. As shown in FIG. 4*a*, at close reader distances 70, module 15 will project an aiming pattern P above a horizontal centerline 400 of a field of view. At longer reader distances 71, pattern P will be projected below a centerline 400.

Module 10-1 as shown in FIGS. 2*a* and 2*b* is adapted so that a spot of light aiming pattern P projected by targeting system 60 remains at approximately the same position with respect to a centerline 400 of a field of view at all reader to target distances. Module 10-2 shown in FIGS. 2*c*–2*e* is devoid of light redirecting elements for redirecting laser beam light emanating from laser diode assembly 60. Module 10-1 on the other hand includes a prism 62 for redirecting aiming laser beam light emanating from laser diode assembly 60. As best seen in seen in FIG. 2*b*, prism 62 reduces the y-direction spacing between an emit axis $a_E$ corresponding to the path of emitted laser beam aiming light and an imaging axis $a_i$ of module 10-1. Reducing the y-direction spacing between emit axis $a_E$ and imaging axis $a_i$ results in the position of aiming pattern P being moved closer to a horizontal centerline 400 of a reader field of view. Prism 62 could be replaced by alternative light redirecting elements such as mirrors or a combination of mirrors and prisms. Prism 62 can be integrally formed on optical member 26 so that optical member 26 is a one piece unit comprising prism 62, at least one emit optical element 25 and at least one diffuser optical element 27.

While module 10-1 includes emit optic light folding elements (e.g., optics that fold light emitted from laser diode assembly 60), it may also be desirable to configure reader 5 so that reader 5 includes receive optic light folding elements. Module 10-4 of FIG. 4*b* includes mirrors 39 disposed in a receive optical path for folding imaging axis as of module 10-4. Incorporating light folding optical elements in module 10-4 can reduce z-direction (length) space consumption requirements of module 10-4, rendering module 10-4 more readily fittable into optical reader housings having limited available space for accommodation of module 10-4. Mirrors 39 of module 10-4 can be replaced by a prism, prisms, or combination of mirrors and prisms. The desirability of incorporating light folding elements in an optical receive path of a long range reader module increases as the best focus receive distance of module 10 increases maintaining the characteristics of imaging optics 40 constant. The best focus distance of module 10, in general can be increased by increasing a focal length of optics 40 together with a distance between imaging optics 40 and image sensor 32. By incorporating light folding optics in a light receive path of module 10, a spacing between imaging optics 40 and image sensor 32 can be achieved without increasing the overall z-direction space consumption of module 10.

Figure 5A:
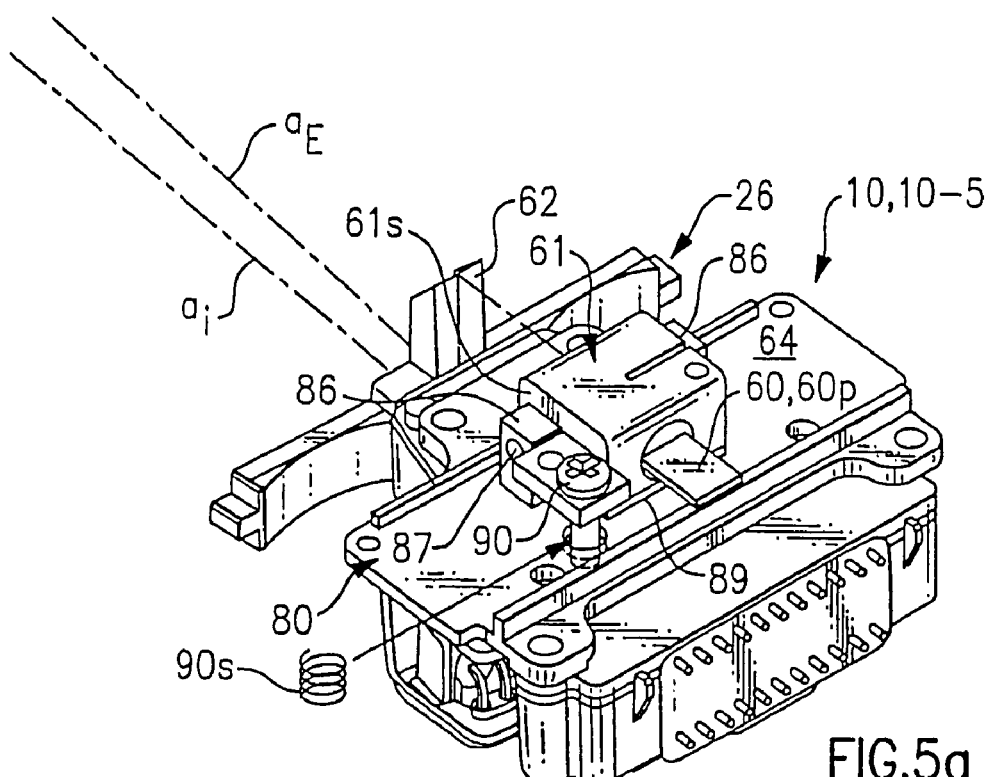
FIGS. 5a–5b are perspective views of a type of imaging module according to the invention.
Figure 5B:
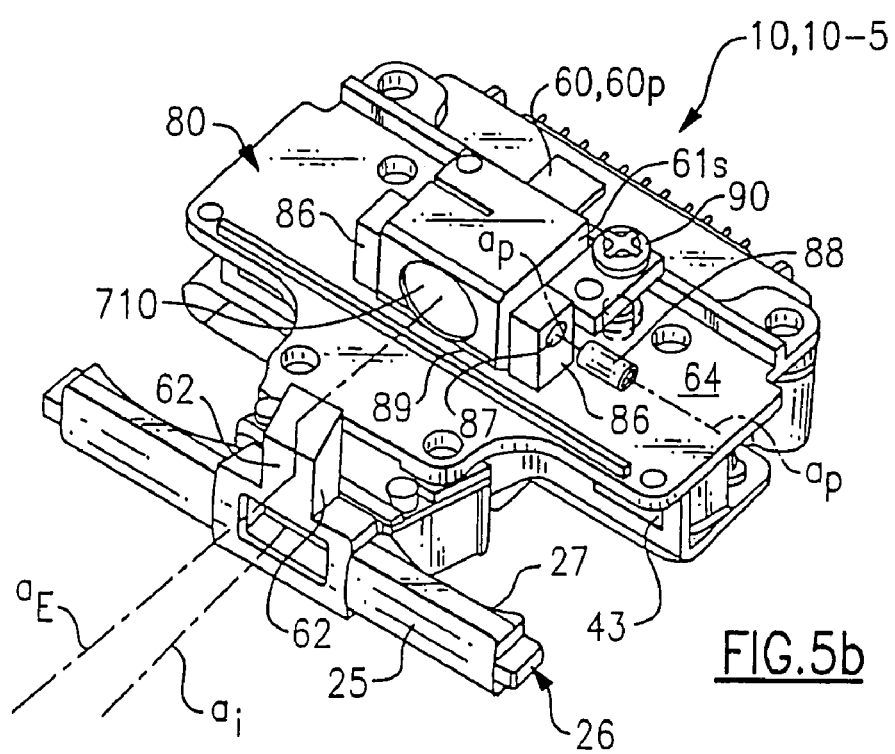

It will be appreciated that small errors in the relative positions of aiming laser diode assembly 60 and an imaging system (including sensor 32 and optics 40) can deleteriously affect the operation of reader 5. If emit axis $a_E$ is nominally parallel with imaging axis $a_i$ but as a result of manufacturing and/or assembly error is instead 1 degree angularly offset relative to imaging axis, a spot aiming pattern will be displaced 4.2 inches from its nominal position at a reading distance of 20 feet. Referring now to FIGS. 5*a* and 5*b* a method and apparatus for finely adjusting and securing a position of laser diode assembly 60 on module 10 is described.

Referring to module 10-5 of FIGS. 5*a*–5*b*, top surface 64 of support assembly 80 includes support members 86 extending upwardly therefrom. Support members 86 may be integrally formed on, bolted to, adhesively bonded to or otherwise securely attached to top surface 64 of assembly 80. Laser diode assembly 60 of module 10-4 is disposed within box housing 61 having sidewalls 61*s*. Sidewalls 61*s* of holder 61 and upwardly extending support members 86 have pin-receiving holes 87 formed therein. For installation of holder 61 on module 10-5 a resilient pad 89 is first installed in the holder receiving area of top surface 64 defined by support members 86. Resilient pad 89 may be secured on top surface 64 with use of adhesive. With resilient pad 89 located on top surface 64, holder 61 including diode assembly 60 is disposed within a holder-receiving area of module 10-5 defined by support members 86. Holder 61 is positioned on module 10-5 so that pin-receiving holes 87 of holder 61 (not shown) and support member 87 are aligned. With pin holes of holder 61 and support members 86 aligned, pins 88 are inserted into the aligned pin receiving holes 87.

Holder 61 pivots about an axis $a_p$ defined by pins 88 when pins 88 are installed in the aligned pin holes of holder 61 and support members 86. Pivoting holder 61 about axis $a_p$ adjusts an angle defined between emit axis $a_E$ and imaging axis $a_i$. For securing laser diode assembly 60 at a precisely defined angular position relative to imaging axis $a_i$, adjustment screw 90 fittable in holes of holder 61 and surface 64 is adjusted. For adjusting an angle between emit axis $a_E$ and imaging axis $a_i$, adjustment screw 90 is adjusted. As best seen in FIGS. 6*a* and 6*b* imaging module 10-5 includes a one piece optical member 26 having emit optic surface 25, for imaging an aperture 43 over a target, T, a negative lens surface 27, and integrated prism 62. One-piece member 26 further includes a window 29 disposed about imaging axis $a_i$ for allowing imaging light rays to pass there-through. Module 10-5 of FIGS. 5*a* and 5*b* may also include a spring 90*s* fitted over screw 90 and interposed between holder 61 and surface 64. Spring 90*s*, which biases holder 61 away from surface 64, may supplement or replace a biasing function provided by resilient pad 89.

Figure 5C:
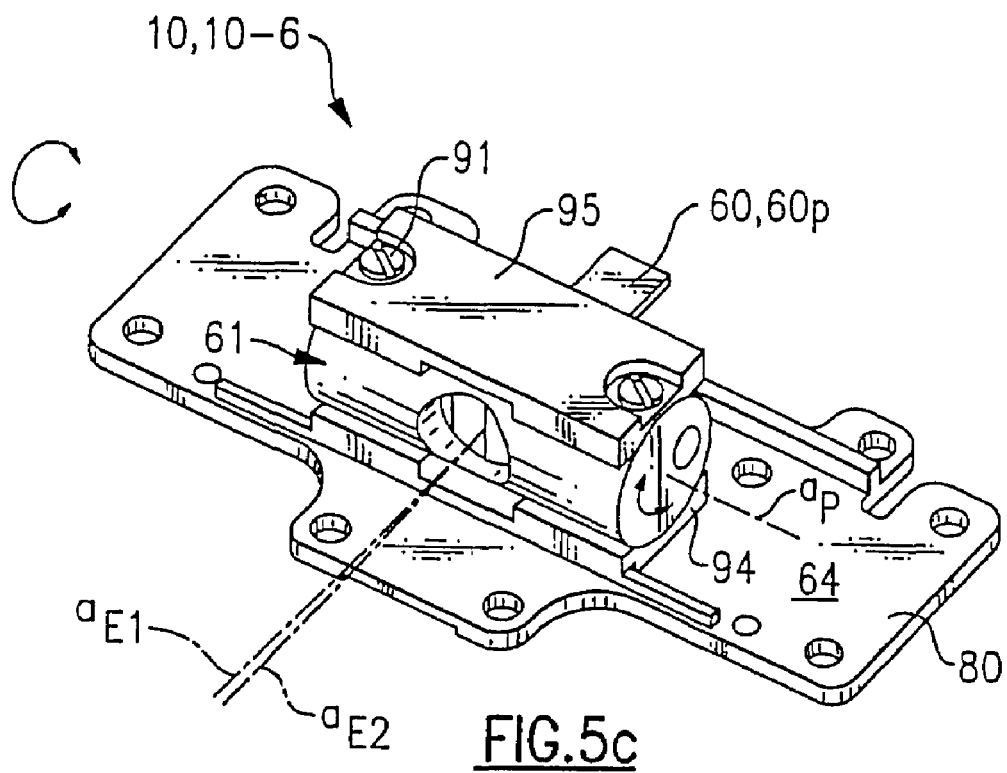
FIGS. 5c–5d are perspective views of a type of imaging module according to the invention.

Additional finely adjustably laser diode assembly mounting assemblies are described with reference to FIGS. 5*c* and 5*d*. In the embodiment of FIG. 5*c*, a bottom bed 94 of module 10-6 is disposed on top surface 64 of assembly 80, cylindrical holder 61 is placed on top of bed 94, and top clamp 95 is disposed over cylindrical holder 61. Bottom bed 94 and top clamp 95 have contours to allow pivotal rotation of holder 61 within the clamping assembly defined by bed 94 and top clamp 95. When a desired position of holder 61 within the clamping assembly is achieved, a clamping screw 91 is disposed through aligned screw-accommodating holes of top clamp 95, holder 61 and bed 94, and then tightened to secure holder 61 in a desired position. Screw holes of holder 61 should be elongated about a circumference of holder 61 to accommodate pivoting of holder 61.

Figure 5D:
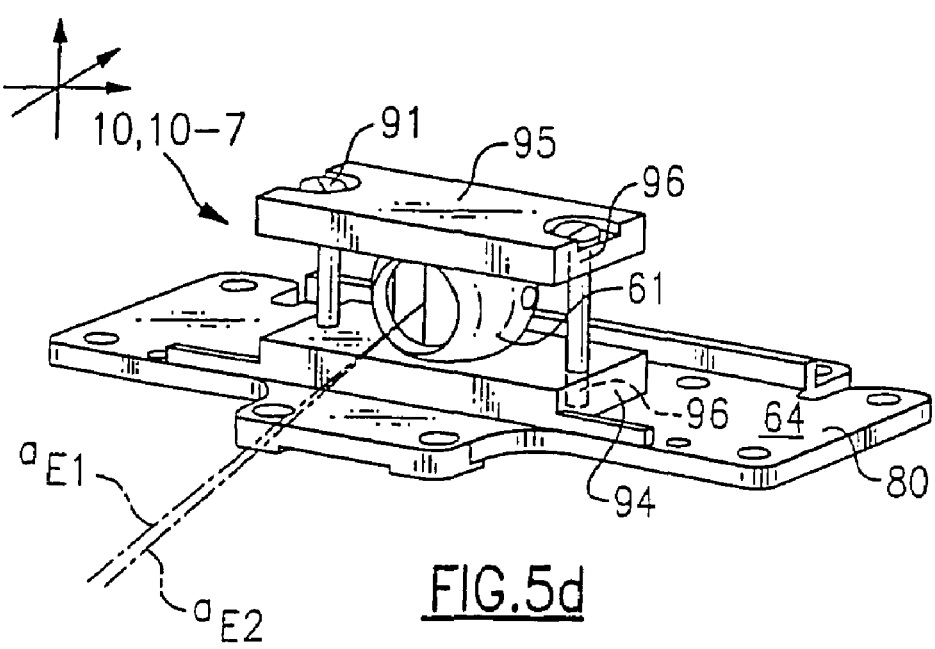

Referring to FIG. 5d, module 10-7 is constructed substantially the same as module 10-6 except that module 10-7 is adapted to allow rotational fine adjustment of holder 61 within a clamping assembly defined by top clamp 95 and bottom bed 94 instead of pivotal adjustment about a pivoting axis $a_p$ as in module 10-6. To facilitate rotational adjustment of holder 61 of module 10-7 holder 61 is ball shaped and complementary contours of top clamp 95 and bottom bed 94 are spherical so as to accommodate ball-shaped holder 61. When a desired rotational alignment of holder 61 is achieved, screws 91 are inserted into aligned holes 96 of clamp 95 and bed 94 and then tightened to secure holder 61 in a desired position.

The fine adjustment of the angle between emit axis $a_E$ and imaging axis $a_i$ can be aided with a visual feedback adjustment system. In one visual feedback system described with reference to FIG. 8a imaging module 32 having finely adjustable targeting optics is disposed in a fixture 810 which securely holds module 10 in a fixed position. Further, a test target substrate, s, (which may be provided by a wall) is disposed at a certain expected long range reading position (e.g., 5 feet, 10 feet, 20 feet, 30 feet) within the field of view of module 10. Printed matter 820, 822 may be formed on test substrate, s, for aiding the adjustment of laser diode assembly 60. Printed matter 820 may be an outline of the expected field of view of module 10 on substrate s. Printed matter 820 may be a small-height linear bar code adapted so that reading of the bar code included in printed matter 820 indicates that a field of view of module 10 coincides with printed matter 820. Printed matter 822 may be a marking for indicating the desired position of an aiming pattern P on test substrate s relative to the expected field of view. For fine adjustment of laser diode assembly 60, screw 90 (with reference to module 10-5) is loosened and or tightened until the beam projected aiming pattern coincides with printed matter marking 822. When a desired position is achieved (with reference to module 10-5) an adhesive may be applied to an interface between holder 61 and pin 88. In the case of modules 10-6 and 10-7 screws 91 are tightened when a desired position is achieved.

Another fine adjustment visual feedback system is described with reference to FIG. 8b. In the system described with reference to FIG. 8b the visual positioning feedback provided is electronically displayed visual feedback. As explained herein, laser diode assembly 60 can be advantageously turned on intermediate frame exposure period and turned off during frame exposure periods. In an assembly mode of operation as explained with reference to FIG. 8b, laser diode 60d of laser diode assembly 60 is turned on during frame exposure periods so that aiming pattern P if included in a field of view of module 10-5 will be represented in a captured image captured via actuation of module 10. In the system of FIG. 8b module 10-5 is provided in electrical communication with video monitor 68d (here provided by a personal computer assembly) and monitor 68d and module 10-5 are configured so that monitor 68d electronically displays an electronic representation 830 of a captured frame of image data. In the case module 10 includes a 2D image sensor representation 830 can be a 2D image representation. In the case module 10 includes a 1D image sensor, representation 830 can be an enhanced height visual representation, as is shown in the embodiment of FIG. 8b. Representation 830 can also be a false color representation. At very close reading distances aiming pattern P may not be visible in a captured 1×N "slice" frame of image data if emit axis $a_E$ and imaging axis $a_i$ are substantially spaced and in parallel relation. However, at longer reading distances, beam projected aiming pattern P will be represented within a slice frame of image data. In the adjustment system described with reference to FIG. 8b, fixture disposed module 10-5 and substrate s are spaced apart at such distance so that when an aiming beam traveling along axis $a_E$ is parallel with imaging axis $a_i$, aiming pattern P projected on substrate s by laser diode assembly 60 is detectable within a captured frame of image data but is not detectable if an angle between emit axis $a_E$ and imaging axis $a_i$ is incorrect. In the system described, set screw 90 can be gradually loosened from a tight position until aiming pattern P first becomes visible within electronically displayed representation (as indicated by aiming pattern representations $P_R$ of FIG. 8b), or electronically detectable within a frame. When such a feedback is achieved, the position of laser diode assembly 60 can be considered to be finely adjusted. Referring to the system of FIG. 8b, a representation $P_R$ of pattern P is included in displayed representation 830 of a captured frame of image data.

Figure 8A:
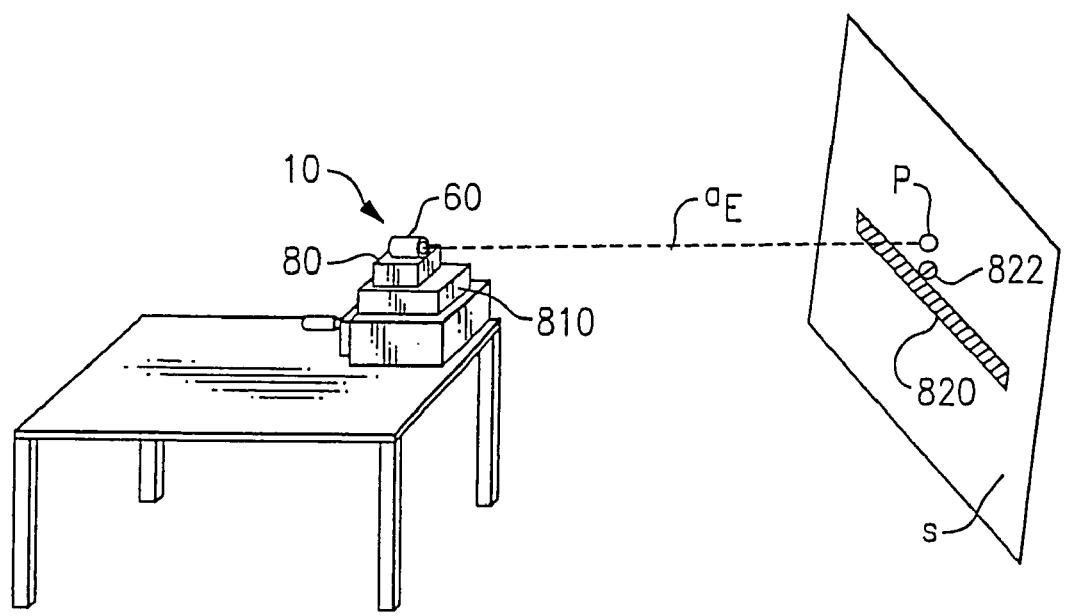
FIGS. 8a–8b are schematic diagrams illustrating methods for assembly of an imaging module according to the invention.
Figure 8B:
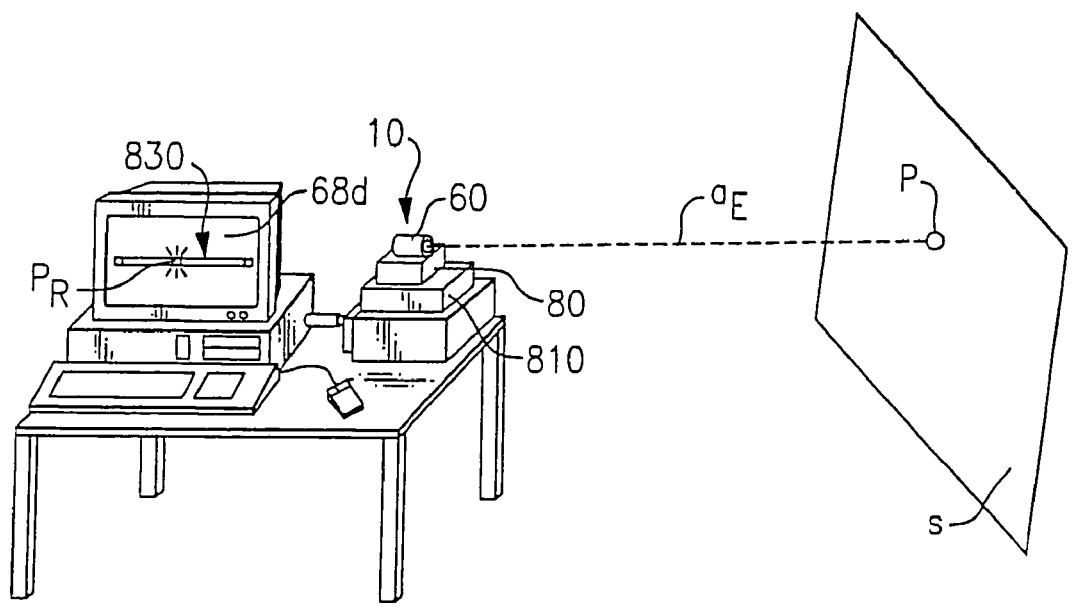

The printed matter feed back system of FIG. 8a and electronically displayed feedback system of FIG. 8b can be combined in a variety of useful ways. For example the printed matter 820, 822 of FIG. 8a can be formed on test target substrate s of FIG. 8b and can be captured and electronically displayed on a monitor 68d as in the system of FIG. 8b. A user can adjust the position of aiming pattern P to coincide with printed matter marking 822 while observing electronic display 68d to confirm that printed matter 822 is actually being captured by module 10. Module 10 of fine adjustment visual feedback systems of FIGS. 8a and 8b can include one fine adjustment mounting assemblies, e.g., one of the assemblies of modules 10-5, 10-6, 10-7 described with reference to FIGS. 5a–5e.

Referring to FIGS. 7a–7h showing top perspective schematic views of alternative imaging modules projecting various aiming patterns onto a target substrate, s, a variety of additional alternative embodiments of the invention for projecting multiple spot aiming patterns P are described. A long range aiming pattern comprising a pair of aiming spots, $P_1$ and $P_2$, if projected on a line parallel with a horizontal centerline 400 of a field of view of imaging module 10 aid in the X-Y plane rotational alignment of module 10 with respect to a target indicia, i.

Figure 7A:
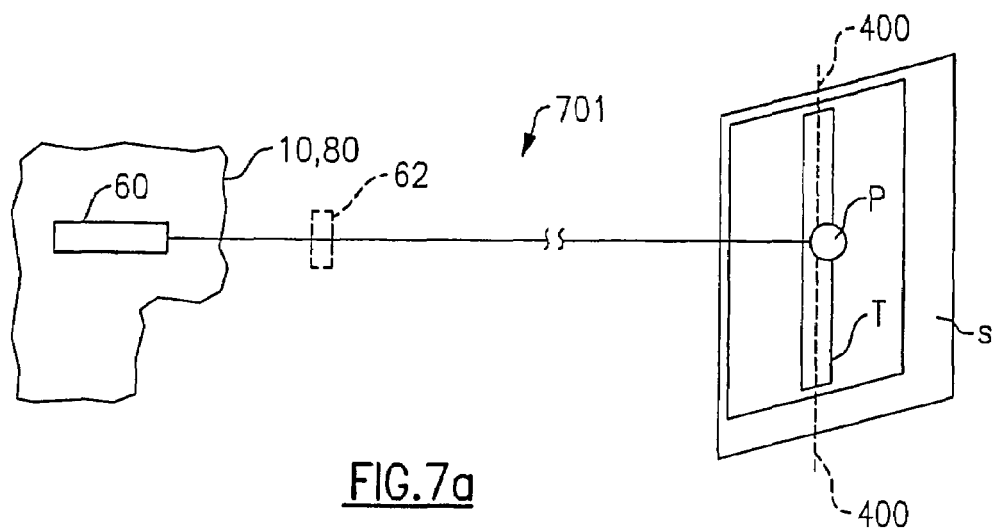
FIGS. 7a–7h illustrate schematic views of various long range aiming systems according to the invention.

For reference, a schematic block diagram corresponding to modules 10-1, 10-3, 10-4, and 10-5 previously described having a single laser diode assembly 60 projecting a single spot aiming pattern P is shown in FIG. 7a. In system 701 of FIG. 7a, laser diode assembly 60 mounted on module 10 projects a single spot aiming pattern P onto a target substrate P. Generally, the spot P is projected slightly above a horizontal centerline 400 of a field of view of module 10 delimited by target, T. System 701 includes an optional prism 62 as described previously which affects the vertical axis positioning of pattern P.

Figure 7B:
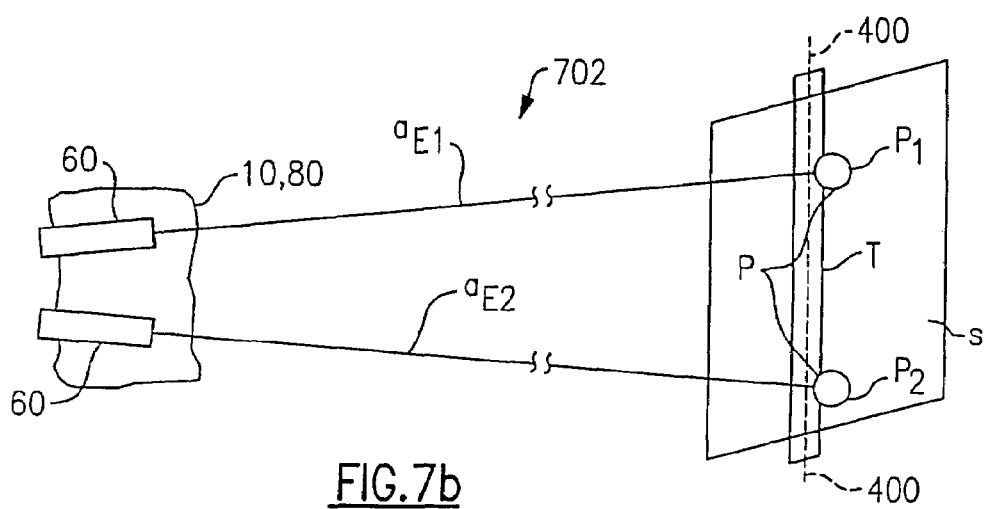

In system 702 shown in FIG. 7b, a pair of laser diode assemblies 60 mounted on module 10 project an aiming pattern P comprising two spots $P_1$ and $P_2$ on a target substrate, s. Diode assemblies 60 are arranged so that emit axes $a_{E1}$ and $a_{E2}$ of the two diode assemblies are in diverging relation. Configured in such manner, aiming spots $P_1$ and $P_2$ of aiming pattern P are substantially spaced apart at expected reading distances.

Figure 7C:
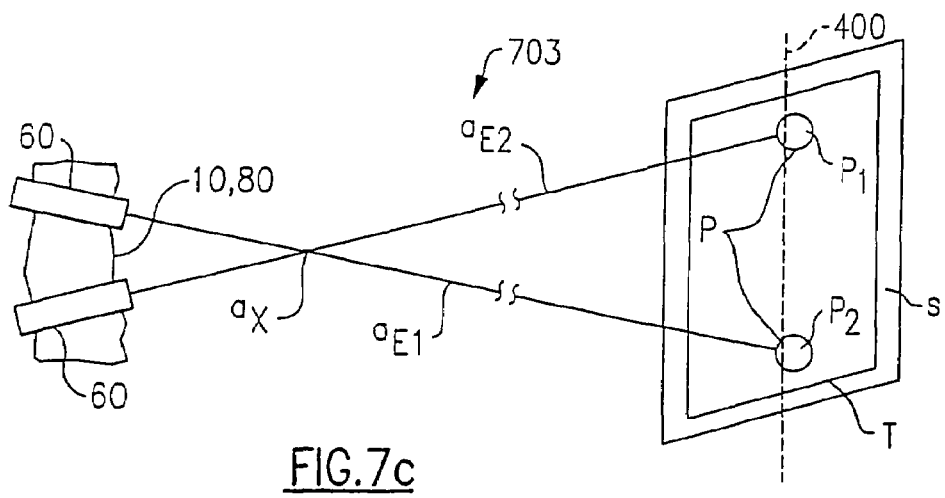

A pair of laser diode assemblies 60 are also mounted to module support assembly 80 in system 703 depicted in FIG. 7c. In system 703 diode assemblies 60 are disposed in converging relation with so that apex, x, is defined at reading distances less than expected reading distances to the end that imaging axes $a_{E1}$ and $a_{E1}$ are in diverging relation at expected reading distances. System 703 like system 702 is configured so that spots $P_1$ and $P_2$ of aiming pattern P are substantially spaced apart at expected reading distances. Module 10 in system 703 is a 2D imaging module having a rectangular field of view corresponding to a target, T, as opposed to slice field of view corresponding to slice targets, T, depicted in systems 701 and 702.

Figure 7D:
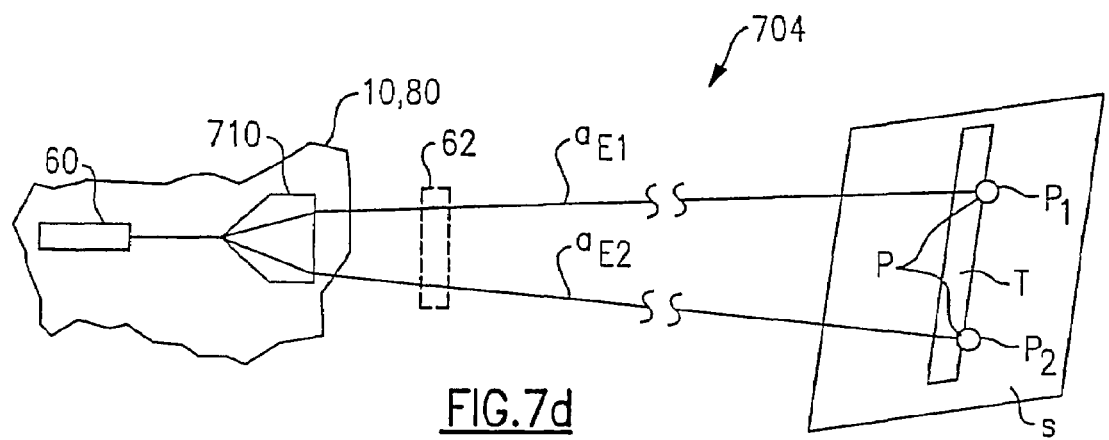

In system 704 depicted in FIG. 7d a single laser diode assembly 60 is disposed on module support assembly 80 together with prism 62. Prism 710 is shaped and disposed so that a light beam entering prism 710 is split to generate two exit beams traveling along beam axes $a_{E1}$ and $a_{E2}$. System 704 like system 702 and system 703 is configured so that expected reading distances, spots P1 and P2 of aiming pattern P are in diverging relation. A physical form view of system 704 is provided by FIGS. 5c and 5d, showing perspective views of module 10-6 and module 10-7, respectively. Shown as being an apex-out type prism, prism 710 could be provided by an apex-in type prism.

Figure 7E:
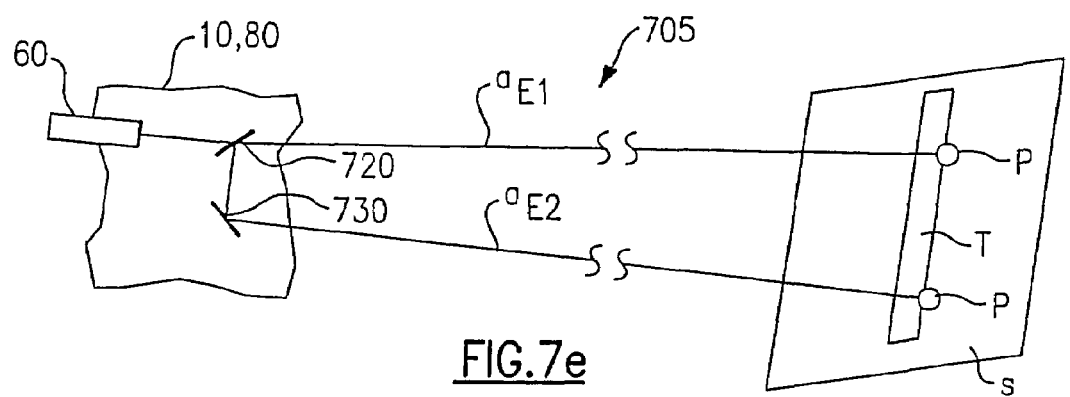

In system 705 depicted in FIG. 7e a single laser diode assembly 60 is mounted on support assembly 80 in combination with beam splitter 720 and mirror 730. A part of a light entry beam entering splitter 720 is transmitted through splitter 720 while a part of a light entry beam entering splitter 720 is directed to mirror 730 which directs the light beam to target substrate, s. System 705 is configured so that beams traveling along axes $a_{E1}$ and $a_{E2}$ are in diverging relation to the end that spots P1 and P2 of aiming pattern P are substantially spaced apart at expected reading distances.

Figure 7F:
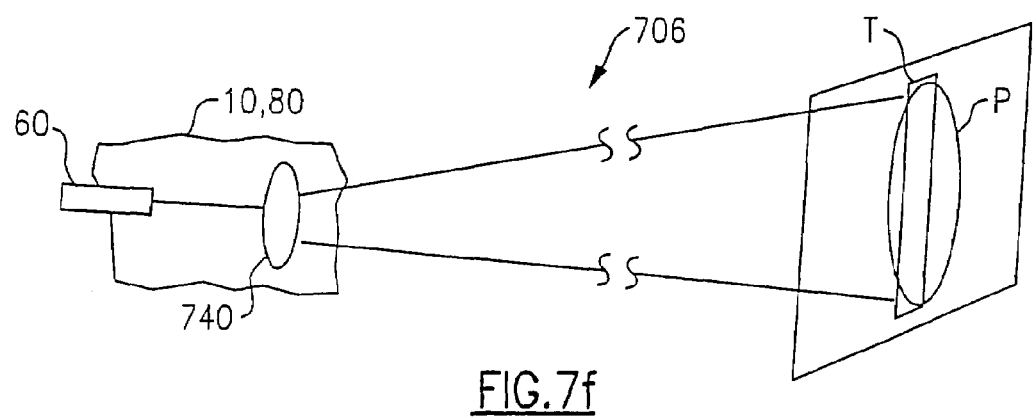

In system 706, depicted in FIG. 7f, a single laser diode assembly 60 is mounted on support assembly 80 together with a shaping optic 740. Shaping optic 740 shapes a laser light beam emanating from laser diode assembly 60 into an elliptical aiming pattern P which is visible at expected reading distances. Shaping optic 740 may be provided, for example, by a cylindrical lens.

Figure 7G:
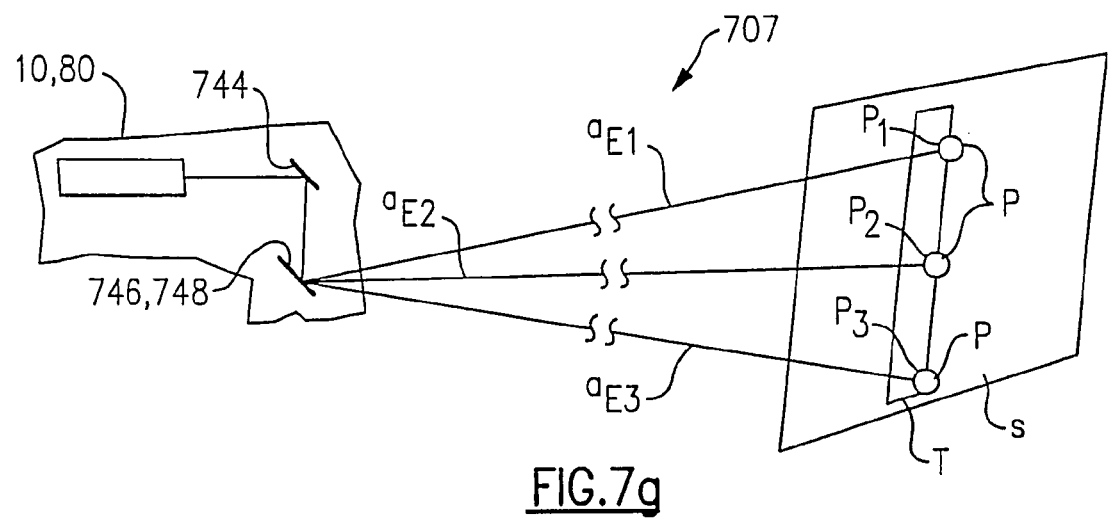

In system 707 depicted in FIG. 7g a single laser diode assembly 60 is mounted on support assembly 80 together with a first mirror 744 and a second mirror 746 having a diffractive element 748 formed thereon. Diffractive element 748 scatters a light beam directed thereto into three discreet light beams each traveling along one of emit axes $a_{E1}$, $a_{E2}$, $a_{E3}$. System 707 is configured so that beams having axes $a_{E1}$, $a_{E2}$, and $a_{E3}$ are in diverging relation to the end that spots $P_1$, $P_2$, and $P_3$ of pattern P are substantially spaced apart at expected reading distances. Diffractive element 748 could in another embodiment be spaced apart from mirror 746.

Figure 7H:
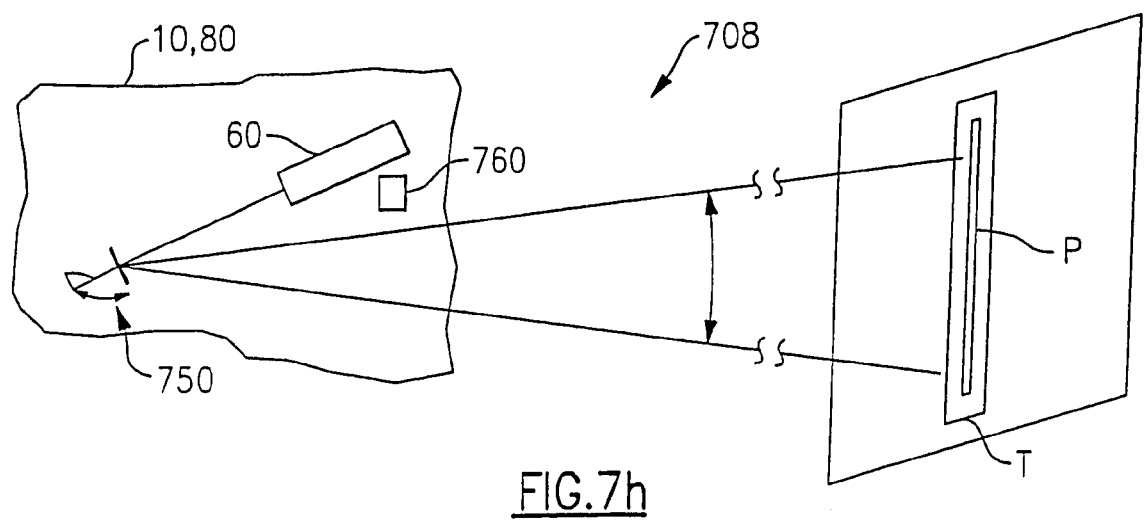

In system 708 depicted in FIG. 7h a single laser diode assembly 60 is mounted on support assembly 80 together with a moving mirror 750. Moving mirror 750 is moved to sweep a laser beam across a target substrate within a field of view of image sensor 32 delimited by target area T as depicted by FIG. 7h. Aiming pattern P in the embodiment of FIG. 7h appears as a straight thin line to a user. Moving mirror 750 may be pivoted or vibrated. Moving mirror 750 can be fabricated utilizing Micro-Electro-Mechanical Systems (MEMS) technology to the end that moving mirror 750 includes micromachined parts incorporated on an IC chip, wherein movement of the moving mirror 750 is responsive to a signal sent to the MEMS IC chip from control circuit 140. System 708 can further include a single photodetector 760 configured to sense light from scanned light beam as is reflected from substrate s so that laser diode assembly 60 in combination with moving mirror 750 in combination with photodetector 760 form the components of a laser scan engine. Signals generated by photodetector 760 can be digitized or subjected to analog-to-digital conversion and transmitted to control circuit 140. Control circuit 140 can subject the received signals to decoding so as to provide a secondary decoded output message that supplements a decoded out message generated as described previously by subjecting a frame captured via actuation of image sensor 32 to decoding.

Specific methods for operating long range reader 5 are described with reference to FIGS. 9a–9c. In FIG. 9a a long range reader 5 having a display 13d is shown which is adapted to be operated in three operating modes: (1) a "laser aimer enabled" mode corresponding to displayed message 910; (2) a "laser aimer disabled" mode corresponding to displayed message 912; and (3) an "adaptive laser aimer" mode corresponding to displayed message 914. These three modes can be actuated via selection of the appropriate key of key board 13k or other known GUI highlighting or pointer based selection method. If reader 5 does not include a display 13d and keyboard 13k or if another menu interface is desired, the selection of a desired menu option can be made by reading an appropriate "menu symbol" as described in U.S. Pat. No. 5,929,418, entitled "Optical Reader Having Improved Menuing Features" incorporated by reference or by transmission of a command from a host computer such as a PC which is in communication with reader 5. While long range aiming pattern P is highly useful in aiding the alignment of reader 5, long range aiming pattern P may not be necessary in certain circumstances. For example, at short range reading distances as depicted in FIG. 9a, a reader can be adequately aligned with use of short range LED projected aiming pattern $P_s$ projected by aiming/illumination LEDs 18 of a 1D imaging module or aiming LEDs 18 of 2D imaging module as described herein. If long range aiming pattern P is not necessary for aiding the alignment of reader 5 it may be desirable to disable laser diode assembly 60 for purposes of reducing energy consumption.

If mode 1, "laser aimer enabled" is selected, laser diode assembly 60 is always enabled until the mode is changed. That is, every time trigger 13t is pulled, laser diode 60d is actuated at least during periods intermediate of frame exposure periods.

If mode 2, "laser aimer disabled" is selected, aimer laser diode assembly 60 is disabled until a mode is changed. That is, laser diode 60d is never actuated even when trigger 13t is pulled, until a mode is changed.

If mode 3, "adaptive laser aimer," is selected, laser diode assembly 60 is adaptively enabled or disabled depending on a sensed reader condition.

Figure 9B:
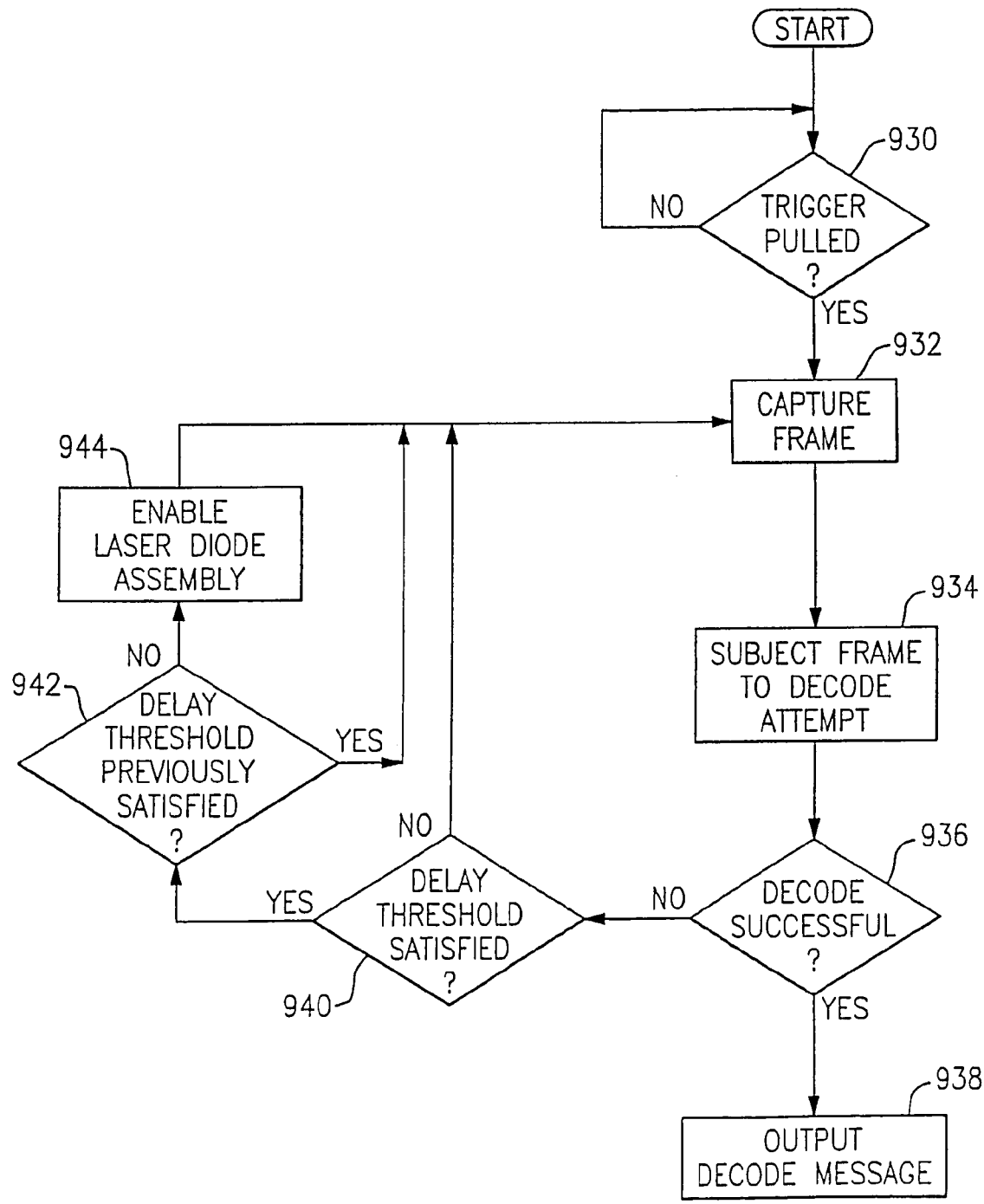
FIGS. 9b–9c are flow diagrams illustrating methods for controlling an optical reader according to the invention.
Figure 9C:
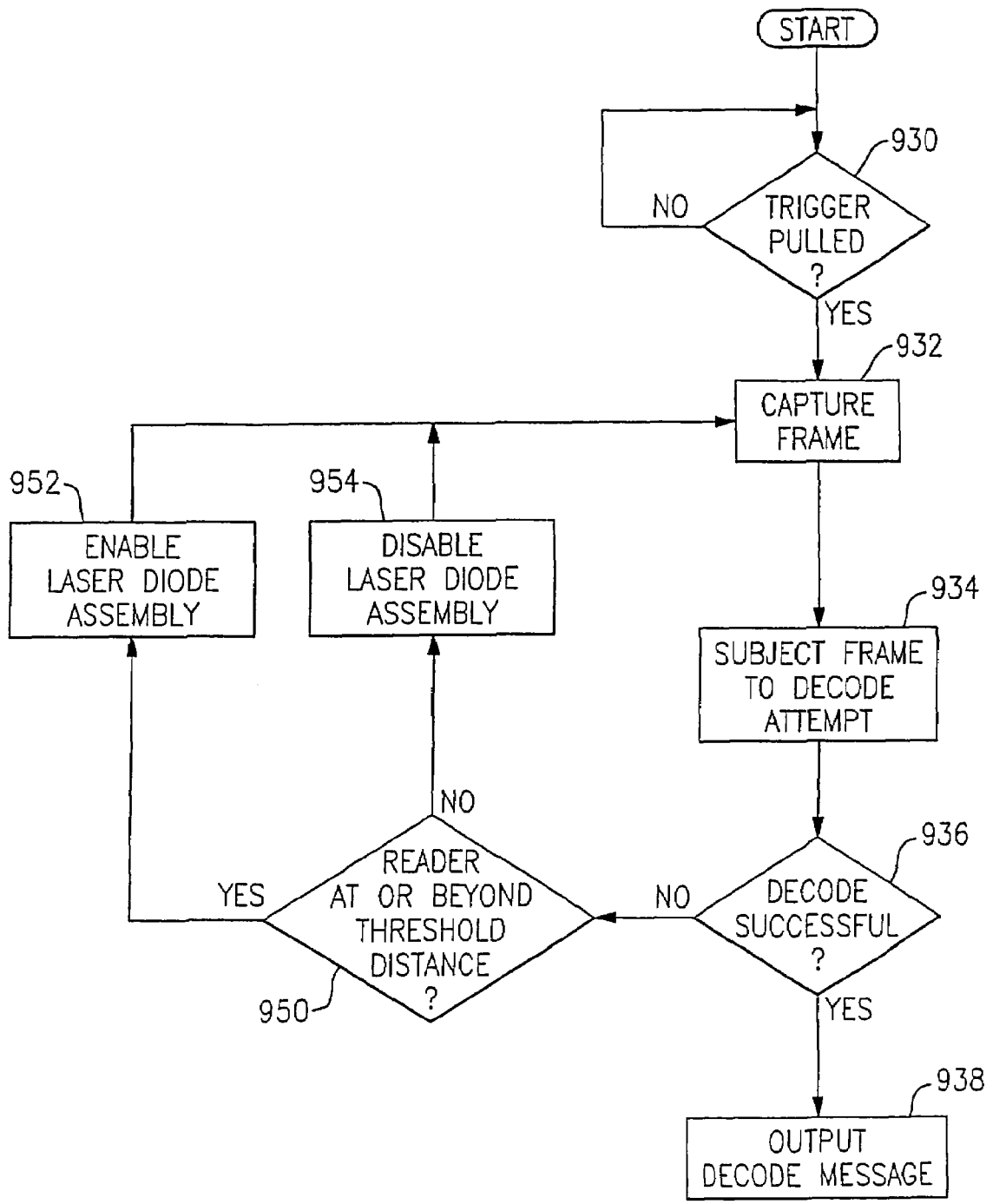

With reference to the flow diagram of FIG. 9b a reader control method is described wherein laser diode assembly 60 is adaptively enabled or disabled depending on whether a delay threshold has been satisfied. At block 930 control circuit 140 determines if a trigger 13t has been pulled. If trigger 13t has been pulled, control circuit 140 proceeds to block 932 to capture a frame of image data, and then to block 934 to subject the frame of image data to a decode attempt. The attempt to decode decodable indicia may be made in accordance with one of a decoding methods that is described in U.S. application Ser. No. 09/904,697, filed Jul. 13, 2001, entitled "Optical Reader Having a Color Imager," incorporated herein by reference. If controller 140 at block 936 determines that decoding was successful, control circuit 140 at block 938 outputs the decoded message. If decoding was not successful, control circuit 140 proceeds to block 940 to evaluate whether a delay threshold has been satisfied by reader 5. The current delay of reader 5 may be calculated based on the real time elapse accruing from the time that trigger 13t is first pulled (block 930) utilizing a real time clock function of IC chip 180. The delay condition can also be calculated, for example, based on the number of frames that have been captured since the time that trigger 13t was pulled or by another suitable method. If the delay threshold has been satisfied, control circuit 140 proceeds to block 944 to enable laser diode 60d from a normally disabled state. Block 942 indicates that control circuit 140 does not have to repeatedly re-enable diode assembly 60 after enabling assembly 60 a first time.

Incorporating the method of FIG. 9b into reader 5 configures reader 5 so that long range aiming pattern P is projected onto a target substrate, s, only after a delay threshold has been satisfied. In some reading applications, reading may be so readily accomplished that long range aiming pattern P may not be needed for aiming reader 5. By the control method of FIG. 9b laser diode assembly 60 is adaptively enabled only under difficult reading conditions (which may be long range reading conditions) wherein reading is not successful within a predetermined time delay threshold.

Another adaptive laser aimer control method is described with reference to FIG. 9c. The processing steps of blocks 930 of the flow diagram of FIG. 9c, 932, 934, 936, and 938 are identical to those described above with reference to the flow diagram of FIG. 9b. However, at block 950 of the method of FIG. 9c control circuit 140 determines whether a reader-to-target distance threshold has been satisfied rather that determining whether a delay threshold has been satisfied as in block 940 (FIG. 9b). If control circuit 140 at block 950 determines that reader 5 is at least as far from a target as a predetermined threshold distance, control circuit 140 proceeds to block 952 to enable laser diode assembly 60. When diode assembly 60 is enabled control circuit 140 may pulse diode "on" intermediate of frame exposure periods as described herein. If control circuit 140 determines that a current reader-to-target distance is less than a threshold distance, then control circuit 140 proceeds to block 954 to disable aimer laser diode assembly 60.

Control circuit 140 may calculate a current reader-to-target distance in a number of different ways. A method for generating a "degree of focus" signal which is indicative of reader-to-target distance is described in U.S. Pat. No. 5,773,810, issued Jun. 20, 1998, entitled "Method for Generating Real Time Degree of Focus Signal for Handheld Imaging Device," incorporated herein by reference. In addition it is seen that in any one of aiming systems 702–705, a reader-to-target distance can be normally estimated based on the spacing between representations of aiming spots P1, P2 in a captured image. It has been described herein that it is normally desirable to control laser diode 60d to be OFF during frame exposure periods. It is seen that it would be desirable to control diode 60d to be ON during exposure periods in the case that image information corresponding to spots P1 and P2 is utilized in estimating reader-to-target distance. It may be unnecessary to actuate laser diode assembly 60 in short range reading conditions. The method described with reference of FIG. 9c automatically senses a reader-to-target distance and disables assembly 60 if the reader is in short range.

With further reference to the adaptive laser assembly control methods described with reference to FIGS. 9b and 9c, an "enable laser diode assembly instruction (block 944, block 952) can be coupled with a "disable LED illumination" instruction, which is executed by control circuit 140 to disable LEDs of module 10 such as LEDs 18 of 1D module 10-1 and either or both of illumination and aiming LEDs 16, 18 of 2D module 10-2 (FIG. 2e). At long range reading applications light from LEDs may be unnecessary, as explained herein, particularly under high ambient light conditions. It will be seen that "disable laser diode assembly" of block 954, FIG. 9c, can similarly be combined with an "enable LED" instruction.

In a further aspect of the invention, a plurality of imaging modules 10 can be incorporated in reader 5. Various designed for plural imaging module readers and electrical circuits for operating such readers are described in U.S. application Ser. No. 10/161,950 filed Jun. 4, 2002, entitled "Optical Reader Having a Plurality of Imaging Modules," incorporated herein by reference.

Figure 10:
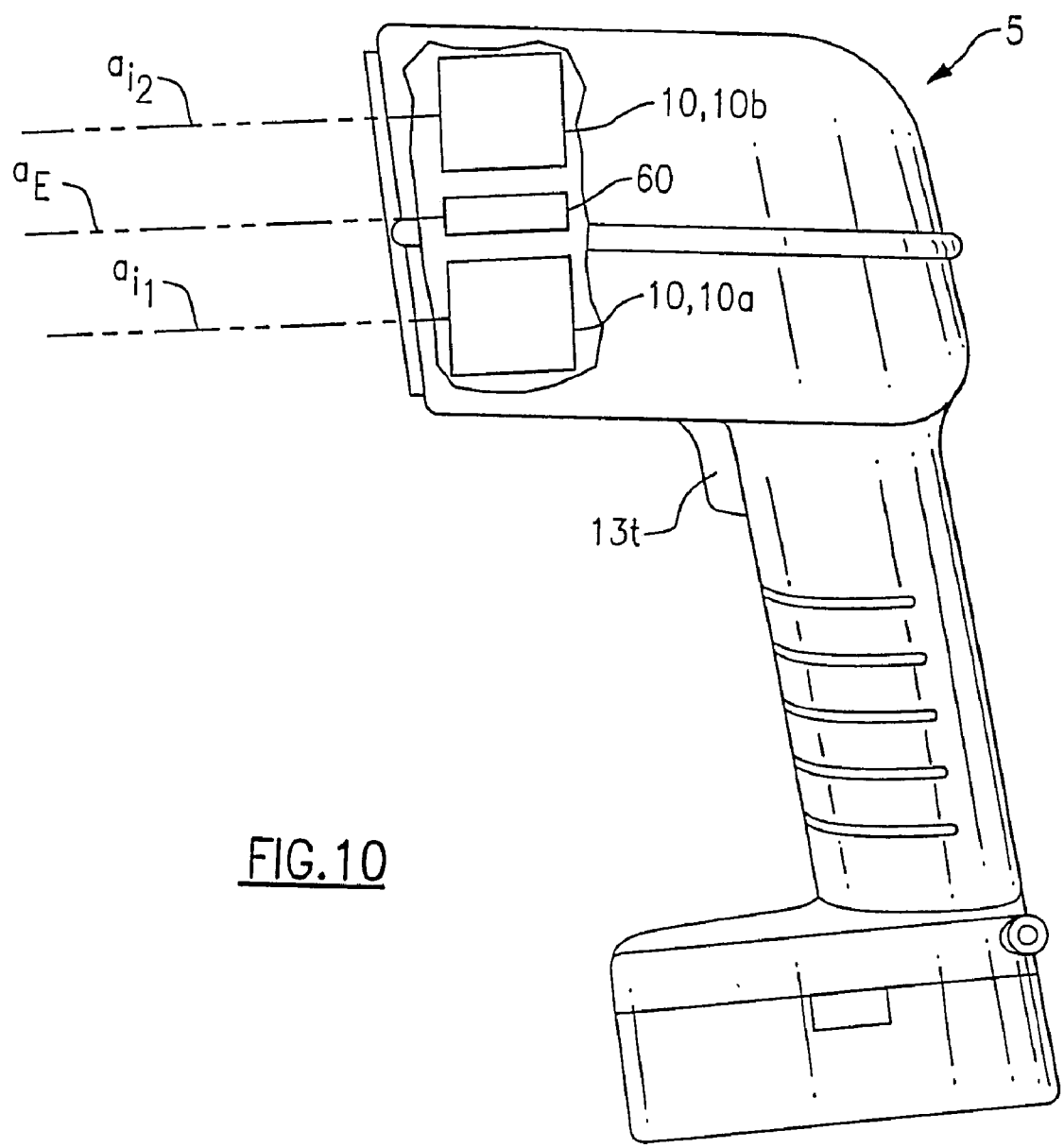
FIG. 10 is a side view of an optical reader according to the invention having a plurality of imager modules.

In the embodiment of FIG. 10 long range reader 5 includes a pair of stacked imaging modules 10a and 10b and a laser diode based targeting system including laser diode assembly 60 which in the specific embodiment shown is not attached to either of module 10a or module 10b. (Assembly 60 can also be mounted to module 10a and/or 10b as described with reference to FIGS. 2a–2e). Lower and first imaging module 10a is adapted for short range reading and is configured to have a best focus receive distance of less than 1 foot. Upper and second imaging module 10b is adapted for long range reading and includes a best focus receive distance of about 5 feet (or alternatively, e.g., 10 feet, 20 feet, and 30 feet). Plural imaging module reader 5 as shown in FIG. 10 may be operated in accordance with the flow diagrams as explained in FIGS. 9b and 9c, with a modification in that all frames of image data captured when laser diode assembly 60 is disabled are captured via an actuation of an image sensor of short range module 10a and all frames captured when assembly 60 is enabled are captured via actuation of an image sensor of long range module 10b.

In one embodiment, both of modules 10a and 10b are 1D modules as described e.g. with reference to FIGS. 2a, 2b, 5a, 5b, 5c, and 5d. In another embodiment, both modules 10a and 10b are 2D imaging modules as described e.g. in relation to FIGS. 2c–2e. In yet another embodiment, one of modules 10a or 10b is a 1D imaging module and another of modules 10a or 10b is a 2D imaging module.

Figure 11:
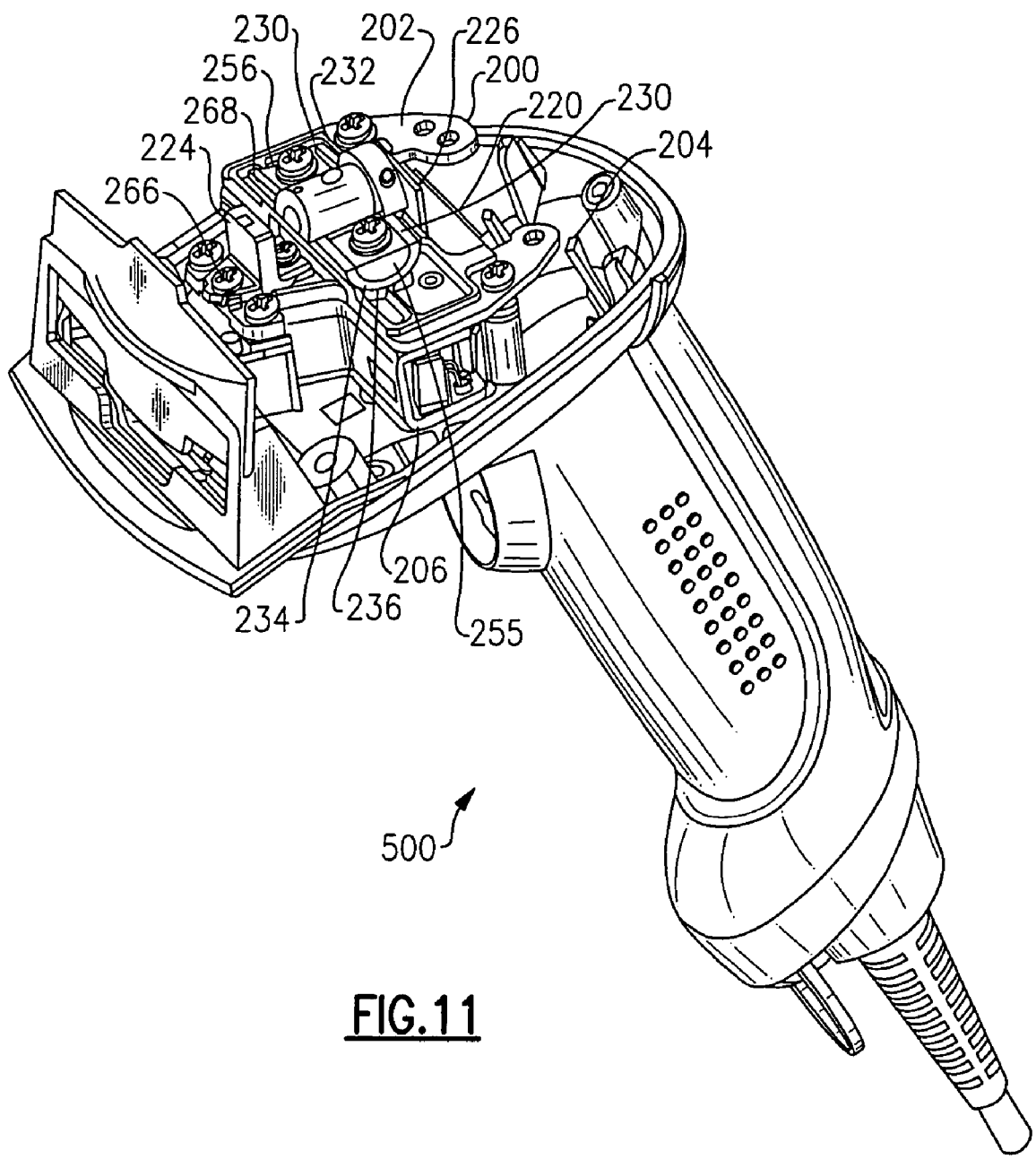
FIG. 11 is a perspective view of an optical reader embodiment of the present invention.
Figure 12:
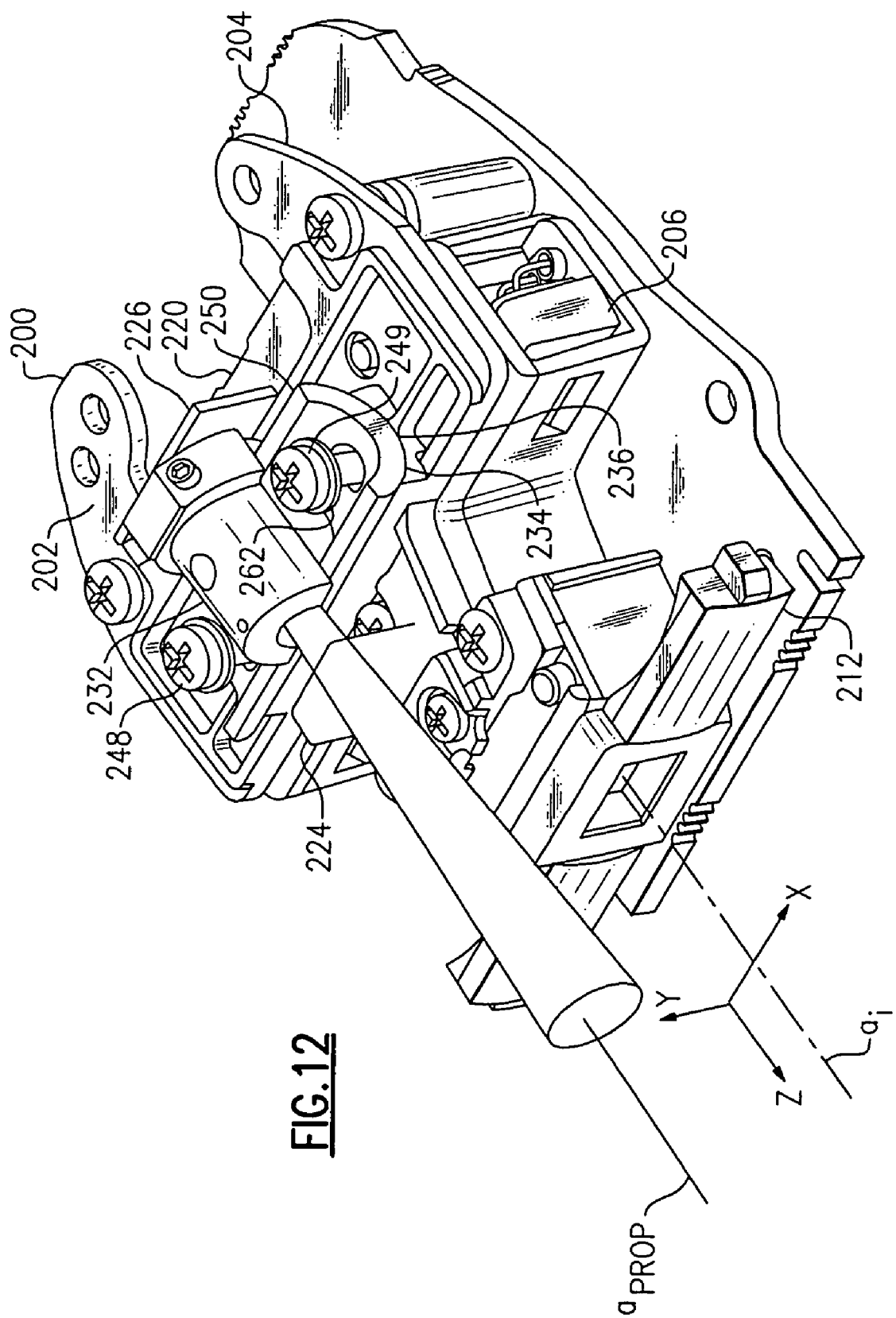
FIG. 12 is an enlarger fragmentary view of the optical reader of FIG. 11.

In another embodiment as shown in FIG. 11 and FIG. 12, the present invention includes an optical reader 500. The optical reader 500 includes a first substrate 200, an illumination assembly 206, an illuminating lens assembly 212, an imaging assembly 220, a targeting lens 224 and a light source 226.

The first substrate 200 includes a first surface 202 and a second surface 204. In one embodiment, the first substrate 200 is a metal plate. The first substrate 200 may be a casting, an investment casting, a machining or a forging. Alternatively, the first substrate may be molded from a plastic material.

The imaging assembly 220 includes an image sensor 32, such as for example as shown in FIGS. 2a–2e.,the image sensor 32 includes a plurality of photodetectors disposed about the axis. Referencing FIG. 2a or 2e, the photodetectors may be arranged to form either a one dimensional (linear) array or in a two-dimensional arrays (although other configurations are possible, today these are usually rectangular arrays). The image sensor 32 includes an imaging axis $a_i$ extending from the center of the array of photodetectors through the center of the lens pupil. The image sensor 32 may be, for example an image sensor chip of a type available from IC Media Corp., of San Jose, Calif., USA.

Figure 3B:
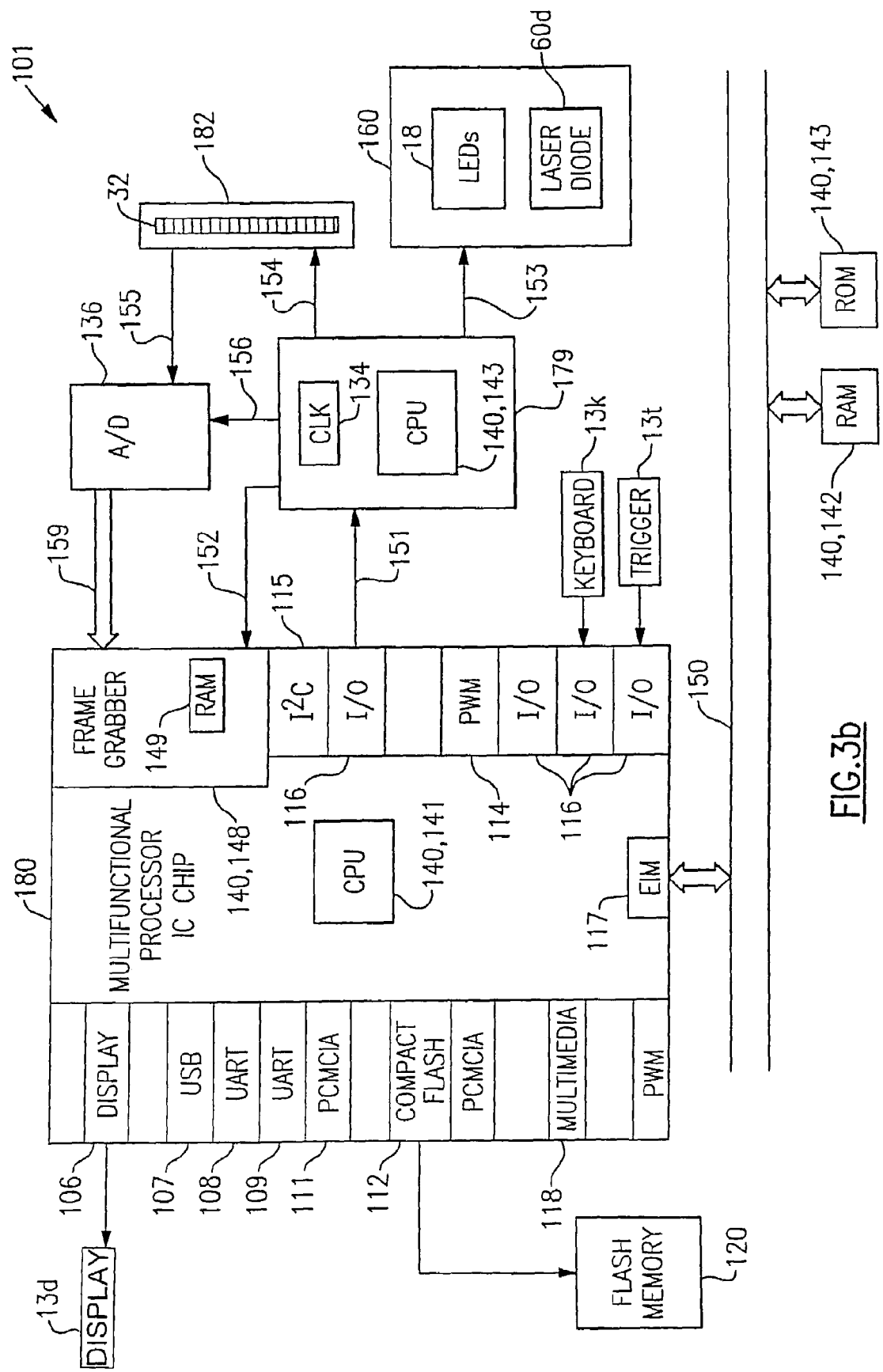

As shown in FIG. 3a and FIG. 3b, the imaging assembly further includes a control circuit 135 for controlling the image sensor 32 and an A/D conversion circuit for converting analog signals received from the image sensor 32 into digital signals.

The illumination assembly 206 is coupled to the second surface and includes at least two light sources, such as, for example LEDs, lasers, lamps or other light emitting devices known to those skilled in the illumination arts.

Figure 13:
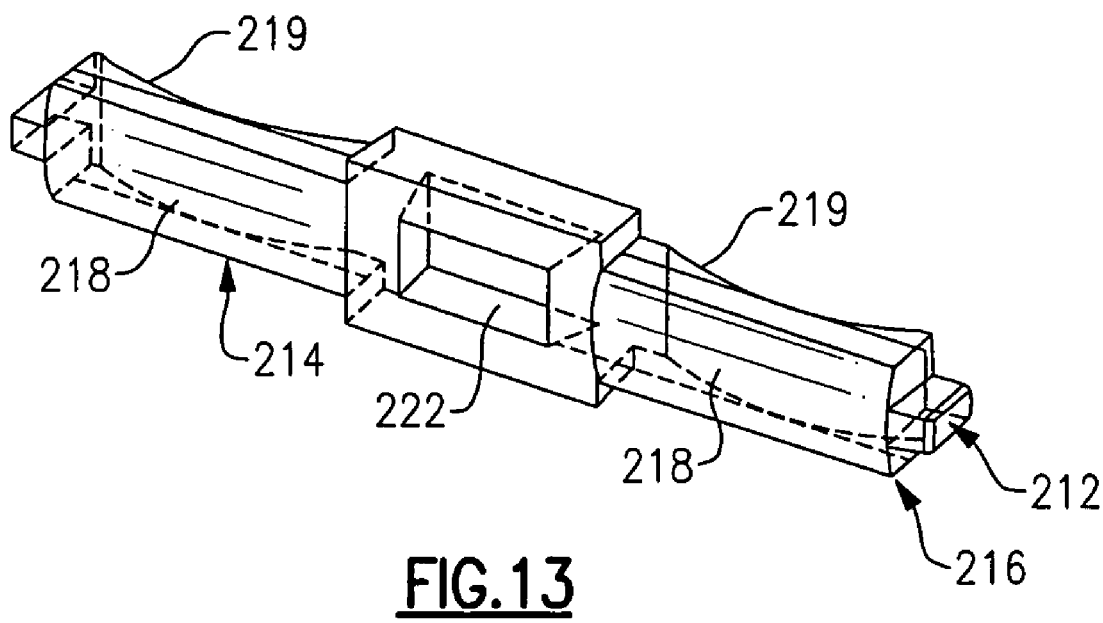
FIG. 13 is a perspective view of the illuminating lens assembly of FIG. 11.
Figure 14:
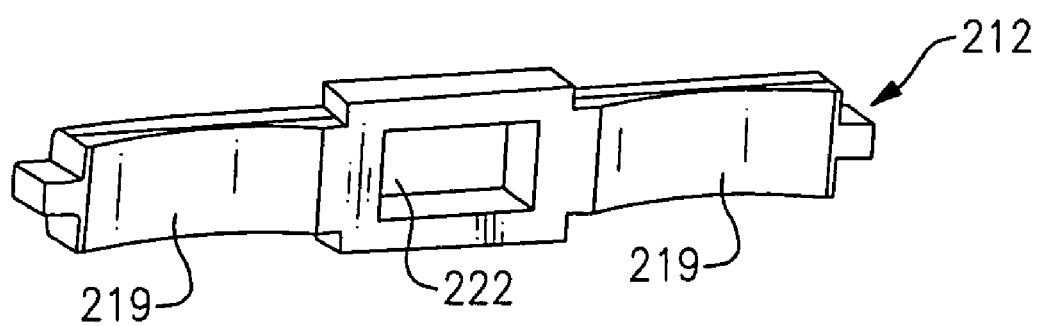
FIG. 14 is a perspective view of the illuminating lens assembly of FIG. 11.

The illuminating lens assembly 212 is coupled to the illumination assembly 206. In one embodiment, the illuminating lens assembly 212 is directly coupled to the illumination assembly 206, alternatively the illuminating lens assembly 212 may be coupled to the first substrate 200 which in turn is coupled to the illumination assembly 206. The illuminating lens assembly 212 is better under stood by referring to FIGS. 6a, 6b, 13 and 14. Turning first to FIG. 13 the illuminating lens assembly 212 includes two lenses 214, 216. Each of the two lenses 214, 216 includes a convex surface 218 and a concave surface 219. The radii of curvature of the convex surface 218 and the concave surface 219 are chosen so the two surfaces work in conjunction to provide a lens having a predetermined optical property, such as, for example expanding the cross sectional geometry of a beam of light along one axis while contracting it along another. Taken together, the convex surface 218 and the concave surface 219 may form an anamorphic lens. Preferably, the radii of curvature of the convex surface 218 and the concave surface 219 are perpendicular to one another, although as will be appreciated by those skilled in the optical arts other orientations of the radii of curvature are possible and may be desirable under certain circumstances. The two lenses 214, 216 may be made of plastic or glass. The two lenses 214, 216 may be made by molding, machining, grinding or any other process suitable for making lenses known to those of ordinary skill in the optical arts. The illuminating lens assembly 212 also includes an aperture 222. The aperture 222 is disposed about the imaging axis $a_i$ and is configured to allow light reflected from the optical target to reach the imaging assembly 225. The illuminating lens assembly 212 may be a single piece or may be an assemblage of discrete components.

Returning to FIG. 11 and FIG. 12 the light source 226 such as, for example a laser diode assembly is coupled to the first surface 202 of the first substrate 200. The light source 226 may also be a light emitting diode, a vertical cavity surface emitting laser (VCSEL), or a gas laser or may include multiple light emitting diodes, laser diodes, VCSELs or gas lasers or a combination thereof. When multiple light sources are used, the emitted beams of light may be combined using beam splitters, or any other technique known to those skilled in the optical arts for combining beams of light. The light source 226 is configured to emit a beam of light propagating along an axis of propagation $a_{prop}$. The beam of light include any portion of the visible electromagnetic spectrum, in particular light from the red, green and blue portions of the electromagnetic spectrum have proven useful. Preferably, the light source 226 is disposed such that the beam of light is emitted parallel to the imaging axis $a_i$ of the imaging assembly.

FIG. 2a, FIG. 2e, FIG. 5a, FIG. 5b, FIG. 5c, FIG. 5d and FIG. 11 illustrate various mechanisms by which the axis of propagation $a_{prop}$ of the beam of light emitted from the light source 61 may be adjusted with respect to the imaging axis $a_i$ of the image sensor 32. Turning first to FIG. 2a, FIG. 2b and FIG. 2e. The light source 61 is shown as having a cylindrical shell coaxial with the axis of propagation $a_{prop}$ of the light source. The cylindrical shell disposed between clips 65. The light source 61 may then be rotated about the longitudinal axis of the cylindrical shell, thereby allowing the orientation of the cross section of the beam of light to be set. For example, if the light source 61 is a laser diode emitting an beam of light having an elliptical cross section, it may be desirable to orient the major axis of the ellipse parallel to the X axis.

Figure 18:
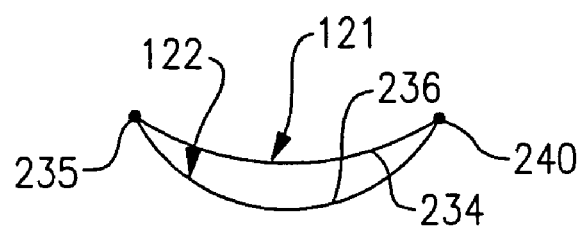
FIG. 18 is an idealized cross-sectional view illustrating one possible fit between the mount and first substrate of FIG. 16.
Figure 20A:
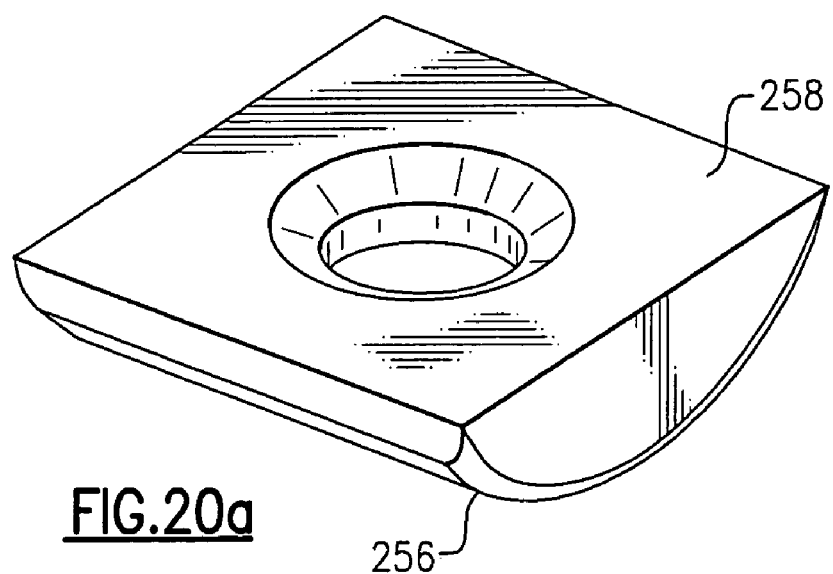
FIG. 20a is a perspective view of the clamping pad of FIG. 11.
Figure 20:
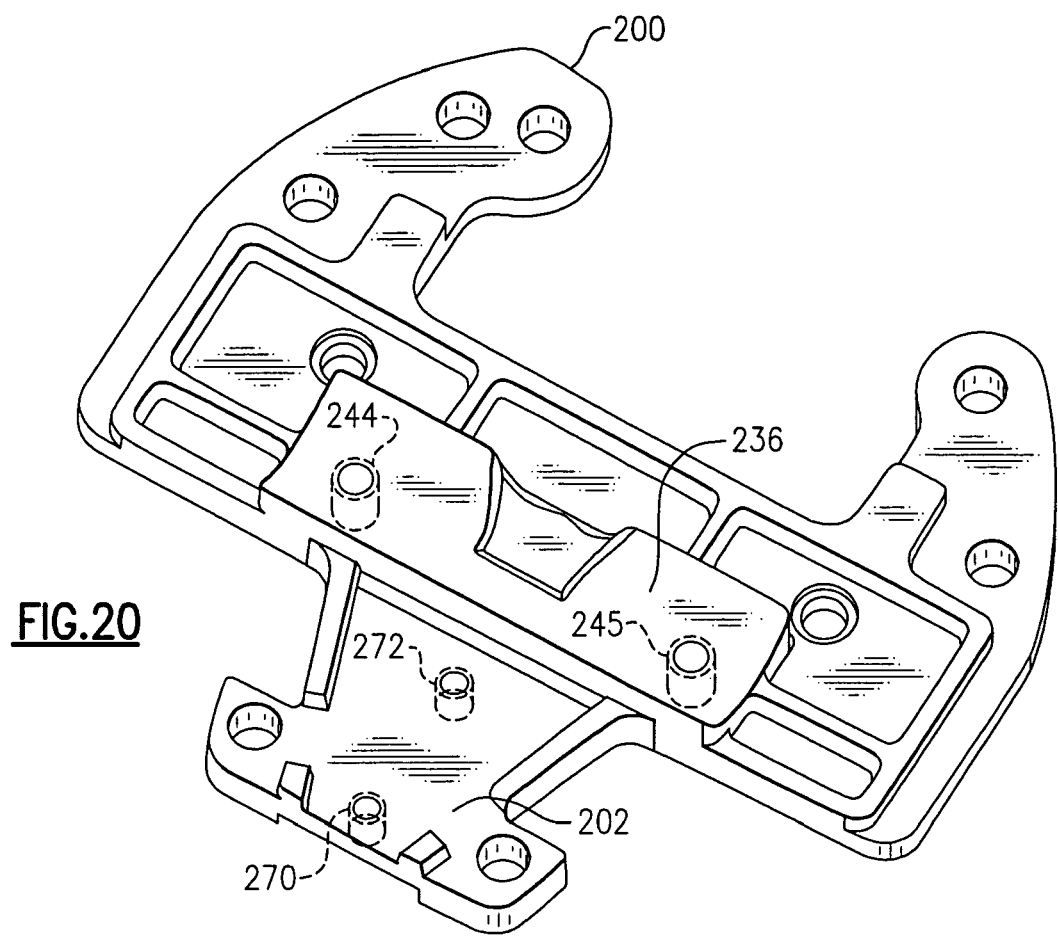
FIG. 20 is a perspective view of one embodiment of the first substrate of FIG. 16.
Figure 21:
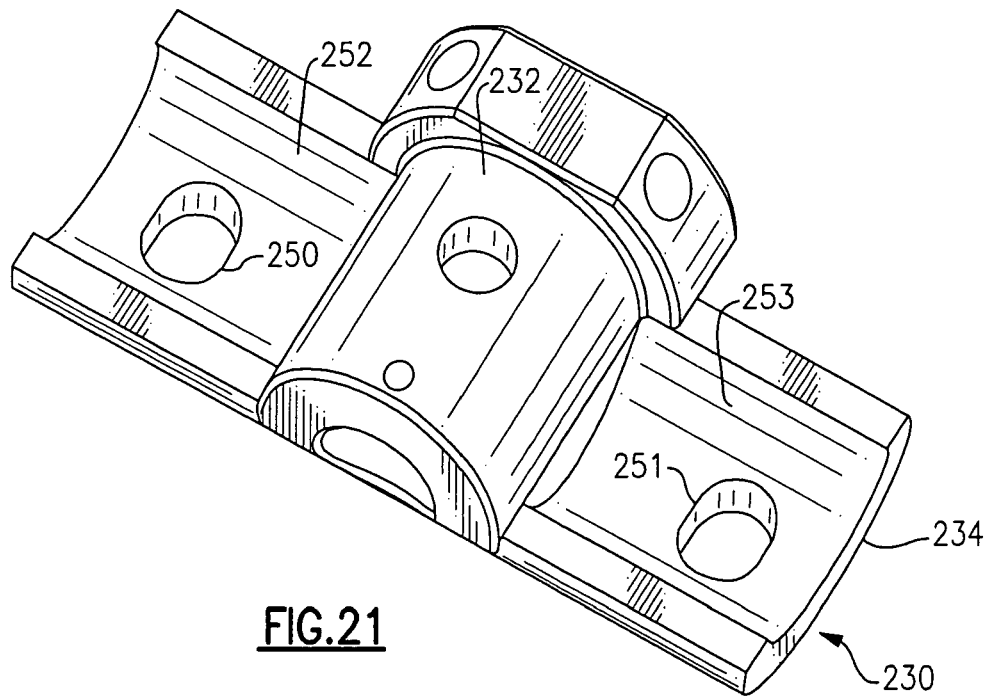
FIG. 21 is a perspective view of one embodiment of the mount of FIG. 16.
Figure 22:
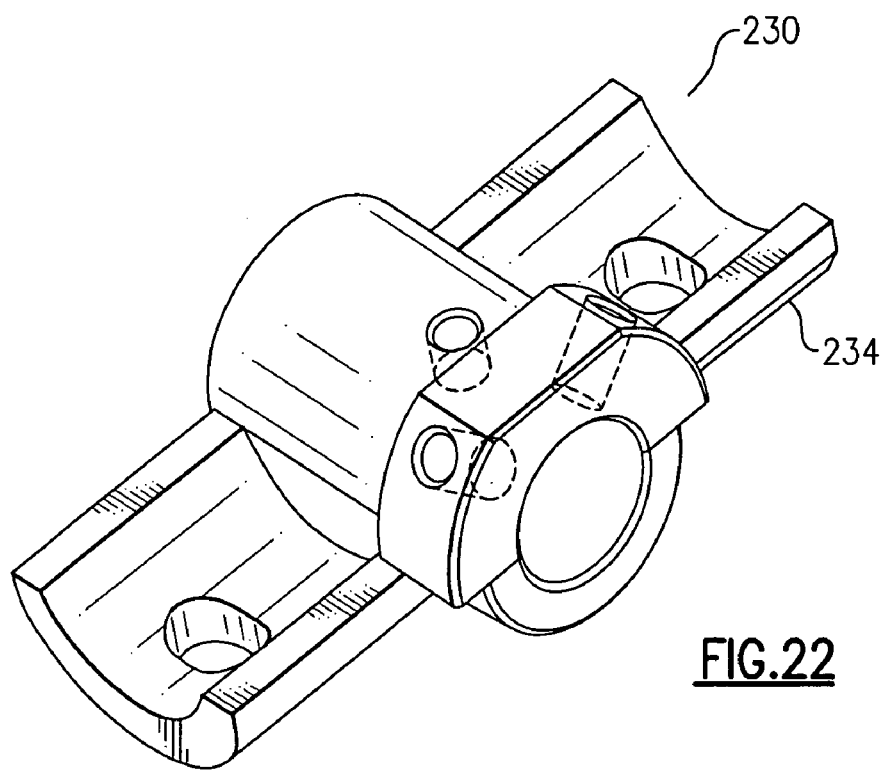
FIG. 22 is a perspective view the mount of FIG. 21 from another vantage point.

Turning to FIG. 11 and FIG. 12 the light source 226 is coupled to a mount 230. The mount, as shown in FIG. 22 and FIG. 22a, includes a housing 232 for receiving the light source 226. The mount also includes a first arcuate surface 234. The first arcuate surface 234 may be a concave or a convex surface. The first arcuate surface 234 has a substantially constant radius of curvature $R_1$. The first arcuate surface 234 is rotationally and slideably engageable with a second arcuate surface 236 of the first substrate 200 as shown in FIG. 20. The second arcuate surface 236 may be a convex or concave surface having a substantially constant radius of curvature $R_2$ is complimentary to the fist radius of curvature $R_1$. As shown in FIG. 11 and FIG. 12, the first arcuate surface 234 is a convex surface and the second arcuate surface 236 is a concave surface. As will be appreciated by those skilled in the mechanical arts, the amount of contact between the first arcuate surface 234 and the second arcuate surface 236 may be controlled by the selection of the radii of curvature of the first and second arcuate surfaces 234, 236. Turning to FIG. 18 for example, the first arcuate surface 234 is a convex surface having a first radius of curvature $R_1$ and the second arcuate surface 236 is a concave surface having a second radius of curvature $R_2$, then if the first radius of curvature $R_1$ is larger than the second radius of curvature $R_2$ by a large enough amount then the first arcuate surface 234 contacts the second arcuate surface 236 along two contact lines 238, 240. Conversely, the first arcuate surface 234 may be a concave surface having a first radius of curvature $R_1$ and the second arcuate surface 236 is a convex surface having a second radius of curvature $R_2$. The second radius of curvature $R_2$ is larger than the first radius of curvature $R_2$ by an amount sufficient to limit the contact between the first arcuate surface 234 and the second arcuate surface 236 to two contact lines 238, 240.

Figure 19:
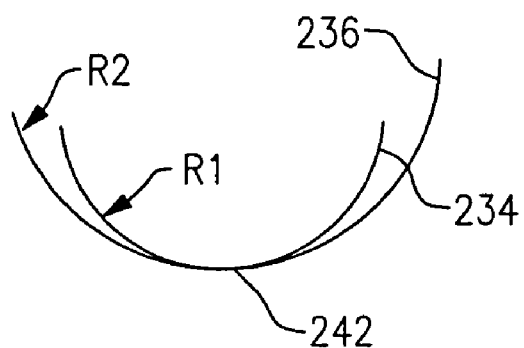
FIG. 19 is an idealized cross-sectional view illustrating one possible fit between the mount and first substrate of FIG. 16.

Turning to FIG. 19, the first arcuate surface 234 is a convex surface having a first radius of curvature $R_1$ and the second arcuate surface 236 is a concave surface having a second radius of curvature $R_2$. The first radius of curvature $R_1$ is smaller than the second radius of curvature $R_2$ by an amount sufficient to limit the contact between the first arcuate surface 234 and the second arcuate surface 236 to a single contact line 242. Conversely, the first arcuate surface 234 may be a concave surface having a first radius of curvature $R_1$ and the second arcuate surface 236 is a convex surface having a second radius of curvature $R_2$. The first radius of curvature $R_1$ is larger than the second radius of curvature $R_2$ by an amount sufficient to limit the contact between the first arcuate surface 234 and the second arcuate surface 236 to a single contact line 242.

In an alternative embodiment, the first arcuate surface 234 is a convex surface having a first radius of curvature $R_1$ and the second arcuate surface 236 is a concave surface having a second radius of curvature $R_2$. The first radius of curvature $R_1$ is slightly smaller than the second radius of curvature $R_2$, allowing the first arcuate surface 234 and the second arcuate surface 236 to be in contact with one another over substantially the entire portion of the first and second arcuate surfaces 234, 236 engaged with one another.

The mount 230 may be coupled to the first substrate 200 by any of a multiplicity of ways, such, for example including welding, soldering, adhesive bonding, magnetic forces, frictional forces and threaded fasteners.

As shown in FIG. 20, the second arcuate surface 236 includes a threaded holes 244, 245 for receiving the threaded portion 246 of a threaded fastener 248, 249, such as, for example a screw or a bolt. As shown in FIG. 22, the first arcuate surface 234 includes two openings 250, 251. The openings 250, 251 are configured to the threaded fasteners 248, 249 to pass through and allow a predetermined amount of relative rotational movement between the mount 230 and the second arcuate surface 236 before sufficient clamping pressure is applied by the threaded fasteners 248, 249 so as to prevent relative motion between the mount 230 and the second arcuate surface 236. The openings 250, 251 may also be sized to allow relative lateral movement between the mount 230 and the second arcuate surface 236.

The mount 230 further includes a third arcuate surface 252 and a fourth arcuate surface 253. The third arcuate surface 252 and the fourth arcuate surface 253 are concentric with the first arcuate surface 234. Returning to FIG. 11, the optical reader further includes two clamping pads 254, 255. As shown in FIG. 20a, each of the clamping pads 254, 255 includes a planar surface 258 and an arcuate surface 256 engageable with the mount 230. Returning to FIG. 11, the planar surface 258 is engageable with the heads 260 of the threaded fasteners 248, 249. The threaded fasteners 248, 249 engage the threaded holes 244, 245 and the heads 260 of the threaded fastener 248, 249 engage the planar surface 258 of the clamping pads 254. In an alternative embodiment, a washer 262, such as, for example a lock washer or a flat washer is disposed between the heads 260 of the threaded fasteners 248, 249 and the planar surface 258. As the threaded fasteners 248, 249 move farther into the threaded holes 244, 245 the heads 260 of the threaded fasteners 248, 249 contact the planar surfaces 258, as slop is taken out of the assemblage, the threaded fastener 248 exerts a axial force on the clamping pad 254, thereby fixing the relative positions of the clamping pad 254, the mount 230 and the second arcuate surface 236 with respect to one another.

In an alternative embodiment, as shown in FIG. 12 the clamping pads 254 may be omitted and the heads 260 of the threaded fasteners 248, 249 may bear directly on a surface 248 of the mount 230 thereby fixing the position of the mount 230 relative to the first substrate 200.

Figure 23:
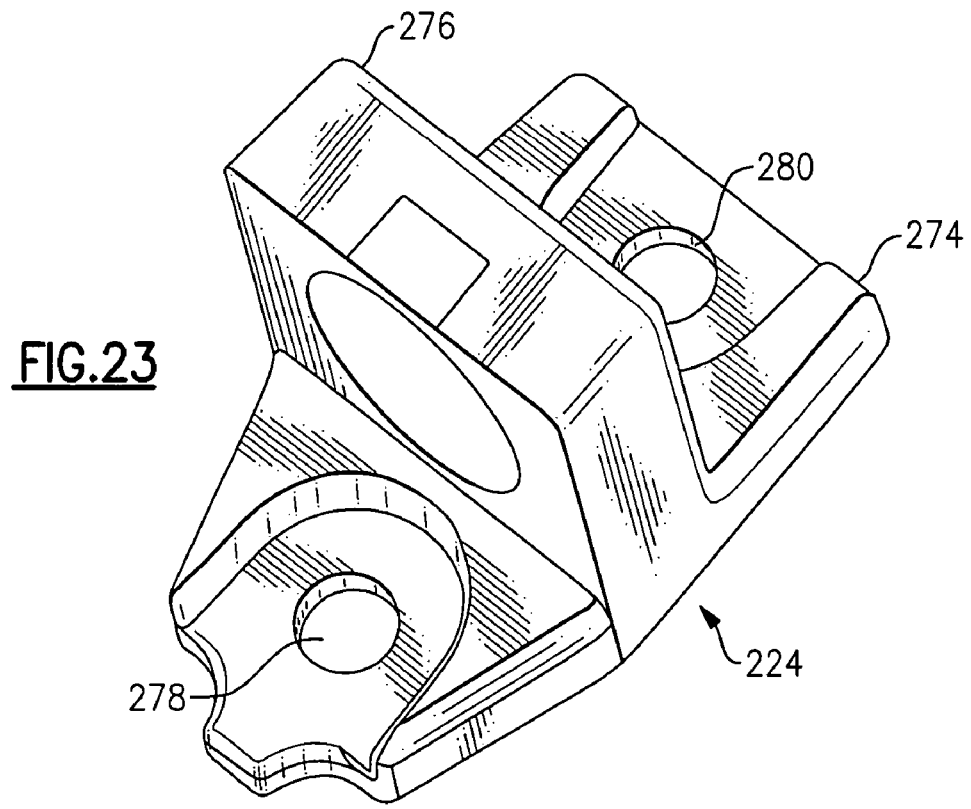
FIG. 23 is a perspective view of the targeting lens of FIG. 11.

Returning to FIG. 11, the a targeting lens 224 is coupled to the first surface 202 of the substrate 200. In the embodiment shown in FIG. 11, the targeting lens 224 is coupled to the first substrate by two threaded members 266, 268, such as, for example two screws. Turning to FIG. 20, the first surface 202 of the first substrate 200 includes two threaded holes 270, 272 for engagement with the two threaded members 266, 268. Turning to FIG. 23, the targeting lens 224 includes a base 274 and a lens element 276 extending from the base 274. The targeting lens 224 may be a molded piece as shown or may be assembled from a variety of components.

The base 274 of the targeting lens 224 includes two holes 278, 280 for receiving the two threaded members 266, 268. The threaded members 266, 268 pass through the two holes 278, 280 and engage two threaded holes 270, 272 in the first substrate 200. The two threaded members 266, 268 are then tightened thereby securing the targeting lens 224 to the first substrate 200.

In an alternative embodiment, the targeting lens 244 is coupled to the first substrate 200 by a single threaded member.

In an other alternative embodiment, the targeting lens 224 is coupled to the first substrate 200 by adhesive bonding.

In an other alternative embodiment, the targeting lens 224 is coupled to the first substrate 200 by welding.

The targeting lens 224 may be either a positive, a negative lens, a diffractive optical element or an anamorphic lens. If the targeting lens 224 is a positive lens, the targeting lens 224 may be a biconvex lens, a planoconvex lens or a converging concavoconvex lens. If the targeting lens 224 is a negative lens, the targeting lens 224 may be a planoconcave lens, a biconcave lens or a diverging concavoconvex lens. In the instance when the image sensor 32 is a one-dimensional array of photodetectors, the targeting lens 224 is configured to expand the cross section of the beam of light along the X-axis.

The targeting lens 224 is disposed to receive the beam of light emitted from the light source 226 and is configured to expand the beam of light in a direction perpendicular to the axis of propagation $a_{prop}$. For example, the beam of light may be expanded parallel to the X-axis or parallel to the Y-axis. Laser beams emitted by laser diodes are elliptical in cross section. In one embodiment, the light source is a laser diode and the beam of light is a laser beam, the laser diode is oriented so that the major axis of the ellipse is parallel to the X axis. In another embodiment, the laser diode is oriented so that the major axis of the ellipse is parallel to the Y axis.

In an alternative embodiment, the light source is disposed so that axis of propagation $a_{prop}$ of the beam of light crosses the imaging axis $a_i$ of the image sensor 32 about eight (8) feet from the face of the image sensor 32.

In an alternate embodiment, the optical reader 5 of the present invention includes a user interface. In one embodiment, the user interface is a touch screen pad. In an other embodiment, the user interface is a key pad.

Figure 15:
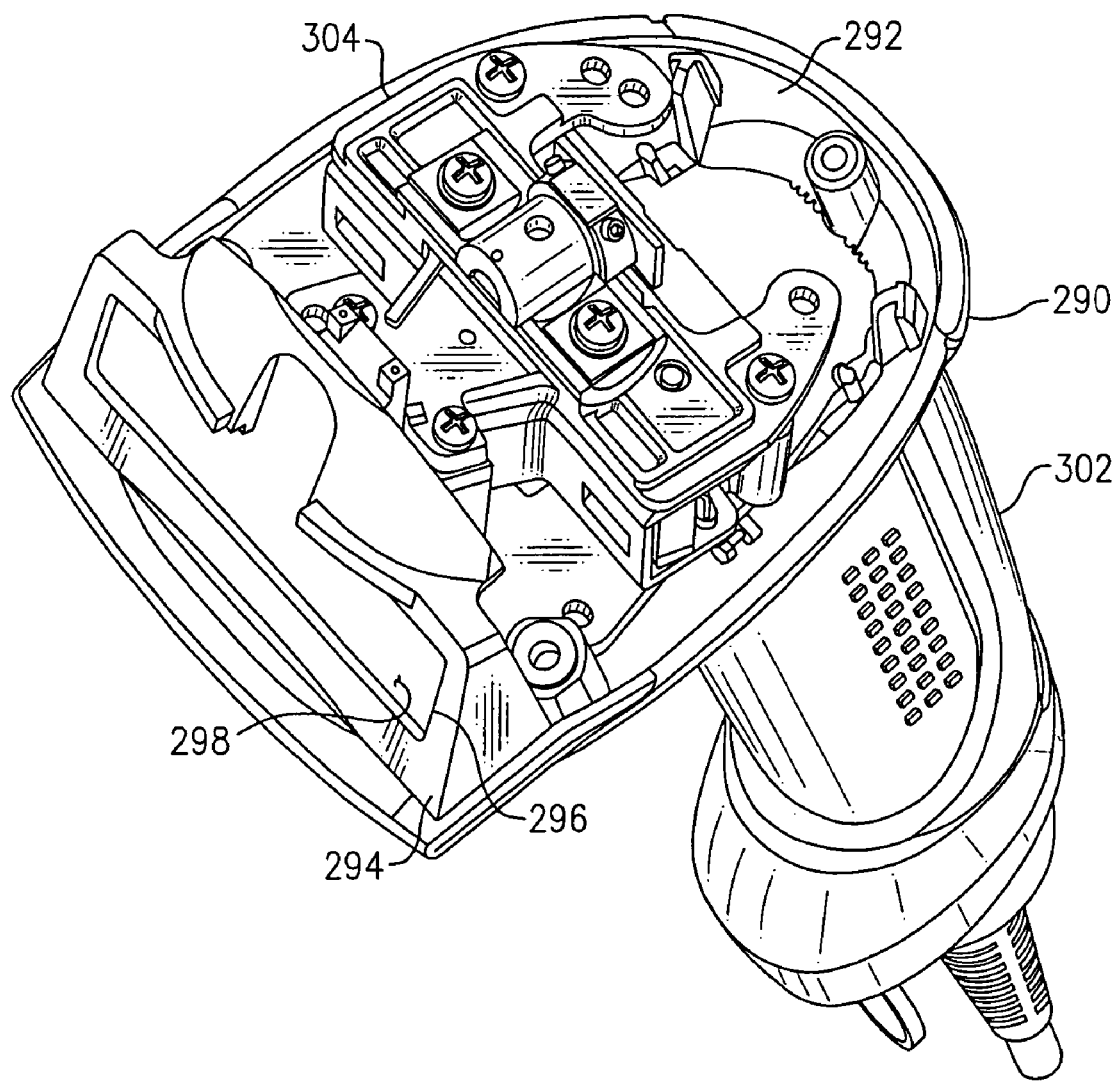
FIG. 15 is a perspective view of a data collection device embodiment of the present invention.
Figure 16:
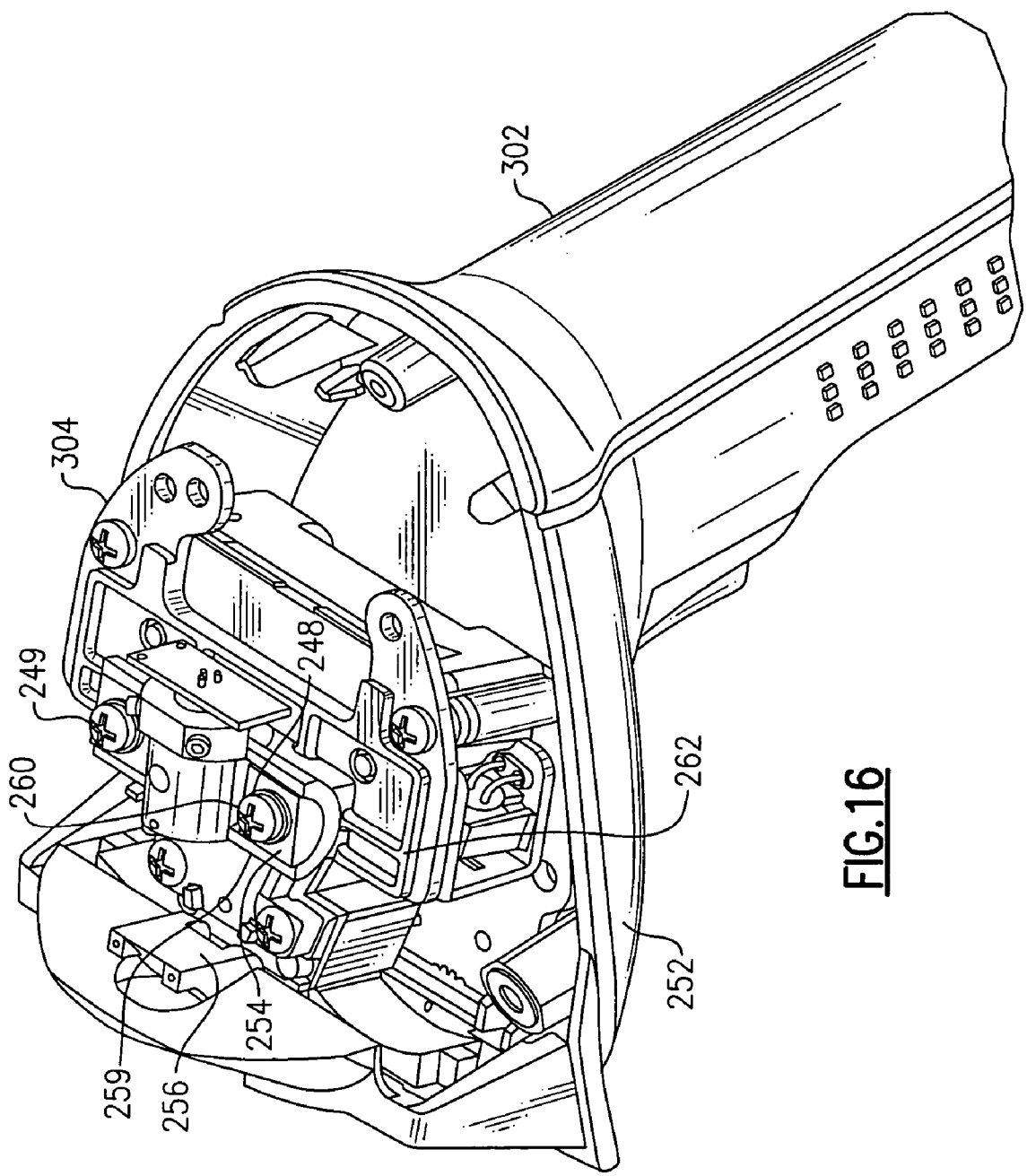
FIG. 16 is an enlarged fragmentary view of the data collection device of FIG. 15.

In an alternate embodiment of the invention, as embodied herein and as shown in FIG. 15, the present invention includes a data collection device 300. The data collection device includes a housing 302 and an optical reader 304.

The housing 302 is a durable plastic body having a lower portion 290 and a cover (not shown). The lower portion 290 and the cover define a cavity 292 for receiving the optical reader 304. The housing 302 also includes a frontal portion 294 that defines an opening 296. The frontal portion 294 may be a separate component, for example a molded urethane component engageable with the cover and lower portion 290 of the housing 302. In one embodiment, the frontal portion 294 includes registration members for engagement with corresponding recess in the cover and lower portion 290, furthermore the frontal portion is clamped in place by the cover and lower portion 290. The opening 296 is sealed by a cover 298 made from a material having high transmissivity for the wavelengths of interest, such as, for example a translucent plastic material. The housing 302 may be made, for example by a double shot molding process.

The optical reader 304 may be better understood by reference to FIG. 17. The optical reader 304 includes a substrate 200, a first light source 226, an illumination assembly 310, an imaging assembly 312, and a illuminating lens assembly 314.

The imaging assembly 312 includes an image sensor 32. The image sensor 32 includes a plurality of photodetectors arranged to form either a one dimensional (linear) array or in a two-dimensional array (although other configurations are possible, today these are usually rectangular arrays). The image sensor 32 includes an imaging axis $a_i$ lying in the X-Y plane and extending perpendicularly from the center of the array of photodetectors. The image sensor 32 may be, for example an image sensor chip of a type available from IC Media Corp., of San Jose, Calif., USA.

The imaging assembly further includes control circuit 135 for controlling the image sensor 32 and an A/D conversion circuit for converting analog signals received from the image sensor 32 into digital signals.

The illumination assembly 310 includes two light sources 318, 320 each of which emits a beam of light. The light sources may be, for example light emitting diodes, laser diodes, VCSELs, or gas lasers. The beams of light emitted by the light sources 318, 320 may include any portion of the electromagnetic spectrum. The beams of light may be white light. Preferably, the beams of light contain light occupying a discrete portion of the visible spectrum, such as, for example blue, green or red light. In one embodiment, the light sources 318, 320 are located on opposite sides of the image sensor 316 such that the axes of propagation $a_{p1}$, $a_{p2}$ of the beams of light lie in the same X-Z plane as the imaging axis $a_i$. In an alternative embodiment, the light sources 318, 320 are located on opposite sides of the image sensor 316 such that the axes of propagation $a_{p1}$, $a_{p2}$ of the beams of light 322, 324 are parallel to the X-Z plane containing the imaging axis $a_i$. The light sources 318, 320 provide illumination for illuminating the optical target. The light sources 318, 320 also provide the short range aiming pattern $P_s$.

In an alternative embodiment, the light sources 318, 320 are mounted above the image sensor 316 and such that the axes of propagation $a_{p1}$, $a_{p2}$ of the beams of light 322, 324 are parallel to the X-Z plane containing the imaging axis $a_i$.

In an alternative embodiment, the light sources 318, 320 are mounted below the image sensor 316 and such that the axes of propagation $a_{p1}$, $a_{p2}$ of the beams of light 322, 324 are parallel to the X-Z plane containing the imaging axis $a_i$.

In an alternative embodiment, the light sources 318, 320 are mounted above the image sensor 316 and such that the axes of propagation $a_{p1}$, $a_{p2}$ of the beams of light 322, 324 are inclined with respect to the X-Z plane containing the imaging axis $a_i$.

In an alternative embodiment, the light sources 318, 320 are mounted below the image sensor 316 and such that the axes of propagation $a_{p1}$, $a_{p2}$ of the beams of light 322, 324 are inclined with respect to the X-Z plane containing the imaging axis $a_i$.

In an alternative embodiment, the light sources 318, 320 are replaced by a single light source.

The illuminating lens assembly 314 includes two lenses 214, 216, an opening 222 and a long range aiming pattern optical system 390 for projecting a long range aiming pattern P onto a target T.

The two lenses 214, 216 are configured to modify the cross sectional shape of beams of light incident thereon, such as, for example by diffusing the beams of light emitted by the light sources of the illumination assembly 310 so as to form a single beam of light having a roughly rectangular cross section thereby providing a short range aiming pattern $P_s$ and illuminating the target T. The opening 222 is sized to correspond to the field of view of the image sensor 32. The illuminating lens assembly 314 is coupled to the illumination assembly 310. In one embodiment, the illuminating lens assembly 314 is directly coupled to the illumination assembly 310, alternatively the illuminating lens assembly 314 may be coupled to the first substrate 200 which in turn is coupled to the illumination assembly 310.

The long range aiming pattern P may be, for example be a single dot, a plurality of dots, a line, a plurality of lines or a combination of lines an dots. The long range aiming pattern P may also be an image, such as, for example the image illustrated in FIG. 24 resulting from directing a beam of light through a diffractive optical element.

Various long range aiming patterns P and the means by which they may be achieved are described above with reference to FIGS. 7a–7h and are applicable to the instant and alternative embodiments of the present invention.

In one embodiment, such as, for example, the embodiment illustrated in FIG. 7b, the long range aiming pattern P includes a pair of aiming spots, $P_1$ and $P_2$, projected on a line parallel with a horizontal centerline 400 of the field of view of the image sensor 32 aid in the rotational alignment of the image sensor 32 with respect to the target T.

In an alternative embodiment, as shown in FIG. 25 the long range aiming pattern P include two dots $P_1$, $P_2$. One dot $P_1$ is generated by providing a beam of light propagating along a first axis of propagation $a_{prop1}$ angled with respect to the imaging axis $a_i$ of the image sensor 32 such that the first axis of propagation $a_{prop1}$ intersects the imaging axis $a_i$ of the image sensor 32. The second dot $P_2$ is generated by providing a beam of light propagating along a first axis of propagation $a_{prop2}$ angled with respect to the imaging axis $a_i$ of the image sensor 32 such that the second axis of propagation $a_{prop2}$ intersects the first axis of propagation $a_{prop1}$ and the imaging axis $a_i$ of the image sensor 32. The origins of the two beams of light are disposed on opposite sides of the image sensor 32. The two axes of propagation $a_{prop1}$, $a_{prop2}$ are configured so that the two dots $P_1$, $P_2$ provide a visible indication of the extent and orientation of the field of view of the image sensor 32 at long range image reading distances, i.e., distances greater than about five feet. For example, the two axes $a_{prop1}$, $a_{prop2}$ of propagation may lie in a plane that is substantially perpendicular to the horizontal centerline 400 of the field of view of the image sensor 32. Although FIG. 25 illustrates the two axes of propagation $a_{prop1}$, $a_{prop2}$ intersecting the imaging axis $a_i$ of the image sensor 32 at the same location it will be appreciated that the two axes of propagation $a_{prop1}$, $a_{prop2}$ may intersect the imaging axis $a_i$ at different locations.

In an alternative embodiment, as shown in FIG. 26, the long range aiming pattern P include two dots $P_1$, $P_2$. As will be appreciated by those skilled in the optical arts, however, the long range aiming pattern P may include three or more dots indicating the extent and orientation of the field of view of the image sensor 32. The two dots $P_1$, $P_2$ are generated by two beams of light propagating along two axes of propagation $a_{prop1}$, $a_{prop2}$ parallel to the imaging axis $a_i$ of the image sensor 32.

Figure 27:
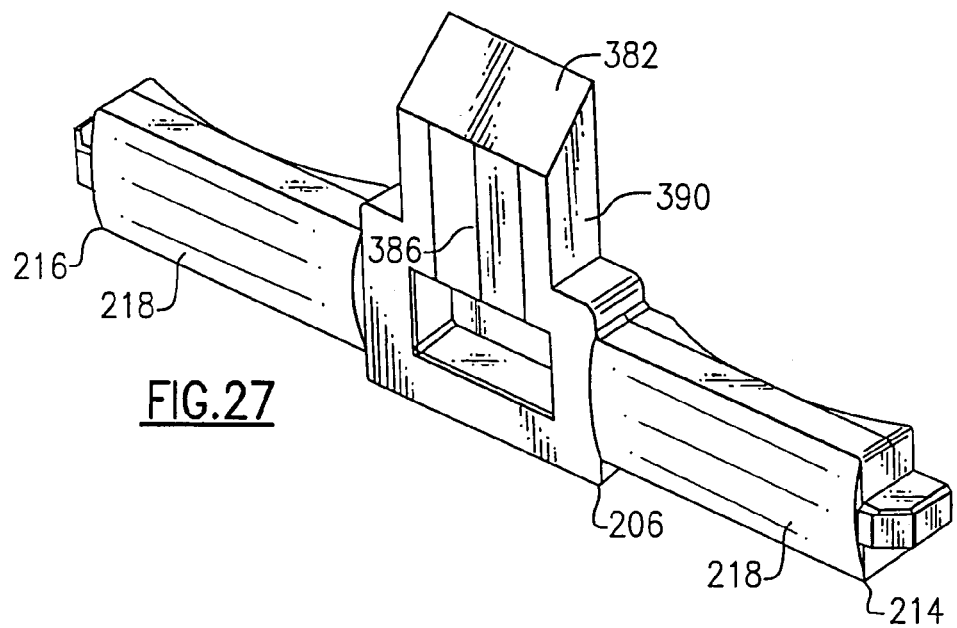
FIG. 27 is a perspective view of the illuminating lens assembly of FIG. 17 as viewed from the front.
Figure 28:
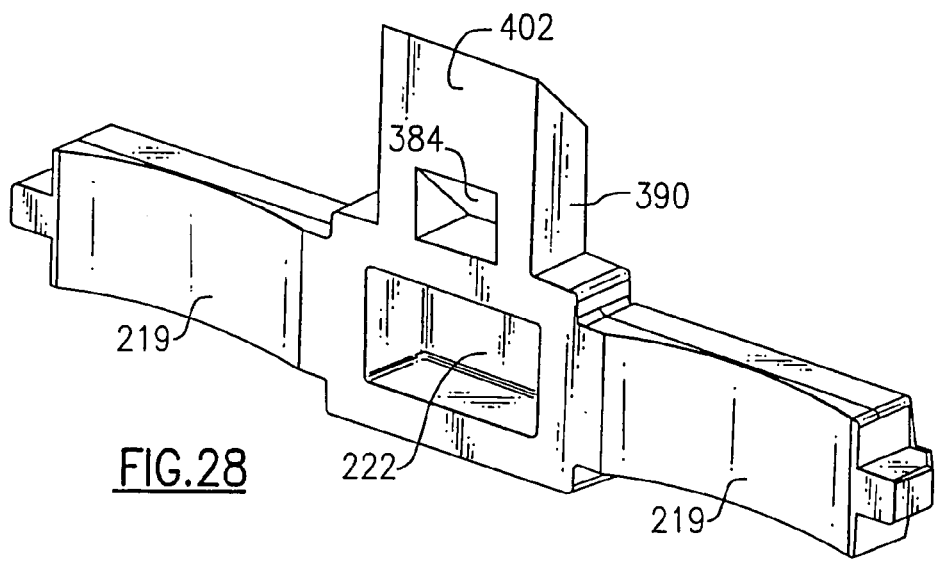
FIG. 28 is a perspective view of the illuminating lens assembly of FIG. 27 as viewed from the rear.

Turning to FIG. 27 and FIG. 28 the illuminating lens assembly 314 will be described in greater detail. Each of the two lenses 214, 216 includes a convex surface 218 and a concave surface 219. The radii of curvature of the convex surface 218 and the concave surface 219 are chosen so the two surfaces work in conjunction to provide a lens having a predetermined optical property, such as, for example expanding the cross sectional geometry of a beam of light along one axis while contracting it along another. Taken together, the convex surface 218 and the concave surface 219 may form an anamorphic lens. Preferably, the radii of curvature of the convex surface 218 and the concave surface 219 are perpendicular to one another, although as will be appreciated by those skilled in the optical arts other orientations of the radii of curvature are possible and may be desirable under certain circumstances. The two lenses 214, 216 may be made of plastic or glass. The two lenses 214, 216 may be made by molding, machining, grinding or any other process suitable for making lenses known to those of ordinary skill in the optical arts. The illuminating lens assembly 212 also includes an opening 222. The opening 222 is disposed about the imaging axis $a_i$ and is configured to allow light reflected from the optical target to reach the image sensor 32.

Figure 29A:
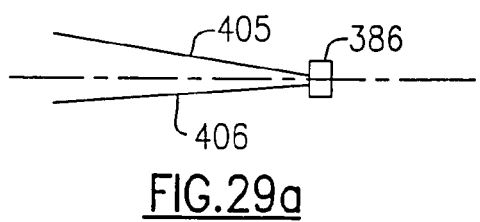
FIG. 29a is a ray diagram illustrating the operation of a multiple beam generator as part of the long rang aiming pattern optical system of FIG. 28.

The long rang aiming pattern optical system 390 for generating the long range aiming pattern P includes a first reflective surface 382 and a second reflective surface 384. The long rang aiming pattern optical system 390 further includes a multiple beam generator 386. The multiple beam generator 386 may be, for example a shallow prism. The beam of light emitted from the light source 226 is preferably, a collimated beam of light. As shown in FIG. 29a, the multiple beam generator 386 divides the beam of light into two diverging beams of light 405, 406. preferably, the two diverging beams of light 405, 406 have substantially circular cross-sections. The two diverging beams of light 405, 406 diverge from one another so as to provide an indication of the orientation and field of view of the image sensor 32 with respect to a target optical indicia T. The long range aiming pattern optical system 390 is configured such that the two diverging beams of light 405, 406 are parallel to the imaging axis $a_i$ of the image sensor 32. In an alternative embodiment, the long range aiming pattern optical system 390 is configured such that the two diverging beams of light 405, 406 are inclined with respect to the imaging axis $a_i$ of the image sensor 32 such that the axes of propagation of the two diverging beams of light 405, 406 intersect the X-Z plane containing the imaging axis $a_i$ of the image sensor 32 at some predetermined distance.

In another embodiment, the multiple beam generator 386 splits the beam of light emitted from the light source 226 into more than two diverging beams, such as, for example three or four diverging beams of light. The long range aiming pattern optical system 390 may then be adapted to provide a linear, triangular or rectangular or any other shape long range aiming pattern P that provides a visual indication as to the orientation and field of view of the image sensor 32. Four example, the multiple beam generator 386 may be a four sided pyramid and the aimed at the apex whereby the beam of light is split into four beams. As will be appreciated by those skilled in the optical arts, the four sided pyramid may be replaced by a polyhedron to generated any desired number of beams.

In an alternative embodiment, the multiple beam generator 386 is replaced by a negative lens, such as for example a planoconcave lens that laterally diffuses the beam of light.

Figure 31:
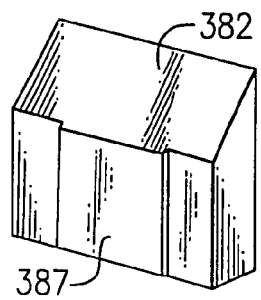
FIG. 31 is a perspective view of the long range aiming pattern optical system of FIG. 30.
Figure 30:
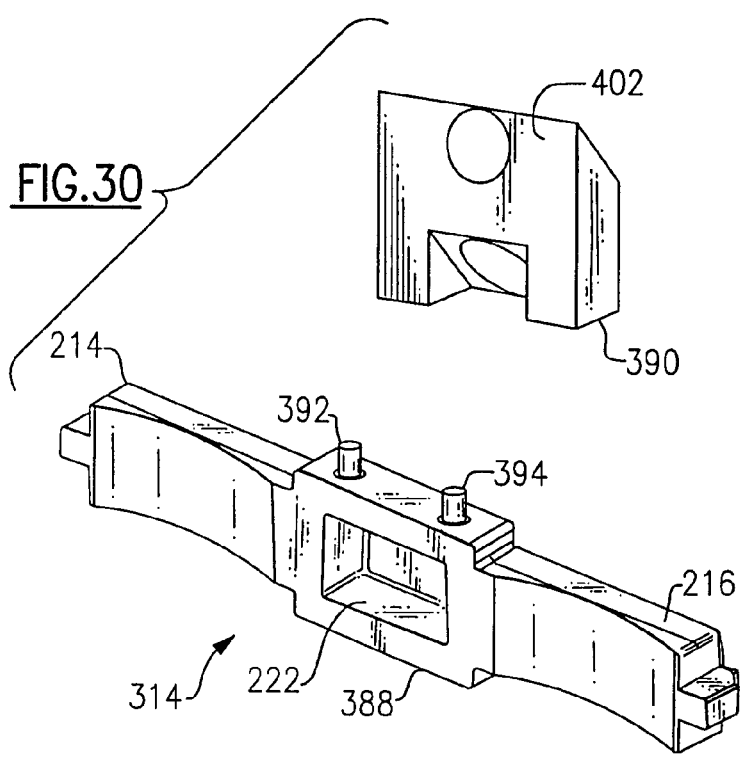
FIG. 30 is a perspective view of an alternative embodiment of the illuminating lens assembly of FIG. 27.
Figure 32:
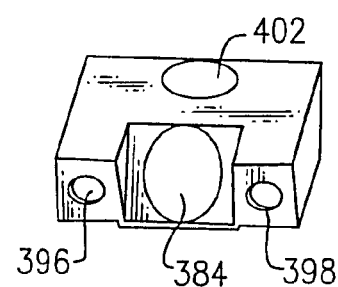
FIG. 32 is a is an alternate perspective view of the long range aiming pattern optical system of FIG. 31.

The illuminating lens assembly 314 may be a single piece or may be an assemblage of discrete components. An example of an illuminating lens assembly 314 that is an assemblage of discrete components is illustrated in FIG. 30. The illuminating lens assembly 314 includes a diffuser 388 and a long range aiming pattern optical system 390. The diffuser 388 includes two lenses 214, 216 and an opening 222. Each of the two lenses 214, 216 includes a convex surface 218 and a concave surface 219. The radii of curvature of the convex surface 218 and the concave surface 219 are chosen so the two surfaces work in conjunction to provide a lens having a predetermined optical property, such as, for example expanding the cross sectional geometry of a beam of light along one axis while contracting it along another. Taken together, the convex surface 218 and the concave surface 219 may form an anamorphic lens. Preferably, the radii of curvature of the convex surface 218 and the concave surface 219 are perpendicular to one another, although as will be appreciated by those skilled in the optical arts other orientations of the radii of curvature are possible and may be desirable under certain circumstances. The two lenses 214, 216 may be made of plastic or glass. The two lenses 214, 216 may be made by molding, machining, grinding or any other process suitable for making lenses known to those of ordinary skill in the optical arts. The illuminating lens assembly 212 also includes an opening 222. The opening 222 is disposed about the imaging axis $a_i$ and is configured to allow light reflected from the optical target to reach the image sensor 32. The diffuser further includes two alignment pins 392, 394. Turning to FIG. 31 and FIG. 32 the long range aiming pattern optical system 390 includes a first reflecting surface 382, a second reflecting surface 384, a lens element 387 and two alignment pin receiving holes 396, 398. The two alignment pin receiving holes 396, 398 are configured to engage the two alignment pins 392, 394 of the diffuser 388. The diffuser 388 is coupled to the long range aiming pattern optical system 390. The diffuser 388 may be coupled to the long range aiming pattern optical system 390 for example by adhesive bonding or ultrasonic welding.

Figure 29:
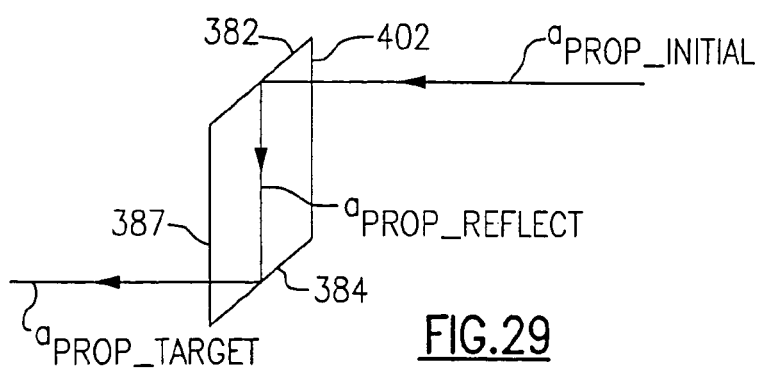
FIG. 29 is a ray diagram illustrating the propagation of a beam of light through the long range aiming pattern optical system of FIG. 28.

Turning to FIG. 29 the operation of the long range aiming pattern optical system 390 will be described. A beam of light propagating along an initial axis of propagation $a_{prop\_init}$ is emitted from the light source 226 and is directed onto a first surface 402 of the long range aiming pattern optical system 390. The light source 226 is oriented such that the initial axis of propagation $a_{prop\_init}$ of the beam of light emitted by the light source 226 forms an angle with the first surface 402 such that at least a portion, and preferably a majority, of the beam of light enters into the material of the long range aiming pattern optical system 390. Preferably, the initial axis of propagation $a_{prop\_ini}$ is substantially normal to the first surface 402. The first surface 402 is adapted to receive the beam of light so as to reduce scatter of the beam of light. Additionally, the optical surface 402 may have an antireflective coating applied. The beam of light propagates within the long range aiming pattern optical system 390 until it is reflected by the first reflecting surface 382. The first reflecting surface 382 is disposed such that the beam of light undergoes total internal reflection, such as, for example when the first reflecting surface 382 is disposed at about a 45 degree angle to the initial axis of propagation $a_{prop\_ini}$, and the axis of propagation of the reflected beam of light $a_{prop\_reflect}$ is directed towards the second reflecting surface 384. The second reflecting surface 384 is disposed such that the reflected beam of light undergoes total internal reflection, such as, for example when the second reflecting surface 384 is disposed at about a 45 degree angle to the axis of propagation of the reflected beam of light $a_{prop\_reflect}$. In one embodiment, the second reflecting surface 384 is parallel to the first reflecting surface 382, although, as will be appreciated by those skilled in the optical arts other relative orientations of the first reflecting surface 382 to the second reflecting surface 384 are possible.

The beam of light is redirected to propagate along a targeting axis of propagation $a_{prop\_target}$ and is directed through the lens element 387. The lens element 387 may be a diffractive optical element or negative lens. In one embodiment, the lens element 387 is a planoconcave lens configured to create a line on a horizontal axis. In a specific embodiment, the planoconcave lens has a focal length of about 300 mm and the concave surface of the planoconcave lens has a radius of curvature of about 6.85 inches.

Figure 33:
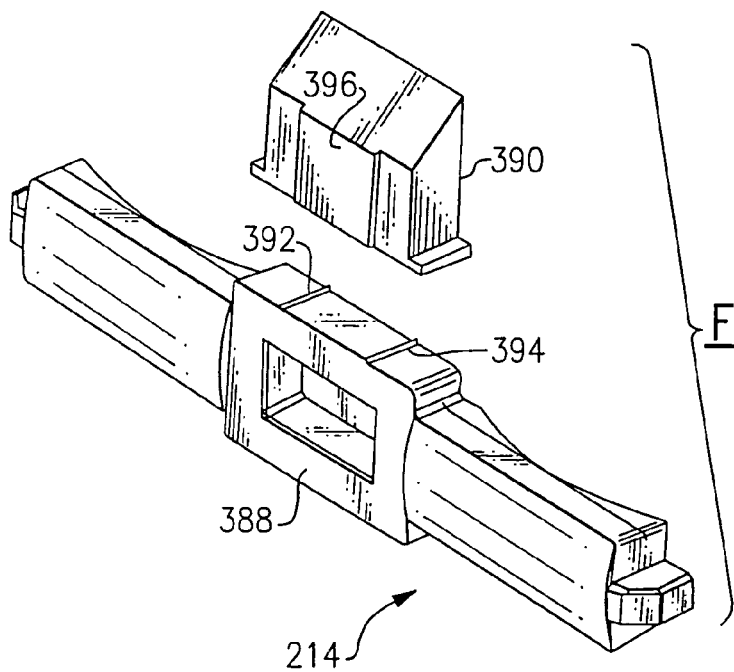
FIG. 33 is a perspective view of an alternative embodiment of the illuminating lens assembly of FIG. 27.

In an alternative embodiment, as shown in FIG. 33 the illuminating lens assembly 314 includes a diffuser 388 and a long range aiming pattern optical system 390. The diffuser 388 includes two rails 392, 394. The long range aiming pattern optical system 390 includes two alignment grooves (not shown) that are configured for engagement with the two rails 392, 394 thereby providing a mechanism by which the long range aiming pattern optical system 390 may be positioned in a predetermined manner with respect to the diffuser 388. The long range aiming pattern optical system 390 may be coupled to the diffuser 388 by adhesive bonding or ultrasonic welding or any other appropriate means known to those skilled in the art of joining plastic optical elements together.

In an alternative embodiment, shown schematically in FIG. 34 the long range aiming pattern optical system 390 includes a partially reflective surface 404 such as, for example a beam splitter, disposed along the imaging axis $a_i$ of the image sensor 32 and its associated optics. The light source 226 is disposed such that a beam of light emitted from the light source and propagating along an initial axis of propagation $a_{prop\_initial}$ is incident upon the partially reflective surface 404. A portion of the beam of light emitted by the light source 226 is reflected by the partially reflective surface 404 while the remainder is transmitted through the partially reflective surface 404. The partially reflective surface 404 is disposed at an angle to the imaging axis $a_i$ in order to reduce or substantially eliminate light from the light source 226 form impinging upon the image sensor without first being reflected by a target indicia. Similarly, a portion of the light propagating along the imaging axis $a_i$ towards the image sensor 32 such as, for example light reflected from a target optical indicia is reflected by the partially reflective surface 404 while a portion continues to propagate along the imaging axis $a_i$ and reach the image sensor 32. Although the axis of propagation of the partially reflected beam of light $a_{prop\_reflect}$ is shown as offset from the imaging axis $a_i$ of the image sensor, it will be appreciated by those skilled in the optical arts that the two axis may also be coincident. In an alternative embodiment of the long range aiming pattern optical system 390, multiple beams of light are directed at the partially reflective surface 404 in order to provide more complex long range aiming patterns P such as have been described above. The long range aiming pattern P, for example, may be a plurality of dots that indicate the orientation and field of view of the image sensor 32 with respect to a target optical indicia.

In a further alternative embodiment, as shown in FIG. 34*b* the long range aiming pattern optical system 390 includes a light source 226 selectively emitting at least one beam of light, such as, for example a laser beam. The beam of light is directed towards a reflective element 408, such as, for example a mirror. The reflective element 408 alters the direction of propagation of the beam of light, directing the beam of light to partially reflective element 404 such as, for example a beam splitter. The partially reflective element 404 is disposed along the imaging axis $a_i$ of the image sensor 32. In one embodiment the partially reflective element 404 reflects about ten percent of the optical energy incident thereon and transmits about ninety percent of the optical energy thereon. The reflected optical energy from the beam of light is directed substantially parallel to the imaging axis $a_i$ of the image sensor 32, thereby proving an indication of the orientation and field of view of the image sensor 32. The portion of the target signal reflected from the target T propagates along the imaging axis $a_i$ of the image sensor 32. The partially reflective element 404 is disposed so that at least a portion of the target signal is transmitted through the partially reflective element 404 and is received by the image sensor 32. In the embodiment where the partially reflective element 404 reflects about ten percent of the optical energy incident thereon and transmits about ninety percent of the optical energy thereon, the partially reflective element 404 is dispose such that about ninety percent of the target signal is directed towards the image sensor 32.

In an alternative embodiment, the light source 226 emits a plurality of beams of light.

An alternative embodiment of the illuminating lens assembly 314 adapted for use with a cylindrical laser diode package is shown in FIG. 38. The illuminating lens assembly 314 further includes a laser diode cradle 636. The laser diode cradle 636 is adapted to receive a cylindrically packaged laser diode assembly 60, such as, for example a Model LM-761-A1 laser diode assembly of the type available from Excel Scientech Co. of Taiwan as is shown in FIG. 6*c*. As seen in FIG. 6*c*, the laser diode assembly 60 includes a PCB 60*p* supporting laser diode 60*d*, and collimating optics 60*c* housed within a diode assembly housing 60*h*. The inventors have discovered that the laser beam emitted from typical commercially available cylindrically packaged laser diodes is not coincident with the longitudinal axis of the laser diode assembly housing 60*h*. The axis of propagation of the emitted laser beam may be parallel to the longitudinal axis of the laser diode assembly housing 60*h* or may be inclined with respect to the longitudinal axis of the laser diode assembly housing 60*h*. The laser diode assembly 60 may be rotated within the laser diode cradle 636 as indicated by the arrow 634. Preferably, the laser diode assembly 60 is rotated within the laser diode cradle 636 to align the emitted laser beam with the centerline of the multiple beam generator 386, thereby producing at least two diverging laser beams of substantially equal cross section and intensity. In an alternative embodiment, the multiple beam generator 386 is replaced by a lens element 387, such as, for example a planoconcave lens.

In an alternative embodiment, the illumination assembly, includes a single light source providing a single beam of light. The single beam of light is directed through a series of optical elements to illuminate the target object. For example, a beam splitter may be used to divide the beam into multiple beams that are then directed to illuminate the target.

Figure 35:
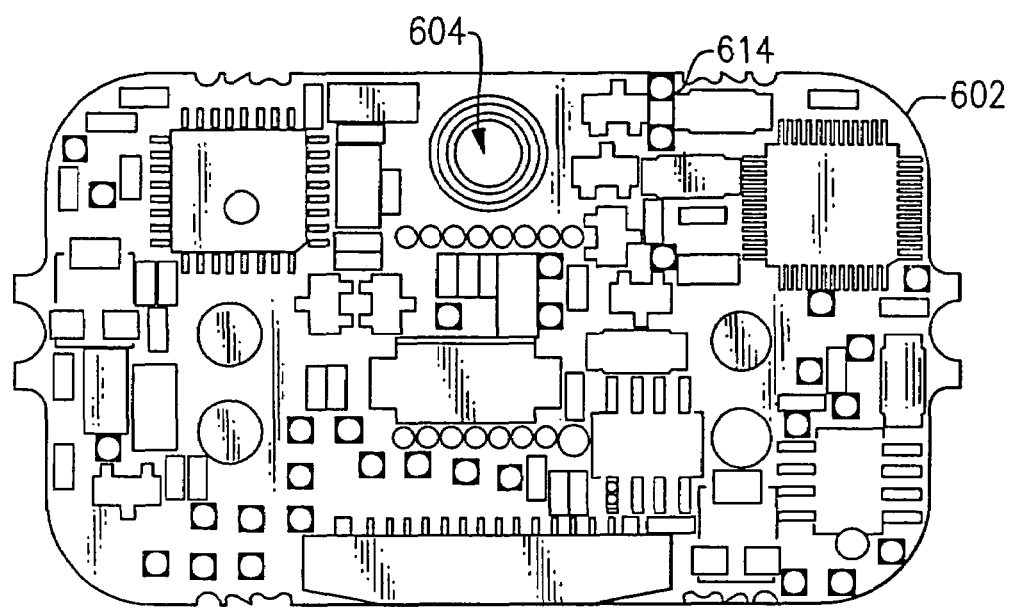
FIG. 35 is a top plan view of a printed circuit board incorporating the laser diode alignment feature of the present invention.
Figure 36:
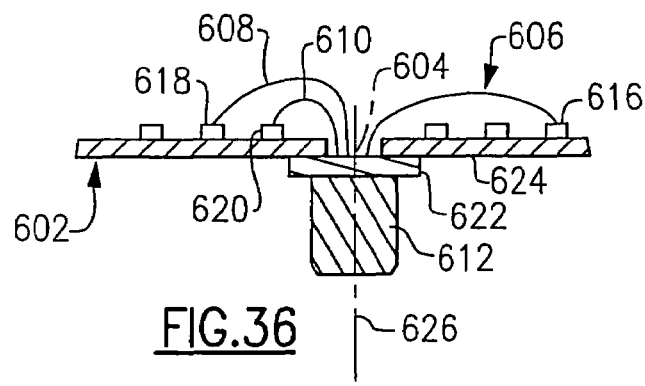
FIG. 36 is a fragmentary cross-sectional view of the printed circuit board of FIG. 35.

The laser diodes used in optical readers are semiconductor lasers that emit an elliptical laser beam from a surface of the semiconductor. The inventors have discovered that active alignment of the laser diode is generally required to position the laser beam in a desired orientation. The inventors of the instant application have found that it is advantageous to rotate the laser diode about a longitudinal axis in order to align the laser beam. The present invention, embodied in an optical reader 600 is shown in FIG. 35 and FIG. 36. The present invention for an optical reader 600 includes a substrate 602, such as, for example a printed circuit board. The substrate 602 includes an opening 604 sized to allow the electrical leads 606, 608, 610 of a laser diode 612 to pass through. The optical reader 600 further includes electrical circuitry 614 disposed on the substrate. The electrical circuitry 614 includes a first annular solder pad 616 disposed about the opening 604, a second annular solder pad 618 disposed about the opening 604, and a third annular solder pad 620 disposed about the opening 604. Preferably, opening 604 is a circular opening and the first annular solder pad 614 is disposed concentrically with the opening 604. The second annular solder pad 618 is disposed concentrically with respect to the first annular solder pad 616 Additionally, the third annular solder pad 620 is disposed concentrically with respect to the first annular solder pad 616 and the second annular solder pad 618. The optical reader 600 further includes a laser diode 612 coupled to the substrate. The laser diode 612 includes a first electrical lead 606 coupled to the first annular solder pad 616, a second electrical lead 608 coupled to the second annular solder pad 618, and a third electrical lead 610 coupled to the third annular solder pad 620. The first annular solder pad 614, the second annular solder pad 616 and the third annular solder pad 618 are electrically insulated from one another. The opening 604 is sized such that the base 622 of the laser diode 612 cannot pass through the opening 604.

The optical reader 600 may be assembled in the following manner. The electrical leads 606, 608, 610 of the laser diode 612 are passed through the opening 604 and the electrical leads 606, 608, 610 are temporarily coupled to an electrical power source (not shown). The base 622 of the laser diode 612 is placed in contact with a surface 624 of the substrate 602. Electrical power is supplied to the laser diode 612 causing the laser diode 612 to emit a beam of light. The beam of light is aimed at a target, and the laser diode 612 is rotated about its longitudinal axis 626 until the laser beam is oriented in a desired position with respect to the substrate 602. The orientation of the laser diode 612 with respect to the substrate 602 is then fixed, such as, for example by coupling the laser diode 612 to the substrate 602. The electrical leads 606, 608, 610 of the laser diode 612 are then respectively coupled to the first, second and third annular solder pads 614, 616, 618 depending upon the electrical connectivity requirements. For example the positive lead is coupled to the positive annular solder pad, the ground lead is coupled to the ground annular solder pad and the negative lead is coupled to the negative annular solder pad.

Figure 37:
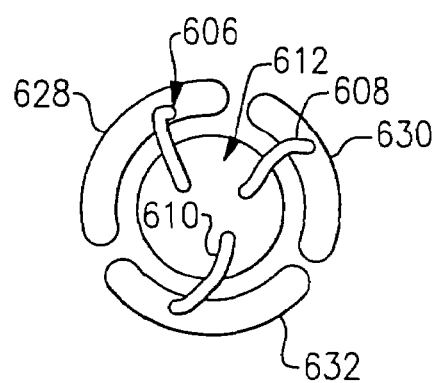
FIG. 37 is an fragmentary top plan view of an alternative embodiment of the laser diode alignment feature of FIG. 35.

In an alternative embodiment, as shown in FIG. 37, the first annular solder pad 614 is replaced by a first arcuate solder pad 628, the second annular solder pad 616 is replaced by a second arcuate solder pad 630 and the third annular solder pad 620 is replaced by a third arcuate solder pad 632. Each of the arcuate solder pads 628, 630, 632 is disposed about the perimeter of the hole 604. The first arcuate solder pad 628, the second arcuate solder pad 630 and the third arcuate solder pad 632 are electrically insulated one from another. The first arcuate solder pad 628 subtends an arc of about 120 degrees. The second arcuate solder pad 630 subtends an arc of about 120 degrees. The third arcuate solder pad 632 subtends an arc of about 120 degrees.

In one embodiment, the base 622 of the laser diode 612 is coupled to the surface 624 of the substrate 602. The base 622 of the laser diode 612 may be coupled to the surface 624 of the substrate 602, for example, by adhesive bonding.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An optical reader comprising:
   a substrate, the substrate defining an opening;
   electrical circuitry disposed on the substrate, the electrical circuitry including:
   a first annular solder pad disposed about the opening;
   a second annular solder pad disposed about the opening, the second annular solder pad disposed concentrically with respect to the first annular solder pad;
   a third annular solder pad disposed about the opening, the third annular solder pad disposed concentrically with respect to the first annular solder pad and the second annular solder pad; and
   a laser diode coupled to the substrate, the laser diode including:
   a first electrical lead coupled to the first annular solder pad;
   a second electrical lead coupled to the second annular solder pad; and
   a third electrical lead coupled to the third annular solder pad.

2. The optical reader of claim 1, wherein the substrate includes a first surface;
   wherein the first annular solder pad is disposed on said first surface;
   wherein the second annular solder pad is disposed on said first surface; and
   wherein the third annular solder pad is disposed on said first surface.

3. The optical reader of claim 2, wherein the substrate is a printed circuit board.

4. An optical reader comprising:
   a substrate, the substrate defining an opening;
   a first arcuate solder pad coupled to the substrate, the first arcuate solder pad disposed proximate to the opening;
   a second arcuate solder pad coupled to the substrate, the second arcuate solder pad disposed proximate to the opening;
   a third arcuate solder pad coupled to the substrate, the third arcuate solder pad disposed proximate to the opening;
   wherein the first arcuate solder pad is electrically insulated from the second arcuate solder pad;
   wherein the first arcuate solder pad is electrically insulated from the third arcuate solder pad; and
   wherein the second arcuate solder pad is electrically insulated from the third arcuate solder pad.

5. An optical reader comprising:
   a substrate, the substrate defining an opening;
   electrical circuitry disposed on the substrate, the electrical circuitry including:
   a first solder pad disposed proximate to the opening;
   a second solder pad disposed proximate to the opening; and
   a third solder pad disposed proximate to the opening;
   a laser diode coupled to the electrical circuitry, the laser diode including:
   a first electrical lead coupled to the first solder pad;
   a second electrical lead coupled to the second solder pad; and
   a third electrical lead coupled to the third solder pad.

6. The optical reader of claim 5, wherein the opening is a circular opening.

7. The optical reader of claim 6, wherein the first solder pad is a first annular solder pad disposed concentrically with respect to the opening;

wherein the second solder pad is a second annular solder pad disposed concentrically with respect to the first annular solder pad; and wherein the third solder pad is a third annular solder pad disposed concentrically with respect to the first annular solder pad and the second annular solder pad.

8. An optical reader comprising:
a first substrate, said first substrate having a first surface and a second surface (204);
an illumination assembly coupled to said second surface, said illumination assembly including at least two light emitting diodes;
an illuminating lens assembly coupled to said illumination assembly, said illuminating lens assembly including two lenses, said illuminating lens assembly defining an aperture;
an imaging assembly coupled to said illumination assembly, said imaging assembly having an imaging axis, said imaging axis laying on a first plane, said imaging assembly including a plurality of photodetectors;
a targeting lens (224) coupled to said first surface (202); and
a laser diode assembly (226) coupled to said first surface (202), said laser diode assembly (226) configured to emit a laser beam (228), said laser beam propagating along an axis (230), laser diode assembly (226) disposed such that said laser beam (228) is directed through said targeting lens (224).

9. The optical reader of claim 8 wherein said second surface includes a mounting surface.

10. The optical reader of claim 9, wherein said laser diode assembly is coupled to said mounting surface.

11. The optical reader of claim 8, wherein said targeting lens is a negative lens.

12. The optical reader of claim 11, wherein said negative lens is a planoconcave lens.

13. The optical reader of claim 11, wherein said negative lens is a biconcave lens.

14. The optical reader of claim 11, wherein said negative lens is a diverging concavoconvex lens.

15. The optical reader of claim 8, wherein said targeting lens is a positive lens.

16. The optical reader of claim 15, wherein said positive lens is a biconvex lens.

17. The optical reader of claim 15, wherein said positive lens is a planoconvex lens.

18. The optical reader of claim 15, wherein said positive lens is a converging concavoconvex lens.

19. The optical reader of claim 8, wherein said targeting lens is a diffractive lens.

20. The optical reader of claim 8, wherein said targeting lens is an anamorphic lens.

21. The optical reader of claim 8, wherein said plurality of photodetectors are disposed to form a linear array.

22. The optical reader of claim 8, wherein said plurality of photodetectors are disposed to form a two-dimensional array.

23. The optical reader of claim 8, wherein second surface defines a laser diode assembly mounting surface, wherein said laser diode assembly includes a first mounting surface slideably engageable with said laser diode assembly mounting surface.

24. The optical reader of claim 23, wherein said laser diode assembly is selectively rotatable about a predetermined axis.

25. The optical reader of claim 23, wherein said laser diode assembly mounting surface includes a concave surface and said mounting surface includes a convex surface engageable with said concave surface.

26. The optical reader of claim 15, wherein said convex surface has a first radius of curvature; and wherein said concave surface has said first radius of curvature.

27. The optical reader of claim 25, further including a clamping pad engageable with said laser diode assembly.

28. The optical reader of claim 27, wherein said laser diode assembly further includes a concave surface.

29. An optical reader comprising:
a first substrate, said first substrate having a first surface and a second surface;
a light source configured to emit a beam of light propagating along an axis, said light source coupled to said first surface;
an illumination assembly coupled to said second surface, said illumination assembly including at least two light emitting diodes;
an imaging assembly coupled to said illumination assembly, said imaging assembly having an imaging axis, said imaging axis laying on a first plane, said imaging assembly including a plurality of photodetectors; and
an illuminating lens assembly coupled to said illumination assembly, said illuminating lens assembly, said illuminating lens assembly defining an aperture, said illuminating lens assembly including:
an illumination diffuser;
a first reflective surface disposed in the path of the beam of light thereby directing the beam of light along a first predetermined path;
a second reflective surface disposed in said first predetermined path thereby directing the laser beam along a second predetermined path; and
a diffractive element disposed is said second predetermined path, said diffractive element disposed to receive the beam of light whereby said diffractive element modifies the direction of propagation of the beam of light.

30. The optical reader of claim 29, wherein said light source is a laser.

31. The optical reader of claim 29, wherein said light source is a laser diode.

32. The optical reader of claim 29, wherein said second reflective surface is disposed parallel to said first reflective surface.

33. The optical reader of claim 29, wherein said diffractive element includes a beam splitter.

34. The optical reader of claim 29, wherein said diffractive element includes a prism.

35. An optical reader comprising:
a first substrate, said first substrate having a first surface and a second surface;
an illumination assembly coupled to said second surface, said illumination assembly including a first light source and a second light source;
an illuminating lens assembly defining an aperture and including two lenses, said illuminating lens assembly coupled to said illumination assembly;
an imaging assembly coupled to said illumination assembly, said imaging assembly having an imaging axis, said imaging axis laying on a first plane, said imaging assembly including a plurality of photodetectors;
a targeting lens coupled to said first surface; and
a third light source configured to supply a beam of light propagating along an axis, said light source coupled to said first surface and disposed such that the beam of light is directed through said targeting lens.

36. The optical reader of claim 35, wherein said third light source includes a laser.

37. The optical reader of claim 35, wherein said third light source includes a laser diode.

38. An optical reader comprising:
- a first substrate, said first substrate having a first surface and a second surface;
- a first light source configured to emit a beam of light propagating along an axis, said light source coupled to said first surface;
- an illumination assembly coupled to said second surface, said illumination assembly including a second light source and a third light source;
- an imaging assembly coupled to said illumination assembly, said imaging assembly having an imaging axis, said imaging axis laying on a first plane, said imaging assembly including a plurality of photodetectors; and
- an illuminating lens assembly coupled to said illumination assembly, said illuminating lens assembly, said illuminating lens assembly defining an aperture, said illuminating lens assembly including:
  - an illumination diffuser disposed to diffuse light from said second light source and said third light source in a predetermined manner;
  - a first reflective surface disposed in the path of the beam of light thereby directing the beam of light along a first predetermined path;
  - a second reflective surface disposed in said first predetermined path thereby directing the beam of light along a second predetermined path; and
  - a targeting lens disposed to receive the beam of light, whereby said targeting lens modifies the cross sectional shape of the beam of light.

39. The optical reader of claim 38, wherein said plurality of photodetectors are disposed about an axis parallel to the photosensitive elements of each of said plurality of photodetectors.

40. The optical reader of claim 39, wherein said plurality of photodetectors are disposed so as to form a one-dimensional array.

* * * * *